(12) United States Patent
Shimamoto et al.

(10) Patent No.: US 8,501,558 B2
(45) Date of Patent: Aug. 6, 2013

(54) SEMICONDUCTOR DEVICE AND MANUFACTURING METHOD OF THE SAME

(75) Inventors: Yasuhiro Shimamoto, Tokorozawa (JP); Jiro Yugami, Yokohama (JP); Masao Inoue, Ikeda (JP); Masaharu Mizutani, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 98 days.

(21) Appl. No.: 13/004,317

(22) Filed: Jan. 11, 2011

(65) Prior Publication Data

US 2011/0111566 A1    May 12, 2011

Related U.S. Application Data

(62) Division of application No. 11/439,260, filed on May 24, 2006, now Pat. No. 7,915,686.

(30) Foreign Application Priority Data

May 24, 2005    (JP) .................................. 2005-150938

(51) Int. Cl.
    *H01L 21/8238*    (2006.01)
(52) U.S. Cl.
    USPC .................... 438/199; 257/369; 257/E21.639; 257/E27.062
(58) Field of Classification Search
    USPC .......... 438/153, 188, 199, 217, 218; 257/351, 257/369, 372, 405, 410, 411, 412, E27.062, 257/E27.064, E21.625, E21.639
    See application file for complete search history.

(56) References Cited

U.S. PATENT DOCUMENTS

| 6,563,182 B2 | 5/2003 | Horikawa |
| 6,734,069 B2 | 5/2004 | Eriguchi |
| 2003/0227062 A1 | 12/2003 | Horiuchi et al. |
| 2006/0043497 A1 | 3/2006 | Kimizuka et al. |

FOREIGN PATENT DOCUMENTS

| JP | 56-061165 A | 5/1981 |
| JP | 61-137370 A | 6/1986 |
| JP | 2002-280461 | 9/2002 |
| JP | 2002-314074 | 10/2002 |
| JP | 2004-134753 | 4/2004 |
| TW | 546734(B) | 8/2003 |

OTHER PUBLICATIONS

IEDM 03-311, W. Tsai et al., pp. 12.2.1-13.2.4, pub. 2003.
IEEE, S. Kubicek et al. pp. 251-254, pub. 2003.

(Continued)

*Primary Examiner* — David Vu
(74) *Attorney, Agent, or Firm* — Antonelli, Terry, Stout & Kraus, LLP.

(57) ABSTRACT

Manufacturing technique for a semiconductor device having a first MISFET of an n channel-type and a second MISFET of a p channel type, including forming a first insulating film composed of a silicon oxide film or a silicon oxynitride film on a semiconductor substrate for forming a gate insulating film of the respective MISFETs; depositing metal elements on the first insulating film; forming of a silicon film on the first insulating film for the forming of a gate electrode of the respective MISFETs; and producing the respective gate electrodes by patterning the silicon film. The depositing of the metal films on the first insulating film is such that there is produced in the vicinity of the interface between the gate electrode and the gate insulating film a surface density of the metal elements within a range of $1 \times 10^{13}$ to $5 \times 10^{14}$ atoms/$cm^2$.

5 Claims, 24 Drawing Sheets

(56) References Cited

OTHER PUBLICATIONS

"Fermi Level Pinning at the PolySi/Metal Oxide Interface," C. Hobbs et al, 2 pp., 2003 Symposium on VLSI Technology Digest of Technical Papers.

S.M. Sze, Kwok K. Ng, Physics of Semiconductor Devices, pp. 136-141, $3^{rd}$ Edition, Wiley, New York, 2007.

Office Action in Korean Patent Application KR10-2006-46155, dated Jul. 10, 2012 (in Korean, 4 pgs.), [Engl. language translation, 4 pgs.].

Chinese Office Action (Notice of Reexamination) with English Translation, Sep. 29, 2012.

FIG. 13

| | Hf DEPOSITION AMOUNT $D_1$ (ATOMS/cm²) | EOT (nm) | n CHANNEL MISFET 40 | | | | p CHANNEL MISFET 41 | | | |
|---|---|---|---|---|---|---|---|---|---|---|
| | | | FLAT BAND VOLTAGE $V_{FB}$ (V) | THRESHOLD VOLTAGE Vth (V) | MOBILITY OF ELECTRONS (cm²/Vs) | CAPACITANCE EQUIVALENT THICKNESS DERIVED FROM INVERSION CAPACITANCE CET(nm) | FLAT BAND VOLTAGE $V_{FB}$ (V) | THRESHOLD VOLTAGE Vth (V) | MOBILITY OF HOLES (cm²/Vs) | CAPACITANCE EQUIVALENT THICKNESS DERIVED FROM INVERSION CAPACITANCE CET(nm) |
| SAMPLE 1 | 0 | 1.70 | −0.97 | 0.10 | 347 | 2.53 | 0.93 | −0.12 | 95 | 2.69 |
| SAMPLE 2 | 2×10¹³ | 1.80 | −0.89 | 0.20 | 332 | 2.61 | 0.81 | −0.25 | 94 | 2.83 |
| SAMPLE 3 | 5×10¹³ | 1.88 | −0.83 | 0.27 | 326 | 2.69 | 0.74 | −0.33 | 94 | 2.94 |
| SAMPLE 4 | 1.3×10¹⁴ | 1.99 | −0.77 | 0.35 | 323 | 2.79 | 0.65 | −0.44 | 95 | 3.09 |
| SAMPLE 5 | 2.7×10¹⁴ | 2.09 | −0.72 | 0.41 | 322 | 2.86 | 0.58 | −0.52 | 95 | 3.24 |
| SAMPLE 6 | 5.0×10¹⁴ | 1.82 | −0.71 | 0.40 | 275 | 2.63 | 0.48 | −0.62 | 89 | 3.12 |
| SAMPLE 7 | 1.2×10¹⁵ | 1.95 | −0.70 | 0.40 | 273 | 2.70 | 0.42 | −0.70 | 89 | 3.22 |

SEMICONDUCTOR DEVICE AND MANUFACTURING METHOD OF THE SAME

The present application is a divisional application of U.S. application Ser. No. 11/439,260, filed on May 24, 2006 now U.S. Pat. No. 7,915,686, the content of which is hereby incorporated by reference into this application.

FOREIGN PRIORITY DATA INFORMATION

The present application claims priority from Japanese Patent Application No. JP 2005-150938 filed on May 24, 2005, the content of which is hereby incorporated by reference into this application.

TECHNICAL FIELD OF THE INVENTION

The present invention relates to a semiconductor device and a manufacturing method of the semiconductor device. More particularly, it relates to a technology effectively applied to a semiconductor device having a CMISFET and a manufacturing method of such a semiconductor device.

BACKGROUND OF THE INVENTION

In recent years, along with the increase in integration and performance of LSIs, micro-fabrication (scaling) of MISFETs has been developed. In particular, since the thickness of the gate insulating film has been getting thinner, the leakage current has been increasing, which poses a problem of increase in power consumption. Nevertheless, for CMISFETs for use in mobile devices, low power consumption and high-speed operation are required. That is, it is required to speed up the operation of a CMISFET with its leakage current being suppressed below a predetermined level.

Japanese Patent Application Laid-Open Publication N 2004-134753 (Patent Document 1) discloses a technology of forming a gate insulating layer having various dielectric constants and various equivalent oxide thicknesses on a semiconductor substrate.

Japanese Patent Application Laid-Open Publication No. 2002-280461 (Patent Document 2) discloses a technology of doping impurity metal ions into a film with high dielectric constant in order to independently control threshold voltages of respective MISFETs.

Japanese Patent Application Laid-Open Publication No. 2002-314074 (Patent Document 3) discloses a technology of forming a high dielectric film by means of atom implantation into the film such as ion implantation and heat treatment.

Also, technologies regarding flat band voltage of a MISFET are disclosed in the following Non-Patent Documents:

W. Tsai, L. Ragnarsson, P. J. Chen, B. Onsia, R. J. Carter, E. Cartier, E. Young, M. Green, M. Caymax, S. De Gendt and M. Heyns, "Technical Digest of VLSI symposium", 2002, p. 21 (Non-Patent Document 1);

S. Kubicek, J. Chen, L. -A. Ragnarsson, R. J. Carter, V. Kaushik, G. S. Lujan, E. Cartier, W. K. Henson, A. Kerber, L. Pantisano, S. Beckx, P. Jaenen, W. Boullart, M. Caymax, S. De Gendt, M. Heyns and K. De Meyer, "ESS-DERC", 2003, p. 251 (Non-Patent Document 2); and C. Hobbs, L. Fonseca, V. Dhandapani, S. Samavedam, B. Taylor, J. Grant, L. Dip, D. Triyoso, R. Hedge, D. Gilmer, R. Garcia, D. Roan, L. Lovejoy, R. Rai, L. Hebert, H. Tseng, B. White and P. Tobin, "Symp. of VLSI technology", 2003, p. 9 (Non-Patent document 3).

SUMMARY OF THE INVENTION

Studies by the inventors of the present invention have revealed the following.

A leakage current of a CMISFET is given by a sum of a leakage current flowing through the gate of the FET in an ON state, a leakage current flowing through the gate thereof in an OFF state, and a leakage current flowing through the drain of the FET in an OFF state due to the short channel effect. For the achievement of the suppression of the OFF current which flows in an OFF state, it is required to suppress a leakage current of a gate insulating film and to adjust a threshold voltage of a transistor. According to the ITRS roadmap 2003, the film thickness (EOT: equivalent oxide thickness in terms of $SiO_2$) of a gate insulating film at the 90-nm node (2004) is 1.5 nm for LOP (Low Operation Power) devices and 2.2 nm for LSTP (Low Stand-by Power) devices. With the application of a conventional $SiO_2$ film (silicon oxide film) or a silicon oxynitride film (SiON film) obtained by introducing nitrogen to $SiO_2$, the leakage current can be suppressed.

On the other hand, a threshold voltage of an n channel transistor (MISFET) is expected to be 0.26 V for LOP devices and 0.5 V for LSTP devices. As for a p channel transistor (MISFET), the absolute value of its threshold voltage is considered as being the same as that of the n channel transistor. In a MISFET in which the above-described $SiO_2$ film or SiON film is applied to the gate insulating film and a conventional Si electrode is used as a gate electrode, the threshold voltage can be adjusted to be the above-described value by increasing the impurity concentration of a channel region. Therefore, the leakage current in an ON state and the leakage current in an OFF state can be suppressed.

However, in a CMISFET of the 90-nm and following node, scaling has been further developed, and so, the reduction in thickness of the gate insulating film has been demanded. In particular, since 2006, it is impossible to achieve the leakage current level required in the ITRS roadmap even with a SiON film having a larger leakage current suppression effect than that of a $SiO_2$ film. In such a circumstance, using a metal oxide (so-called high-k film) having larger effect of reducing the leakage current than that of a SiON film as a gate insulating film has been actively discussed. Examples of such a metal oxide include IV-group oxides such as zirconia ($ZrO_2$) and hafnia ($HfO_2$), III-group oxides such as alumina ($Al_2O_3$), silicates which are solid solutions of the above-mentioned metal oxides and silicon oxide, and materials such as films obtained by introducing nitrogen into these films. By the use of these materials, more than double-digit reduction in leakage current can be achieved compared with the case of a $SiO_2$ film. This corresponds to the film thickness reduction of 0.3 nm or more in terms of EOT.

However, it has been reported that, in the cases of a MISFET in which a high-k film is applied as a gate insulating film and Si is used as a gate electrode, its flat band voltage is significantly shifted compared with the case of using a SiON film, and it is difficult to adjust the threshold voltage (Non-Patent Document 1). Furthermore, the Non-Patent Document 1 also discloses a problem that the mobility in the MISFET is significantly reduced. For example, it has been reported that, in the case of an n channel MISFET having a gate insulating film to which a 2 to 4 nm thick $HfO_2$ film with an EOT of 14.8 to 17.4 Å (1.48 to 1.74 nm) is applied (n type Si is used as a gate electrode), the flat band voltage is within a range of −0.91 V to −0.70 V. This value is positively shifted by approximately 0.1 to 0.3 V compared with the case of a $SiO_2$ film or a SiON film. Also, the electron mobility in this material is 70 $cm^2/Vs$ to 90 $cm^2/Vs$, which is significantly deteriorated compared with a $SiO_2$ film. On the other hand, according to the above-mentioned Non-Patent Document 2, in the case of a p channel MISFET having a gate electrode made of p type Si, the flat band voltage is approximately 0.4 V to 0.6 V, which is negatively shifted by approximately −0.5 V compared with the case of a SiO$_2$ film.

It has been suggested that this phenomenon in which the shifting direction of the flat band voltage from the flat band voltage of a SiO$_2$ film varies depending on the polarity of the gate electrode can be explained with fermi-level pinning at the gate electrode side (Non-Patent Document 3). As the amount of deposited Hf increases, the flat band voltage is shifted to saturation with a positive shift of 0.3 V in the case of an n type Si gate electrode in an n-FET and a negative shift of approximately 0.7 V in the case of a p type Si gate electrode in a p-FET. The flat band voltage is saturated, if the amount of deposited Hf is equal to or more than 0.5 nm in terms of equivalent HfO$_2$ film thickness. This phenomenon is explained with the fact that interface states are formed in the band gap of the Si gate electrode and fermi-level pinning of the Si gate electrode occurs at the levels of these interface states.

With such a shift in the flat band voltage, the threshold voltage of the MISFET cannot be controlled to a target value. For example, when fabricating a p channel MISFET having a gate insulating film formed by depositing a 4-nm HfO$_2$ film with an EOT of 1.7 nm and a gate electrode made of p type silicon, the threshold of the p channel MISFET is negatively shifted by 0.5 V or more compared with the case of a SiO$_2$ film. Also, even with a low impurity (boron) concentration of the channel region of 5×10$^{16}$/cm$^3$, the threshold voltage of the MISFET is −0.7 V. In this case, its absolute value is too large compared with, for example, a threshold voltage of −0.26 V required for LOP devices and a threshold voltage of −0.5 V required for LSTP devices. Therefore, this poses a problem of decreasing the ON current of the MISFET when a predetermined power voltage is applied to the gate electrode. Furthermore, since an extreme decrease in substrate impurity concentration (impurity concentration of the channel region) induces the short channel effect, as the gate length becomes shorter, punch-through occurs between the source and the drain. Consequently, the OFF current is increased.

Further, it has been reported that, in a stacked gate insulating film comprised of a silicon oxide film and a high dielectric constant film formed on the silicon oxide film, which is formed on a semiconductor substrate made of silicon single crystal, the electron mobility is deteriorated as the thickness of the silicon oxide film is reduced. This is explained by Coulomb scattering due to the fixed charge equal to or larger than 10$^{13}$ cm$^{-2}$ present at the interface between the silicon oxide film and the high dielectric constant film. The mobility deterioration shows that the ON current cannot be increased despite the reduction in the EOT of the gate insulating film.

On the other hand, when SiON is applied to a gate insulating film, in addition to the problem of increasing the leakage current due to the reduction in EOT, another problem arises. That is, the concentration of impurities introduced into a channel region in order to maintain a constant threshold voltage (in the case of n channel type, an acceptor such as boron, and in the case of p channel type, a donor such as arsenic or phosphorus) is increased, and the carrier mobility is decreased due to Coulomb scattering. Consequently, it is impossible to make the best use of the effect of the reduction in EOT. This is due to the fact that the threshold voltage is proportional to the product of the EOT of the gate insulating film and the impurity concentration.

An object of the present invention is to provide a technology capable of improving the performance of a semiconductor device.

The above and other objects and novel characteristics of the present invention will be apparent from the description of this specification and the accompanying drawings.

The typical ones of the inventions disclosed in this application will be briefly described as follows.

The present invention is directed to a semiconductor device having a CMISFET which comprises: a gate insulating film composed of a silicon oxide film or a silicon oxynitride film; and a gate electrode including a silicon film positioned on the gate insulating film, wherein metal elements are introduced near an interface between the gate electrode and the gate insulating film with a surface density of 1×10$^{13}$ to 5×10$^{14}$ atoms/cm$^2$.

Also, the present invention is directed to a method comprising: a step of forming a first insulating film composed of a silicon oxide film or a silicon oxynitride film for forming a gate insulating film of a CMISFET; a step of depositing metal elements on the first insulating film so that a surface density is within a range of 1×10$^{13}$ to 5×10$^{14}$ atoms/cm$^2$ and then forming a silicon film for forming a gate electrode on the first insulating film; and a step of forming a gate electrode of the CMISFET by patterning the silicon film.

Furthermore, the present invention is directed to a method comprising: a step of forming a first insulating film composed of a silicon oxide film or a silicon oxynitride film for forming a gate insulating film of a CMISFET; a step of forming a silicon film for forming a gate electrode on the first insulating film; and a step of performing ion implantation of metal elements near an interface between the silicon film and the first insulating film.

The effects obtained by typical aspects of the present invention will be briefly described below.

That is, the performance of the semiconductor device can be improved.

BRIEF DESCRIPTIONS OF THE DRAWINGS

FIG. 13 is a table showing electrical characteristics of a CMISFET;

DESCRIPTIONS OF THE PREFERRED EMBODIMENTS

Figure 1:
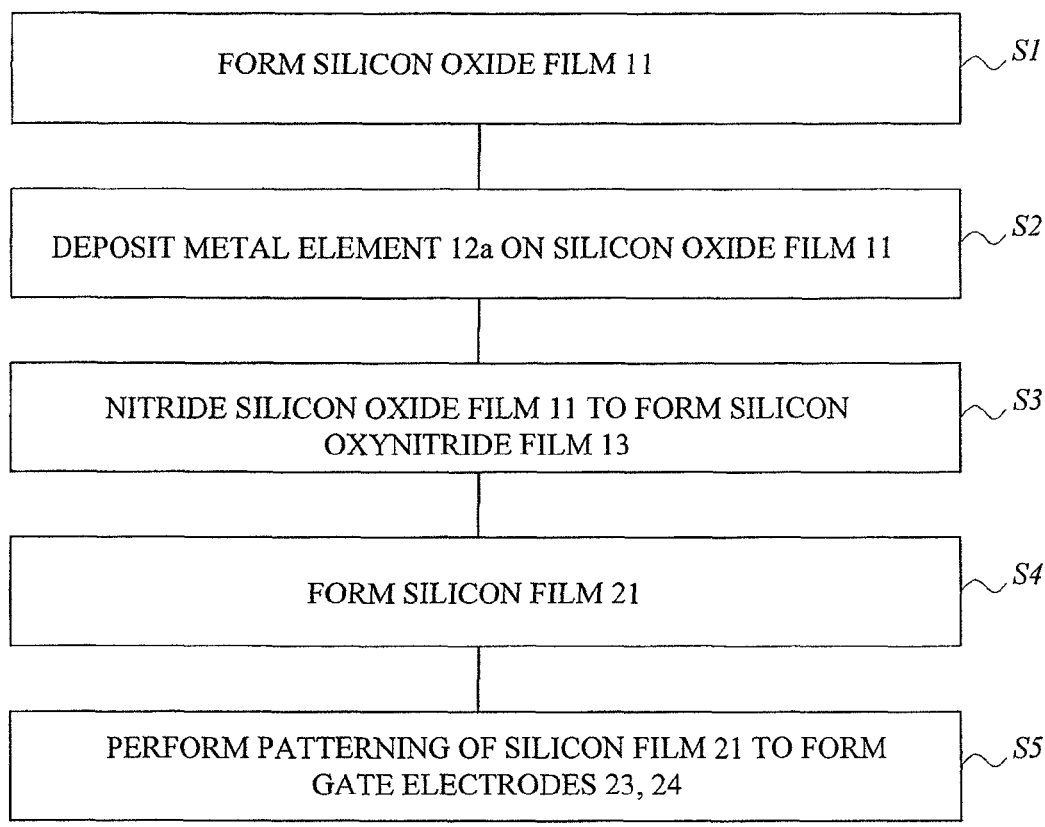
FIG. 1 is a process flowchart showing a manufacturing process of a semiconductor device according to one embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. This condition is also applicable to the numerical value and the range described above.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Also, in the drawings used in the embodiments, hatching is not used in some cases even in a sectional view so as to make the drawings easy to see, and hatching is used in some cases even in a plan view so as to make the drawings easy to see.

(First Embodiment)

The semiconductor device and the manufacturing method of the semiconductor device according to the first embodiment will be described with reference to the drawings.

FIG. 1 is a process flowchart showing a manufacturing process of a semiconductor device according to the present embodiment. FIG. 2 to FIG. 4, FIG. 6, FIG. 7, and FIG. 9 to FIG. 12 are cross-sectional views of main parts in the manufacturing process of a semiconductor device according to the present embodiment. FIG. 5 is a partially-enlarged cross-sectional view (cross-sectional view of the main parts) schematically showing the state where a minute amount of metal elements 12a is deposited on a silicon oxide film 11. FIG. 8 is a partially-enlarged cross-sectional view (cross-sectional view of the main parts) schematically showing the state where a silicon film 21 is formed on a silicon oxynitride film 13. Note that a process from a step of forming an insulating film (silicon oxide film 11) for forming a gate insulating film to a step of forming gate electrodes (gate electrodes 23 and 24) in the manufacturing process of a semiconductor device is shown in FIG. 1.

The semiconductor device according to the present embodiment includes a CMISFET (Complementary Metal Insulator Semiconductor Field Effect Transistor).

Figure 2:
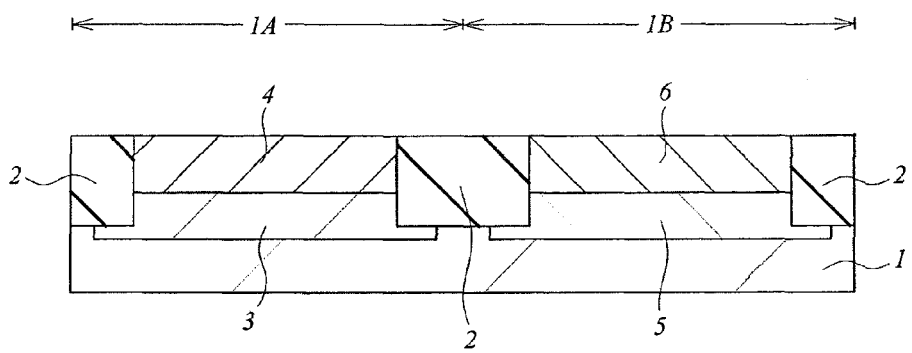
FIG. 2 is a cross-sectional view of main parts during the manufacturing process of a semiconductor device according to one embodiment of the present invention.

In the manufacturing process of a semiconductor device according to the present embodiment, first, a semiconductor substrate (semiconductor wafer) 1 made of single crystal silicon or the like is prepared as shown in FIG. 2. For the semiconductor substrate 1, for example, a p type single-crystal silicon substrate with (100) orientation and a specific resistance of about 1 to 10 Ωcm can be used. The semiconductor substrate 1 where the semiconductor device according to the present embodiment is formed includes an n channel MISFET formation region 1A where an n channel MISFET (Metal Insulator Semiconductor Field Effect Transistor) is to be formed and a p channel MISFET formation region 1B where a p channel MISFET is to be formed. Further, element isolation regions (element isolation insulating regions) 2 for defining an active region are formed on the main surface of the semiconductor substrate 1. The element isolation region 2 is made of an insulator such as silicon oxide and is formed through STI (Shallow Trench Isolation) or LOCOS (Local Oxidization of Silicon), for example.

Next, through a process of ion implantation of p type impurities (for example, boron (B)) into the region (n channel MISFET formation region 1A) of the semiconductor substrate 1 where an n channel MISFET is formed, a p type well 3 is formed. Furthermore, for example, through a process of ion implantation of p type impurities (for example, boron (B)) for adjusting the threshold voltage of the n channel MISFET, a channel region (p type semiconductor region) 4 whose impurity concentration is adjusted is formed on the p type well 3 (surface layer portion of the p type well 3). Still further, for example, by the ion implantation of n type impurities (for example, phosphorus (P) or arsenic (As)) into the region (p channel MISFET formation region 1B) of the semiconductor substrate 1 where a p channel MISFET is formed, an n type well 5 is formed. Still further, for example, by the ion implantation of n type impurities (for example, phosphorus (P) or arsenic (As)) for adjusting the threshold voltage of the p channel MISFET, a channel region (n type semiconductor region) 6 whose impurity concentration is adjusted is formed on the n type well 5 (surface layer portion of the n type well 5).

Note that the channel regions 4 and 6 under gate electrodes and gate insulating films formed later form channel regions of the MISFETs. Therefore, each impurity concentration of the channel regions 4 and 6 corresponds to the impurity concentration of each channel region of the MISFETs. In the present embodiment, the amount of implanted ions at the time of forming the channel regions 4 and 6 is preferably adjusted so that the impurity concentrations of the channel regions of the MISFETs after completion of the semiconductor device (corresponding to the impurity concentrations of the channel regions 4 and 6) become equal to or lower than $1.2 \times 10^{18}/cm^3$ and also the short channel effect can be suppressed. Examples of the impurity concentrations of the channel regions 4 and 6 are preferably equal to or lower than $1.2 \times 10^{18}/cm^3$, more preferably in a range of $2 \times 10^{17}/cm^3$ to $1.2 \times 10^{18}/cm^3$, and still more preferably in a range of $4 \times 10^{17}/cm^3$ to $7 \times 10^{17}/cm^3$.

Figure 3:
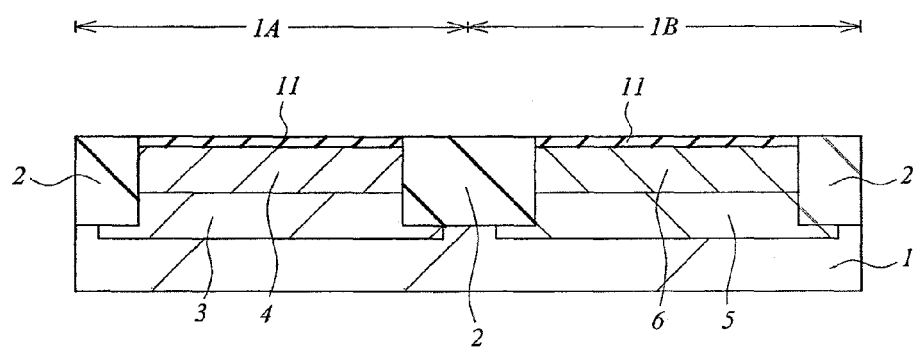
FIG. 3 is a cross-sectional view of the main parts, continued from FIG. 2, during the manufacturing process of a semiconductor device.

Next, as shown in FIG. 3, after removing a native oxide film on the surface of the semiconductor substrate 1 by the cleaning using dilute hydrofluoric acid, a silicon oxide film (film of silicon oxide) 11 is formed on the main surface (surface of the p type well 3 and the n type well 5) of the semiconductor substrate 1 (step S1). The silicon oxide film 11 can be formed by oxidation (such as thermal oxidation) of the main surface of the semiconductor substrate 1. The silicon oxide film 11 has a film thickness of, for example, about 1.8 nm.

Figure 4:
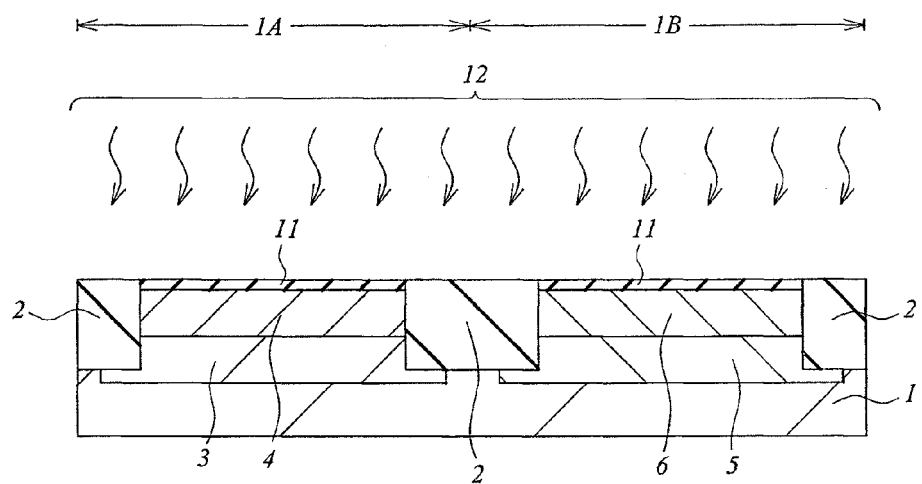
FIG. 4 is a cross-sectional view of the main parts, continued from FIG. 3, during the manufacturing process of a semiconductor device.
Figure 5:
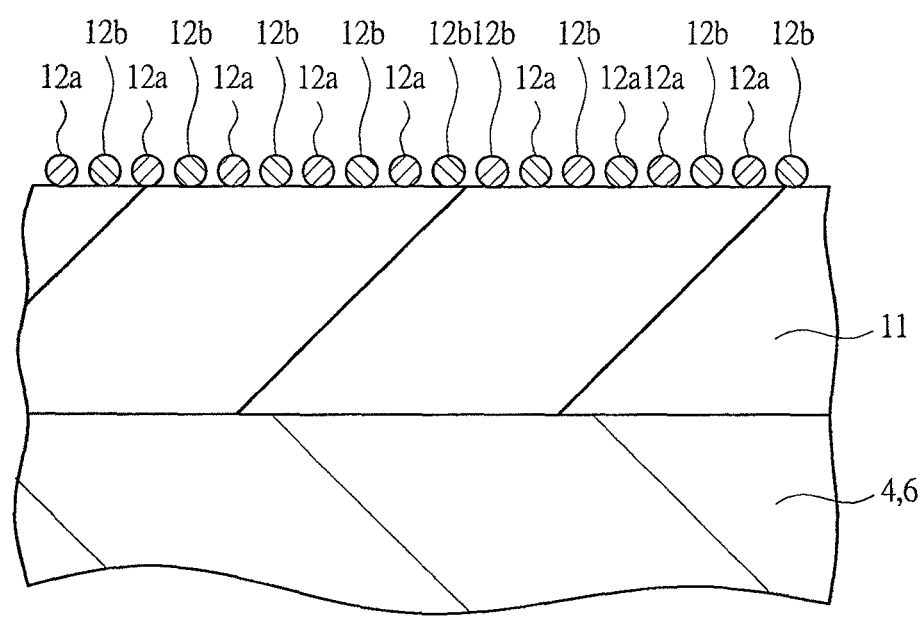
FIG. 5 is a partially-enlarged cross-sectional view schematically showing the state where a minute amount of metal elements are deposited on a silicon oxide film.

Next, as shown in FIG. 4, through a metal element deposition process 12, a minute amount of metal elements (metal atoms) 12a is deposited on the silicon oxide film 11 (step S2). FIG. 5 is a partially-enlarged cross-sectional view schematically showing the state where a minute amount of metal elements 12a is deposited on the silicon oxide film 11. In step S2, the metal elements 12a are deposited on the silicon oxide film 11 by using CVD (Chemical Vapor Deposition) such as MOCVD (Metal Organic Chemical Vapor Deposition) or ALCVD (Atomic Layer Chemical Vapor Deposition). In this case, the metal elements 12a are deposited as being bonded to oxygen of the silicon oxide film 11 or oxygen contained in an oxidizing atmosphere introduced at the time of deposition. For example, hafnium (Hf) can be used as the metal elements 12a.

In the present embodiment, in step S2, the surface density of the metal elements 12a deposited on the silicon oxide film 11 (corresponding to an amount of Hf deposition $D_1$ described further below) is controlled in a range of $1 \times 10^{13}$ to $5 \times 10^{14}$ atoms/cm$^2$. As described above, the surface density of the metal elements 12a deposited on the silicon oxide film 11 is preferably $1 \times 10^{13}$ to $5 \times 10^{14}$ atoms/cm$^2$, and more preferably in a range of $5 \times 10^{13}$ to $1.5 \times 10^{14}$ atoms/cm$^2$. Thus, the amount of the metal elements 12a, for example, Hf atoms on the silicon oxide film 11 is very small. As schematically shown in FIG. 5, only a small amount of Hf atoms (metal elements 12a) less than one layer in terms of HfO$_2$ film is deposited on the silicon oxide film 11. In other words, monatomic metal elements 12a are chemisorbed on the surface of the silicon oxide film 11.

Also, in step S2, although it is possible to deposit only the metal elements 12a on the silicon oxide film 11, it is more preferable that oxide of the metal elements 12a (Hf in this case) and silicon (Si) such as $Hf_xSi_{1-x}O_y$ is formed on the silicon oxide film 11. By doing so, a minute amount of elements (atoms) 12b other than the metal elements (metal atoms), Si (silicon) in this case, is deposited on the silicon oxide film 11 together with the metal elements 12a. A ratio x of Hf in $Hf_xSi_{1-x}O_y$ can be set as, for example, x=0.5 to 0.55. In this case, the metal elements 12a and the silicon 12b are deposited as being bonded to oxygen of the silicon oxide film 11 or oxygen contained in an oxidizing atmosphere introduced at the time of deposition.

Figure 6:
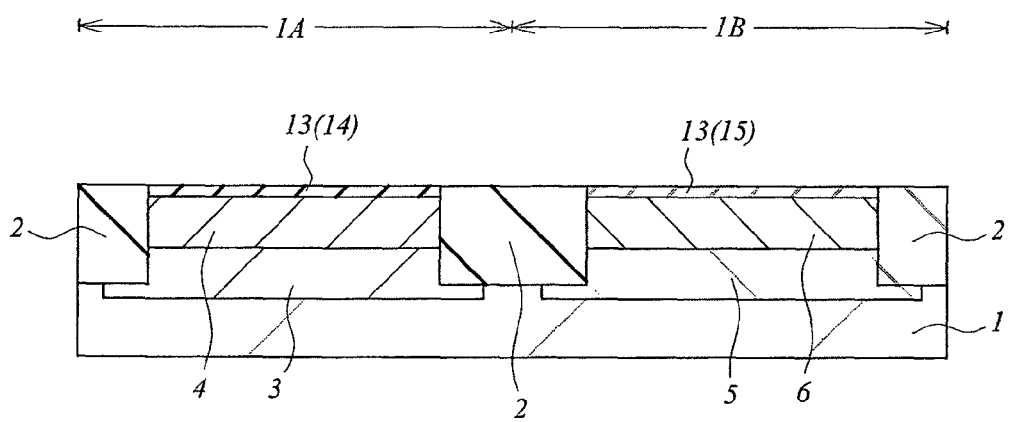
FIG. 6 is a cross-sectional view of the main parts, continued from FIG. 4, during the manufacturing process of a semiconductor device.

Next, through a plasma nitriding process (process of exposing the semiconductor substrate 1 to nitrogen plasma), a heat treatment in an ammonia atmosphere, and others, nitrogen is introduced to the silicon oxide film 11 (step S3). By doing so, as shown in FIG. 6, nitrogen is introduced into the silicon oxide film 11 (silicon oxide film 11 is nitrided) to obtain a silicon oxynitride film 13. After the introduction of nitrogen into the silicon oxide film 11, excessive nitrogen in the silicon oxynitride film can be vaporized by performing a heat treatment at a relatively high temperature in diluted oxygen atmosphere according to need. The introduction of nitrogen into gate insulating films prevents the impurity ions introduced in the gate electrode from being diffused in the gate insulating films and introduced into the Si substrate.

In this manner, gate insulating films 14 and 15 each comprised of a silicon oxynitride film 13 having a minute amount of the metal elements 12a deposited on its upper surface (upper portion) are formed. The gate insulating film 14 is a gate insulating film for an n channel MISFET and is formed on the p type well 3 in the n channel MISFET formation region 1A. The gate insulating film 15 is a gate insulating film for a p channel MISFET and is formed on the n type well 5 in the p channel MISFET formation region 1B.

Figure 7:
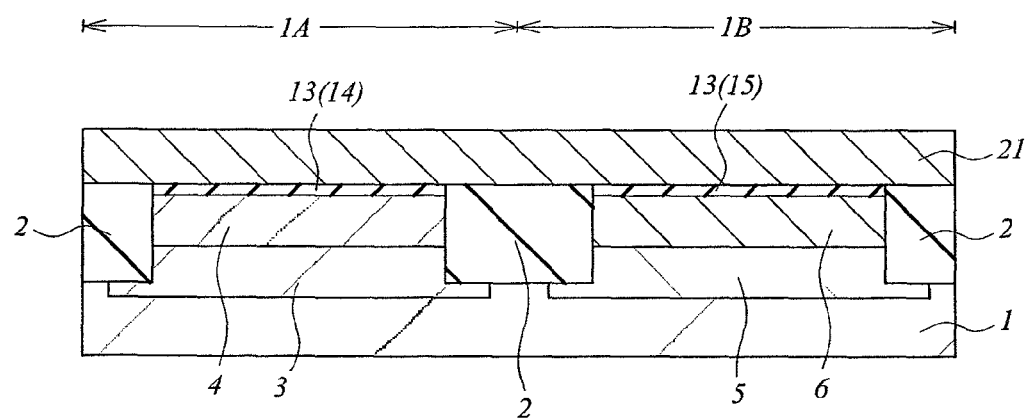
FIG. 7 is a cross-sectional view of the main parts, continued from FIG. 6, during the manufacturing process of a semiconductor device.
Figure 8:
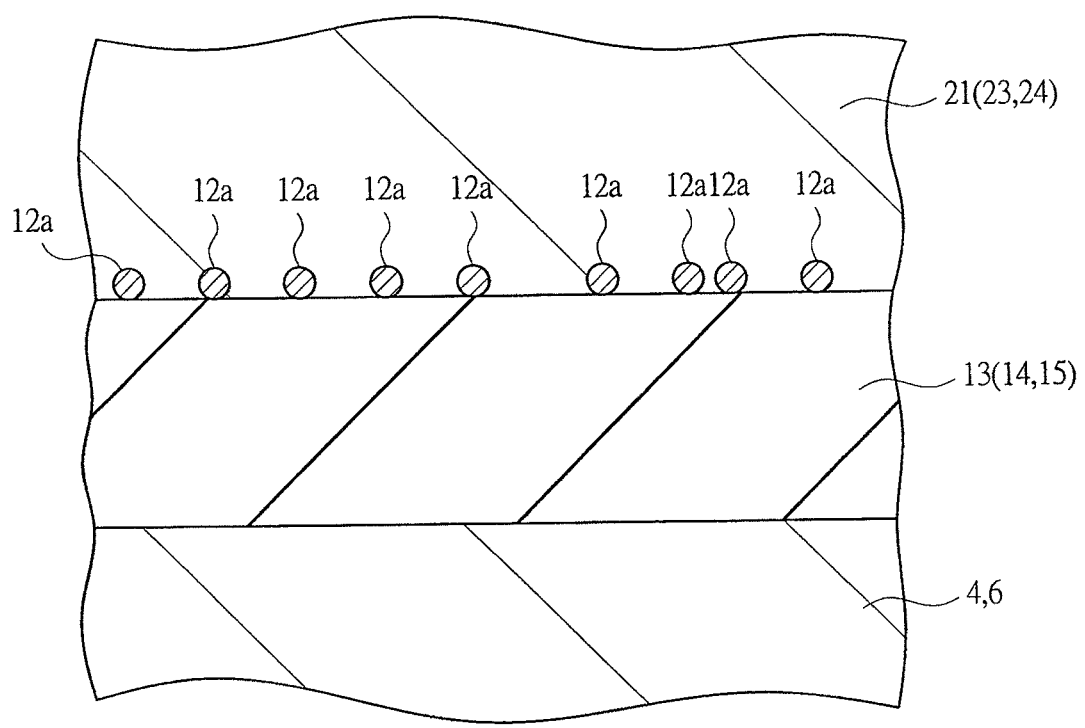
FIG. 8 is a partially-enlarged cross-sectional view schematically showing the state where a silicon film is formed on a silicon oxynitride film.

Next, as shown in FIG. 7, on the main surface of the semiconductor substrate 1, that is, on the gate insulating films 14 and 15, a silicon film 21 is formed as a conductive film to form gate electrodes (step S4). The silicon film 21 is, for example, a polycrystalline silicon film and can be formed through CVD or other means. For example, the silicon film 21 having a film thickness of about 100 nm can be deposited through the CVD at approximately 630° C. with using monosilane as a material gas.

FIG. 8 is a partially-enlarged cross-sectional view schematically showing the state where the silicon film 21 is formed on the silicon oxynitride film 13 (that is, the gate insulating films 14 and 15), which corresponds to FIG. 5 described above. As described above, since the metal elements 12a are deposited on the silicon oxide film 11 in step S2, the metal elements 12a are locally present at an interface between the silicon film 21 and the silicon oxynitride film 13 as schematically shown in FIG. 8. Note that, since the elements (atoms) 12b shown in FIG. 5 are Si (silicon) and/or O (oxygen), which are elements of the silicon oxynitride film 13 and the silicon film 21, the elements (atoms) 12b are omitted in FIG. 8 because they are included in the silicon oxynitride film 13 and the silicon film 21.

Figure 9:
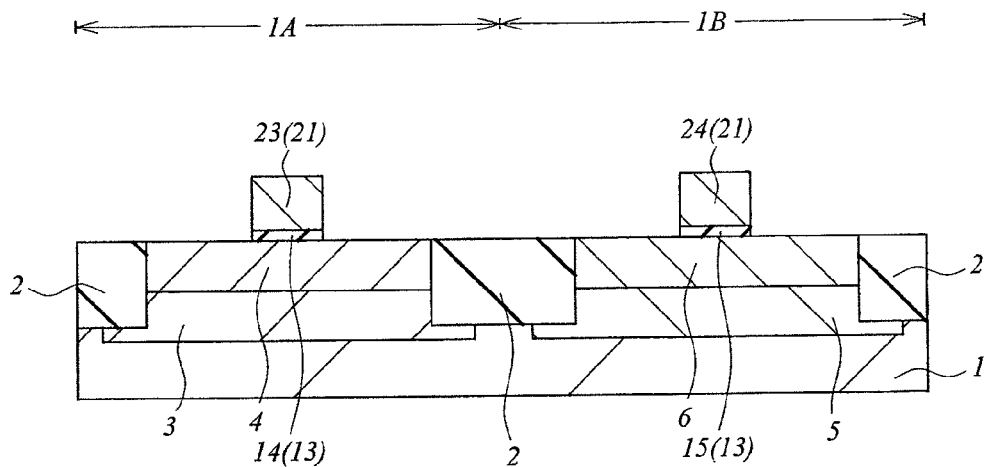
FIG. 9 is a cross-sectional view of the main parts, continued from FIG. 7, during the manufacturing process of a semiconductor device.

Next, as shown in FIG. 9, by using photolithography or dry etching, for example, the silicon film 21 is patterned (processed or selectively removed) (step S5). For example, Reactive Ion Etching (RIE) can be used for the patterning of the silicon film 21. The patterned silicon film 21 forms the gate electrodes 23 and 24. More specifically, the gate electrode 23 for the n channel MISFET is formed from the silicon film 21 on the gate insulating film 14 on the surface of the p type well 3, and the gate electrode 24 for the p channel MISFET is formed from the silicon film 21 on the gate insulating film 15 on the surface of the n type well 5.

Figure 10:
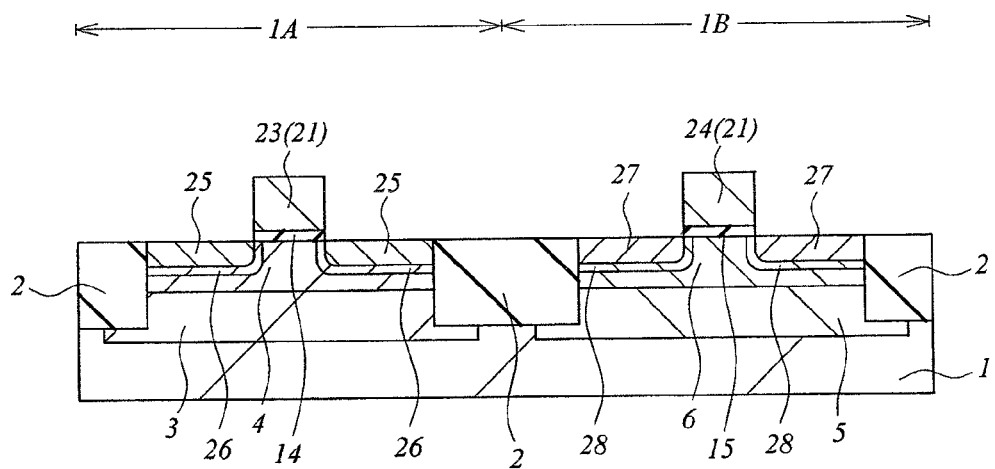
FIG. 10 is a cross-sectional view of the main parts, continued from FIG. 9, during the manufacturing process of a semiconductor device.

Next, as shown in FIG. 10, for example, by the ion implantation of n type impurities into the regions on both sides of the gate electrode 23 on the p type well 3, (a pair of) relatively shallow n⁻ type semiconductor regions (n type impurity diffusion layers) 25 aligned with the gate electrode 23 are formed. For example, by the ion implantation of arsenic ions in a direction perpendicular to the main surface of the semiconductor substrate 1 under conditions where the acceleration energy is 3 keV and the implantation amount is $1 \times 10^{15}/cm^2$, the n type semiconductor regions 25 is formed. Thereafter, for example, by the ion implantation of p type impurities, p type semiconductor regions 26 to prevent punch-through are formed around the n⁻ type semiconductor regions 25. For example, by the ion implantation of boron ions in a direction perpendicular to the main surface of the semiconductor substrate 1 under conditions where the acceleration energy is 10 keV and the implantation amount is $4 \times 10^{13}/cm^2$, the p type semiconductor regions 26 are formed. Similarly, by the ion implantation of p type impurities into the regions on both sides of the gate electrode 24 on the n type well 5, (a pair of) relatively shallow p⁻ type semiconductor regions (p type impurity diffusion layers) 27 aligned with the gate electrode 24 are formed. Then, for example, by the ion implantation of n type impurities, n type semiconductor regions 28 to prevent punch-through are formed around the p⁻ type semiconductor regions 27.

Figure 11:
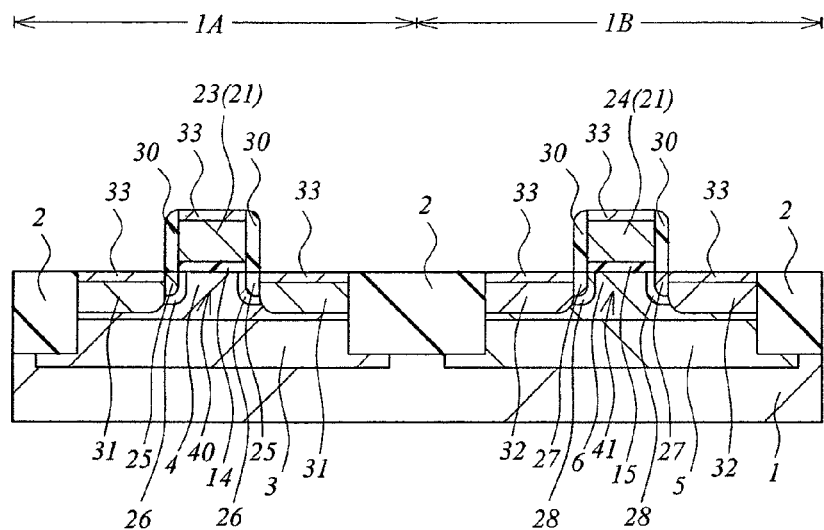
FIG. 11 is a cross-sectional view of the main parts, continued from FIG. 10, during the manufacturing process of a semiconductor device.

Next, as shown in FIG. 11, sidewalls (sidewall insulating film or sidewall spacer) 30 formed of an insulator such as silicon oxide are formed on sidewalls of each of the gate electrodes 23 and 24. The sidewall 30 can be formed by, for example, depositing a silicon oxide film on the semiconductor substrate 1 and performing anisotropic etching of this silicon oxide film. For example, after a silicon oxide film having a film thickness of about 50 nm is deposited on the entire surface of the semiconductor substrate 1 at a low temperature of 400° C. through plasma assisted chemical vapor deposition, silicon oxide films are selectively left only on the sidewalls of the gate electrodes through anisotropic dry etching, thereby forming the sidewalls 30.

Next, by the ion implantation of n type impurities into the n channel MISFET formation region 1A of the semiconductor substrate 1 with using the sidewalls 30 as ion implantation blocking masks, (a pair of) n⁺ type semiconductor regions 31 (source and drain) are formed in the regions on both sides of the gate electrode 23 and the sidewalls 30 on the p type well 3. For example, by the ion implantation of arsenic ions in a direction perpendicular to the main surface of the semiconductor substrate 1 under conditions where the acceleration energy is 30 keV and the implantation amount is $2 \times 10^{15}/cm^2$, the n⁺ type semiconductor regions 31 can be formed. At the time of this ion implantation, n type impurities are also ion-implanted into the gate electrode 23, and as a result, the gate electrode 23 becomes a low-resistance n-conductive semiconductor film (silicon film) introduced with n type impurities. Similarly, by the ion implantation of p type impurities (for example, boron (B)) into the p channel MISFET formation region 1B of the semiconductor substrate 1 with using the sidewalls 30 as ion implantation blocking masks, (a pair of) p⁺ type semiconductor regions 32 (source and drain) are formed in the regions on both sides of the gate electrode 24 and the sidewalls 30 on the n type well 5. At the time of this ion implantation, p type impurities are also ion-implanted into the gate electrode 24, and as a result, the gate electrode 24 becomes a low-resistance p-conductive semiconductor film (silicon film) introduced with p type impurities.

After the ion implantation, an annealing process for activating the introduced impurities (activation anneal or heat treatment) is performed. For example, a heat treatment is performed for a short time of one second at a temperature of about 1050° C. in a nitrogen atmosphere, thereby activating the implanted ions.

The n⁺ type semiconductor regions 31 have an impurity concentration higher than that of the n⁻ type semiconductor regions 25, and the p⁺ type semiconductor regions 32 have an impurity concentration higher than that of the p⁻ type semiconductor regions 27. Therefore, n type semiconductor regions (impurity diffusion layers) serving as source and drain of the n channel MISFET are formed from the n⁺ type semiconductor regions 31 and the n⁻ type semiconductor regions 25, and p type semiconductor regions (impurity diffusion layers) serving as source and drain of the p channel MISFET are formed from the p⁺ type semiconductor regions 32 and the p⁻ type semiconductor regions 27.

Next, the surfaces of the gate electrodes 23 and 24, the n⁺ type semiconductor regions 31, and the p⁺ semiconductor regions 32 are exposed. Thereafter, for example, a cobalt (Co)

film is deposited over the entire surface of the semiconductor substrate 1 through sputtering so as to form a relatively thin layer, and the cobalt film is then silicided by a heat treatment (for example, short-time annealing at 500° C.). In this manner, a metal silicide layer (for example, cobalt silicide ($CoSi_2$) layer) 33 is formed on the surface of each of the gate electrodes 23 and 24, the $n^+$ type semiconductor regions 31, and the p+semiconductor regions 32. With the metal silicide layer 33, both diffusion resistance and contact resistance of each of the $n^+$ type semiconductor regions 31, the $p^+$ semiconductor regions 32, and others can be reduced. Thereafter, an unreacted cobalt film is removed. The resistance of the cobalt silicide film 33 is reduced in the following manner. That is, for example, the unreacted cobalt film is removed with a mixed solution of hydrochloric acid and oxygenated water so as to selectively leave the cobalt silicide film 33 on the exposed portions of the semiconductor substrate 1 (on the type semiconductor regions 31 and the $p^+$ semiconductor regions 32) and the gate electrodes 23 and 24. Then, a heat treatment is performed for a short period of time according to need.

In this manner, the structure shown in FIG. 11 can be obtained. That is, an n channel MISFET (Metal Insulator Semiconductor Field Effect Transistor) 40 is formed on the p type well 3 of the n channel MISFET formation region 1A, and a p channel MISFET 41 is formed on the n type well 5 of the p channel MISFET formation region 1B, thereby forming a CMISFET (Complementary Metal Insulator Semiconductor Field Effect Transistor).

Figure 12:
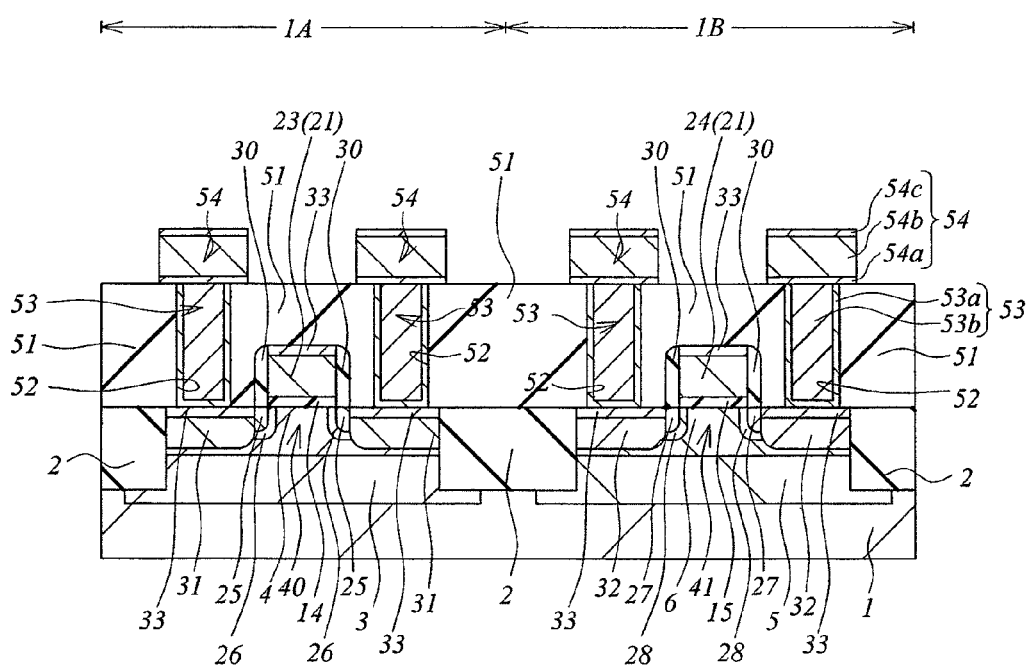
FIG. 12 is a cross-sectional view of the main parts, continued from FIG. 11, during the manufacturing process of a semiconductor device.

Next, as shown in FIG. 12, an insulating film (interlayer insulating film or surface-protective insulating film) 51 is formed on the semiconductor substrate 1 so as to cover the gate electrodes 23 and 24. The insulating film 51 is formed of, for example, a multilayered film of a relatively thin silicon nitride film and a relatively thick silicon oxide film placed thereon or a single film such as a silicon oxide film, and can be formed by using CVD. After the formation of the insulating film 51, CMP (Chemical Mechanical Polishing) is performed according to need so as to planarize the surface of the insulating film 51.

Next, the insulating film 51 is subjected to dry etching with using a photoresist layer (not shown) formed on the insulating film 51 through photolithography as an etching mask, thereby forming contact holes (openings) 52 on the $n^+$ type semiconductor regions (source and drain) 31 and the $p^+$ semiconductor regions (source and drain) 32. Some parts of the main surface of the semiconductor substrate 1 such as parts of (the silicide film 33 on the surface of) the $n^+$ type semiconductor regions 31, parts of (the silicide films 33 on the surface of) the $p^+$ semiconductor regions 32, and parts of (the silicide films 33 on the surface of) the gate electrodes 23 and 24 are exposed at the bottom of the contact holes 52.

Next, plugs 53 made of, for example, tungsten (W) are formed inside the contact holes 52. To form the plugs 53, for example, a barrier film (diffusion barrier material) 53a such as a titanium nitride (TiN) film is formed on the insulating films 51 including the inside of the contact holes 52, and then a high-melting point metal film (for example, tungsten (W) film) 53b is formed as a main conductive film on the barrier film 53a so as to fill the contact hole 52. Then, superfluous portions of the high-melting point metal film 53b and the barrier film 53a on the insulating film 51 are removed through CMP or etch back. In this manner, the plugs 53 which are comprised of the high-melting point metal film 53b and the barrier film 53a remaining in the contact holes 52 can be formed.

Next, a wiring (first wiring layer) 54 is formed on the insulating film 51 in which the plugs 53 are embedded. For example, a titanium nitride film 54a, an aluminum film 54b, and a titanium nitride film 54c are sequentially formed through sputtering, and are then patterned by using photolithography, dry etching, and others, thereby forming the wiring 54. The aluminum film 54b is a conductive film made of aluminum as a main component such as single aluminum (Al) or aluminum alloys. Each of the titanium nitride films 54a and 54c may be a multilayered film of a titanium film and a titanium nitride film. Each of the wirings 54 is electrically connected via the plugs 53 to the $n^+$ type semiconductor regions 31 for the source and drain of the n channel MISFET 40, the $p^+$ semiconductor regions 32 for the source and drain of the p channel MISFET 41, the gate electrode 23 of the n channel MISFET 40, the gate electrode 24 of the p channel MISFET 41, and others. Among the wirings 54, the wirings 54 to be connected through the plugs 53 to the $n^+$ type semiconductor regions 31 for the source and drain of the n channel MISFET 40 and to the $p^+$ semiconductor regions 32 for the source and drain of the p channel MISFET 41 function as source/drain electrodes. In FIG. 12, wirings 54 functioning as source/drain electrodes are shown.

The wirings 54 are not limited to aluminum wirings as described above, and various modifications and alterations can be made therein. For example, tungsten wirings or copper wirings (for example, embedded copper wirings formed through a damascene process) can be used.

In this manner, the structure of FIG. 12 is obtained. Thereafter, upper layers such as interlayer insulating films, wiring layers and others are formed to achieve a multilayered wiring structure. However, the illustration and the description thereof are omitted here.

In the present embodiment, the gate insulating films 14 and 15 composed of the silicon oxynitride film 13 having the metal elements 12a (Hf in this case) slightly deposited on its upper surface (upper portion) are formed as described above. Also, the gate electrodes 23 and 24 composed of the silicon film 21 (Si gate electrodes) are formed on these gate insulating films 14 and 15. Therefore, in the manufactured semiconductor device, the metal elements 12a are (locally) present near the interface between the gate insulating film 14 and the gate electrode (silicon film 21), and the metal elements 12a are (locally) present also near the interface between the gate insulating film 15 and the gate electrode 24 (silicon film 21). Through various heat treatment processes included in the semiconductor device manufacturing process, these metal elements 12a (Hf in this case) may be diffused a little. According to a TOF-SIMS analysis, the introduced metal elements 12a (Hf in this case) are locally present near the interface between the gate insulating films 14 and 15 and the gate electrodes 23 and 24 (silicon films 21) (for example, in a range within 0.5 nm upward and downward from the interface).

Therefore, in the semiconductor device according to the present embodiment, the gate electrode 23 of the n channel MISFET 40 forming the CMISFET includes the silicon film 21 positioned on the gate insulating film 14, the gate insulating film 14 of the n channel MISFET 40 is composed of the silicon oxynitride film 13, and the metal elements 12a (Hf in this case) are introduced near the interface between the silicon film 21 forming the gate electrode 23 and the gate insulating film 14. Also, the gate electrode 24 of the p channel MISFET 41 forming the CMISFET includes the silicon film 21 positioned on the gate insulating film 15, the gate insulating film 15 of the p channel MISFET 41 is composed of the silicon oxynitride film 13, and the metal elements 12a (Hf in this case) are introduced near the interface between the silicon film 21 forming the gate electrode 24 and the gate insulating film 15.

Hereinafter, effects of the semiconductor device according to the present embodiment will be described in further detail.

In the semiconductor device having the CMISFET manufactured in the above-described manner (the semiconductor device of FIG. 12), electrical characteristics of the n channel MISFET 40 and the p channel MISFET 41 forming the CMISFET have been evaluated, respectively. FIG. 13 is a table showing the electrical characteristic of the CMISFET (n channel MISFET 40 and p channel MISFET 41) with the channel length L of 4 μm and the channel width W of 10 μm. The table of FIG. 13 contains the amount of Hf deposition $D_1$, an EOT (Equivalent Oxide Thickness) of the gate insulating film derived from a capacitance measurement, a capacitance equivalent thickness CET of the gate insulating film derived from a maximum value of capacitance in an inversion state in terms of equivalent $SiO_2$ thickness, a flat band voltage $V_{FB}$, and a threshold voltage (threshold value or threshold value voltage) $V_{th}$.

The amount of Hf deposition $D_1$ (surface density of Hf atoms) in the table of FIG. 13 indicates a value of the surface density of Hf deposited in step S2 as the metal elements 12a on the silicon oxide film 11, which is measured through ICP (Inductively Coupled Plasma) analysis. Also, in the table of FIG. 13, in a dependence of a drain current $I_d$ on a gate voltage $V_g$ when a drain voltage $V_d$ of 0.05 V or −0.05 V is applied, a gate voltage, at which a straight line passing through a point where a gradient of a drain current $I_d$ is maximum and having the maximum gradient indicates $I_d$=0, is taken as the threshold voltage $V_{th}$ (so-called extrapolated threshold). Furthermore, the table of FIG. 13 also contains a maximum value of mobility (electron mobility and hole mobility) derived by split-CV technique.

Still further, FIG. 13 shows samples 1 to 7, and the sample 1 is different from the present embodiment. In the sample 1, a CMISFET is manufactured without depositing the metal elements 12a (Hf in this case) on the silicon oxide film 11 of 1.8 nm. Therefore, in the sample 1, the gate insulating film is formed of a pure silicon oxynitride (SiON) film, and no metal element 12a (Hf in this case) is introduced near the interface between the gate electrode and the gate insulating film.

Meanwhile, in any of the samples 2 to 7 in the table of FIG. 13, similar to the present embodiment, Hf as the metal elements 12a is deposited on the silicon oxide film 11 to manufacture a CMISFET. Among the samples 2 to 7, however, the surface density of Hf atoms deposited on the silicon oxide film 11 is varied. That is, in the samples 2 to 7, Hf is introduced as the metal elements 12a near the interface between the gate insulating films 14 and 15 and the gate electrodes 23 and 24, and the surface density (the amount of deposition $D_1$) of the introduced Hf is increased from the sample 2 to the sample 7.

Note that the film thickness of the silicon oxide film 11 is 1.8 nm in the samples 1 to 5, and the film thickness of the silicon oxide film 11 is 1.4 nm in the samples 6 and 7. Also, in the samples 1 to 7, the impurity concentration of the channel region 4 of the n channel MISFET 40 is $8 \times 10^{16}/cm^3$, and the impurity concentration of the channel region 6 of the p channel MISFET 41 is $5 \times 10^{16}/cm^3$.

As is evident from the table of FIG. 13, the flat band voltage $V_{FB}$ of the n channel MISFET 40 is successively increased (its absolute value is decreased) as the amount of Hf deposition $D_1$ is increased. Meanwhile, the flat band voltage $V_{FB}$ of the p channel MISFET 41 is decreased (its absolute value is also decreased) as the amount of Hf deposition $D_1$ is increased. As for the threshold voltage $V_{th}$, changes corresponding to the changes in the flat band voltage $V_{FB}$ are observed in both of the n channel MISFET 40 and the p channel MISFET 41. That is, as the amount of Hf introduction (the amount of Hf deposition $D_1$) is increased, the threshold voltage $V_{th}$ of the n channel MISFET 40 is increased, and the threshold voltage $V_{th}$ of the p channel MISFET 41 is decreased.

On the other hand, as is evident also from the table of FIG. 13, with the increase in the surface density (the amount of Hf deposition $D_1$) of the deposited Hf atoms, the CET of the n channel MISFET 40 is similarly increased by the amount of increase in EOT. Meanwhile, as a result of the progress of depletion in the gate, the CET of the p channel MISFET 41 is increased by more than the amount of increase in EOT due to the increase in the amount of Hf deposition $D_1$. Further, in the case where the amount of Hf introduction (the amount of Hf deposition $D_1$) is $5 \times 10^{14}/cm^2$ or more, a difference of approximately 0.5 nm occurs between the CET of the n channel MISFET 40 and the CET of the p channel MISFET 41.

Furthermore, as evident also from the table of FIG. 13, in the case where Hf is deposited on the silicon oxide film 11 of 1.8 nm (this case corresponds to the samples 2 to 5), the electron mobility of the n channel MISFET 40 is deteriorated only by 7% in comparison with the case where Hf is not deposited (this case corresponds to the sample 1). However, in the case where Hf is deposited on the silicon oxide film of 1.4 nm (this case corresponds to the samples 6 and 7), the electron mobility of the n channel MISFET 40 is deteriorated by approximately 20% in comparison with the case in which Hf is not deposited (this case corresponds to the sample 1). This is because the electron mobility is determined depending on the film thickness of silicon oxide ($SiO_2$) at the interface. Also, in the case where the film thickness of the silicon oxide film 11 is 1.8 nm (this case corresponds to the samples 1 to 5), the hole mobility of the p channel MISFET 41 is not changed even if Hf is introduced. However, in the case where Hf is deposited on the silicon oxide film of 1.4 nm (this case corresponds to the samples 6 and 7), the hole mobility is deteriorated by approximately 5%.

Figure 14:
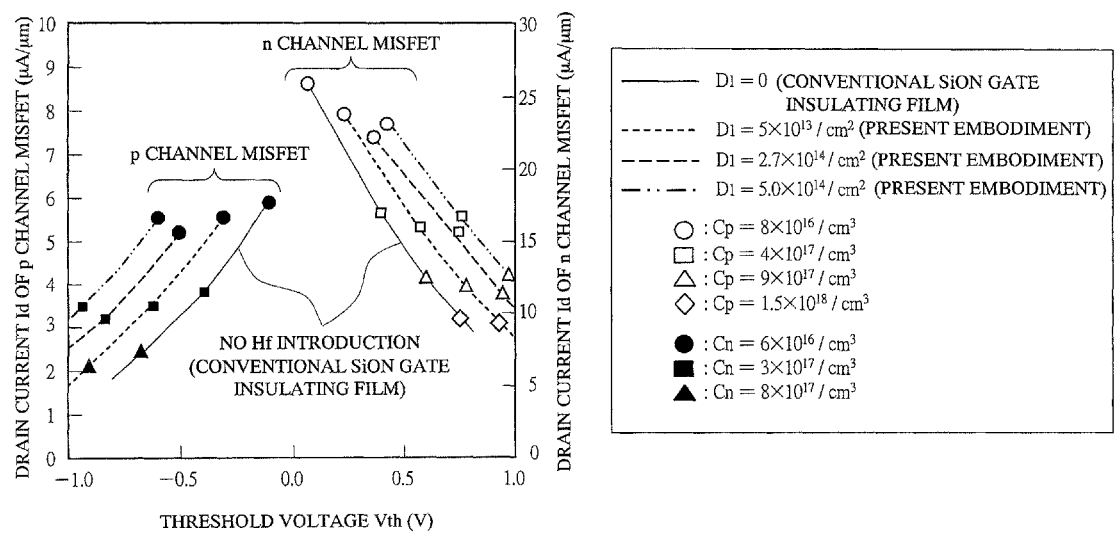
FIG. 14 is a graph showing a relation between a threshold voltage and a drain current of an n channel MISFET and a relation between a threshold voltage and a drain current of a p channel MISFET.

FIG. 14 is a graph showing a relation between the threshold voltage $V_{th}$ of the n channel MISFET 40 and the drain current $I_d$ (drain current where $V_g-V_{th}$=0.7 V in this case) and a relation between the threshold voltage $V_{th}$ of the p channel MISFET 41 and the drain current $I_d$ (drain current where $V_g-V_{th}$=−0.7 V in this case).

In FIG. 14, the relation between the threshold voltage $V_{th}$ and the drain current $I_d$ of the n channel MISFET 40 is plotted for each of the amount of Hf deposition $D_1$=0, the amount of Hf deposition $D_1$=$5 \times 10^{13}$ atoms/$cm^2$, the amount of Hf deposition $D_1$=$2.7 \times 10^{14}$ atoms/$cm^2$, and the amount of Hf deposition $D_1$=$5.0 \times 10^{14}$ atoms/$cm^2$, when the impurity concentration of the channel (channel region 4) of the n channel MISFET 40 is changed. Furthermore, in FIG. 14, the relation between the threshold voltage $V_{th}$ and the drain current $I_d$ of the p channel MISFET 41 is plotted for each of the amount of Hf deposition $D_1$=0, the amount of Hf deposition $D_1$=$5 \times 10^{13}$ atoms/$cm^2$, the amount of Hf deposition $D_1$=$2.7 \times 10^{14}$ atoms/$cm^2$, and the amount of Hf deposition $D_1$=$5.0 \times 10^{14}$ atoms/$cm^2$, when the impurity concentration of the channel (channel region 6) of the p type channel MISFET is changed. Note that, in FIG. 14, the case of the amount of Hf deposition $D_1$=0 represented by a solid line corresponds to the case of a conventional SiON gate insulating film in which the metal elements 12a are not introduced to the interface with the gate electrode. Also, each of the cases of the amount of Hf deposition $D_1$=$5 \times 10^{13}$ atoms/$cm^2$, the amount of Hf deposition $D_1=2.7 \times 10^{14}$ atoms/cm$^2$, and the amount of Hf deposition $D_1=5.0 \times 10^{14}$ atoms/cm$^2$ shown in FIG. 14 corresponds to the case where the metal elements 12a, Hf in this case, are introduced to the interface between the gate insulating film and the gate electrode as in the present embodiment.

The drain current $I_d$ of the n channel MISFET 40 in FIG. 14 is measured under the conditions where $V_s$ (source voltage) =0 V, $V_w$ (well voltage)=0 V, and $V_d$ (drain voltage)=1.2 V. The threshold voltage $V_{th}$ of the n channel MISFET 40 is determined as follows. First, a threshold voltage $V_{th0}$ when the gate voltage $V_g$ is changed under the conditions of $V_s$=0 V, $V_w$=0 V, and $V_d$=0.05 V is obtained to obtain a drain current $I_{do}$ under the condition of $V_g=V_{th0}$. Then, under the conditions of $V_s$=0 V, $V_w$=0 V, and $V_d$=1.2 V, the gate voltage dependence of the drain current $I_d$ is measured, and the gate voltage $V_g$ at which $I_d=I_{do}$ is obtained is set as the threshold voltage $V_{th}$.

Also, four types of variations in impurity concentration $C_p$ (boron concentration in this case) of the channel (channel region 4) of the n channel MISFET 40 are provided, that is: $8 \times 10^{16}$/cm$^3$ (indicated in the graph of FIG. 14 with white circles); $4 \times 10^{17}$/cm$^3$ (indicated in the graph of FIG. 14 with white squares); $9 \times 10^{17}$/cm$^3$ (indicated in the graph of FIG. 14 with white triangles); and $1.5 \times 10^{18}$/cm$^3$ (indicated in the graph of FIG. 14 with white diamonds), and points for the same amount of Hf deposition $D_1$ are connected together by a line.

On the other hand, the drain current $I_d$ of the p channel MISFET 41 is measured under the conditions of $V_s$=0 V, $V_w$=0 V, and $V_d$=−1.2 V. The threshold voltage $V_{th}$ of the p channel MISFET 41 is determined as follows. First, a threshold voltage $V_{th0}$ when the gate voltage $V_g$ is changed under the conditions of $V_s$=0 V, $V_w$=0 V, and $V_d$=−0.05 V is obtained to obtain a drain current $I_{do}$ under the condition of $V_g=V_{th0}$. Then, under the conditions of $V_s$=0 V, $V_w$=0 V, and $V_d$=−1.2 V, the gate voltage dependence of the drain current $I_d$ is measured, and the gate voltage $V_g$ at which $I_d=I_{do}$ is obtained is set as the threshold voltage $V_{th}$.

Also, three types of variations in impurity concentration $C_n$ (phosphorus concentration in this case) of the channel (channel region 6) of the p channel MISFET 41 are provided, that is: $6 \times 10^{16}$/cm$^3$ (indicated in the graph of FIG. 14 with black circles); $3 \times 10^{17}$/cm$^3$ (indicated in the graph of FIG. 14 with black squares); and $8 \times 10^{17}$/cm$^3$ (indicated in the graph of FIG. 14 with black triangles), and points for the same amount of Hf deposition $D_1$ are connected together by a line.

In the graph of FIG. 14, in the case of the same gate insulating film (that is, in the case of the same amount of Hf deposition $D_1$), as the impurity concentration of the channel (each of the channel region 4 and 6) is increased, the absolute value of the threshold voltage $V_{th}$ is increased, and the drain current $I_d$ is decreased. This is because the electron mobility of the channel is decreased due to the increase in impurity concentration of the channel. However, in the case where a minute amount of the metal elements 12a, Hf atoms in this case, are deposited on the silicon oxide film 11 to form the gate insulating films and 15, it is evident that the absolute value of the threshold voltage $V_{th}$ is increased and the drain current $I_d$ compared with respect to the same threshold voltage $V_{th}$ is increased in comparison with the case of the gate insulating films formed from SiON films without depositing Hf (this case corresponds to the case of the amount of Hf deposition $D_1$=0, and is represented by straight lines in FIG. 14). This is because of the following reasons. That is, by depositing a minute amount of Hf atoms (that is, by introducing Hf atoms to the interface between the gate insulating film and the gate electrode), the impurity concentration of the channel (each of the channel regions 4 and 6) required for achieving the same $V_{th}$ can be decreased, and with the decrease in impurity concentration of the channel, the deterioration in mobility due to impurity ions as scattering sources is suppressed (that is, the mobility is increased), and as a result, the drain current $I_d$ can be increased.

An optimum value of the amount of Hf deposition $D_1$ varies depending on the design value of the target device. In the case of a device to which a gate insulating film equal to or thinner than 2.2 nm required by devices of the 90-nm and following generations is applied, the absolute value of its threshold voltage $V_{th}$ has to be adjusted to 0.55 V or lower. Therefore, in order to adjust the threshold voltage $V_{th}$ of the p channel MISFET 41, the amount of Hf deposition $D_1$ has to be controlled at a value $5 \times 10^{14}$ atoms/cm$^2$ or lower.

As described above, as shown also in FIG. 14, it is found that, in both of the n channel and p channel MISFETs 40 and 41, it is possible to increase the absolute value of the threshold voltage $V_{th}$ and also to increase the drain current $I_d$ when the threshold voltage $V_{th}$ is fixed, by depositing a minute amount of the metal elements 12a (Hf atoms in this case) as low as 1 ML (1 atom layer) in terms of HfO$_2$ film on the silicon oxide film 11. In other words, it is found that it is possible to increase the absolute value of the threshold voltage $V_{th}$ and also to decrease the impurity concentration of the channel region when the threshold voltage $V_{th}$ is fixed, by depositing a minute amount of the metal elements 12a (Hf atoms in this case) near the interface between the gate insulating films 14 and the gate electrodes 23 and 24 in both of the n channel and p channel MISFETs 40 and 41, and as a result, the drain current $I_d$ can be increased.

Figure 15:
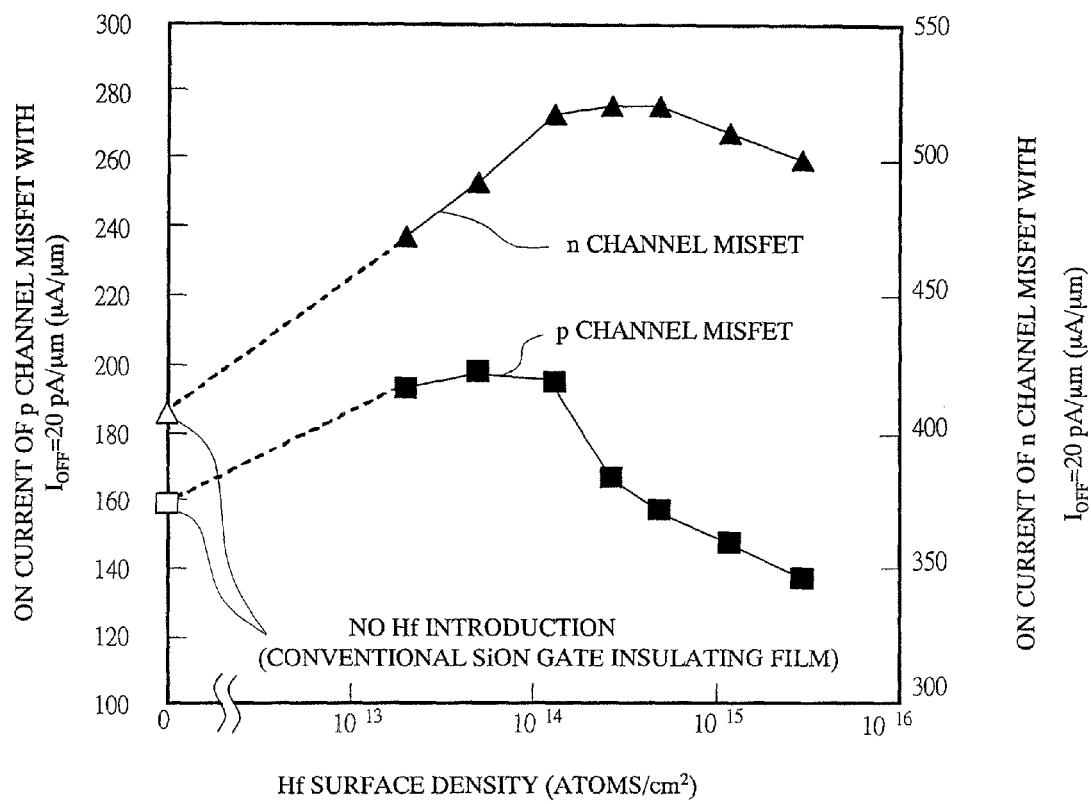
FIG. 15 is a graph showing a relation between a Hf surface density near an interface between a gate insulating film and a gate electrode and an ON current.

FIG. 15 is a graph showing a relation between the Hf surface density (corresponding to the amount of Hf deposition $D_1$) near the interface between the gate insulating film and the gate electrode and an ON current, for both of the n channel MISFET 40 and the p channel MISFET 41 each having a gate length of 60 nm. Note that this case is directed to LSTP devices with the power supply voltage of 1.2 V and the ON current for $I_{OFF}$ (OFF current) of 20 pA/μm. As for the EOT of each gate insulating film, the film thickness of the silicon oxide film 11 first formed is adjusted so that the leakage current is equal to or lower than $1.5 \times 10^{-2}$ A/cm$^2$, and eventually the gate insulating films 14 and 15 with its EOT=1.7 nm to 2.1 nm are formed. Also, in order to suppress the short channel effect (increase in OFF current), the impurity concentration of the channel (each of the channel regions 4 and 6) is adjusted within a range of $2 \times 10^{17}$/cm$^3$ to $7 \times 10^{17}$/cm$^3$.

As is also evident from FIG. 15, by introducing a minute amount of Hf atoms equal to or lower than $5 \times 10^{14}$ atoms/cm$^2$ near the interface between the gate insulating films 14 and 15 and the gate electrodes 23 and 24, it is possible to achieve a high ON current in both of the n channel MISFET 40 and the p channel MISFET 41 in comparison with the case where Hf is not introduced (the case corresponds to the conventional SiON gate insulating film). As described above, it is possible to obtain a semiconductor device (for example, LSTP device) having a CMISFET characteristic superior to that in the case of the conventional SiON gate insulating film in which the metal elements 12a is not introduced to the interface between the gate insulating film and the gate electrode.

Different from the present embodiment, when a gate insulating film composed of a silicon oxide film or a silicon oxynitride film and a gate electrode composed of a silicon film positioned on that gate insulating film are formed without introducing the metal elements 12a to the interface, the impurity concentration of the channel region has to be increased in order to increase the absolute value of the threshold voltage by controlling the threshold voltage. However, an increase in impurity concentration of the channel region invites a decrease in ON current of the MISFET. On the contrary, in the present embodiment, although a gate insulating film composed of a silicon oxide film or a silicon oxynitride film and a gate electrode composed of a silicon film positioned on that gate insulating film, since the metal elements 12a are introduced to the interface between the gate insulating film and the gate electrode, the threshold voltage can be controlled by adjusting the amount of introduction (surface density) of the metal elements 12a, and thus the absolute value of the threshold voltage can be increased. Therefore, through the introduction of the metal elements 12a to the interface, the absolute value of the threshold voltage can be increased without increasing the impurity concentration of the channel region of the MISFET, the impurity concentration of the channel region can be relatively decreased, and the ON current of the MISFET can be relatively increased. For this reason, the performance of the semiconductor device which includes the MISFETs can be improved. Furthermore, it is possible to achieve a semiconductor device having a CMISFET which can suppress the power consumption and can operate at higher speed.

Also, in the present embodiment, by introducing the metal elements 12a to the interface between the gate insulating film and the gate electrode, the absolute value of the threshold voltage can be increased, and also the impurity concentration of the channel region of the MISFET can be decreased. The impurity concentration of each of the n channel and p channel MISFETs 40 and 41 (corresponding to the impurity concentration of the channel regions 4 and 6) is preferably equal to or lower than $1.2 \times 10^{18}/cm^3$, and more preferably equal to or lower than $7 \times 10^{17}/cm^3$. In this manner, the ON current of each of the MISFETs 40 and 41 can be increased. Also, if the impurity concentration of the channel region is too low, the short channel effect may occur and controllability of the impurity concentration of the channel region may be reduced. For its prevention, the impurity concentration of the channel region of each of the n channel and p channel MISFETs 40 and 41 (corresponding to the impurity concentration of each of the channel regions 4 and 6) is preferably equal to or higher than $2 \times 10^{17}/cm^3$, and more preferably equal to or higher than $4 \times 10^{17}/cm^3$. In this manner, the short channel effect can be suppressed, and the controllability of the impurity concentration of the channel region can be improved. Therefore, the impurity concentration of the channel region of each of the n channel and p channel MISFETs 40 and 41 after completion of the semiconductor device (corresponding to the impurity concentration of each of the channel regions 4 and 6) is preferably equal to or lower than $1.2 \times 10^{18}/cm^3$, more preferably in the range of $2 \times 10^{17}/cm^3$ to $1.2 \times 10^{18}/cm^3$, and further preferably in the range of $4 \times 10^{17}/cm^3$ to $7 \times 10^{17}/cm^3$.

Also, if the surface density of the metal elements 12a introduced to the interface between the gate insulating film and the gate electrode is too high, as shown in FIG. 15, the ON current of the MISFET is adversely decreased. However, similar to the present embodiment, if the surface density of the metal elements 12a introduced near the interface between the gate insulating film and the gate electrode is equal to or lower than $5 \times 10^{14}$ atoms/cm$^2$, the ON current more than that in the case where the metal elements 12a are not introduced near the interface between the gate insulating film and the gate electrode can be ensured. Also, if the surface density of the metal elements 12a introduced near the interface between the gate insulating film and the gate electrode is equal to or lower than $5 \times 10^{14}$ atoms/cm$^2$, the ON current more than that in the case where the metal elements 12a are not introduced near the interface between the gate insulating film and the gate electrode can be ensured, and it is possible to achieve the performance improvement of the semiconductor device. Furthermore, if the surface density of the metal elements 12a introduced near the interface is equal to or lower than $1.5 \times 10^{14}$ atoms/cm$^2$, the ON current can be further increased, and it is possible to further improve the performance of the semiconductor device. Therefore, if the surface density of the metal elements 12a introduced near the interface between the gate insulating film and the gate electrode is equal to or lower than $5 \times 10^{14}$ atoms/cm$^2$, it is possible to simultaneously achieve the control of the threshold voltage (increase in the absolute value of the threshold voltage) and the increase of the ON current. In addition, if the surface density of the metal elements 12a introduced near the interface is equal to or lower than $1.5 \times 10^{14}$ atoms/cm$^2$, these effects can be further enhanced simultaneously.

Also, if the surface density of the metal elements 12a introduced near the interface between the gate insulating film and the gate electrode is too high, a difference between the absolute value of the threshold voltage of the n channel MISFET 40 and the absolute value of the threshold voltage of the p channel MISFET 41 may be increased. However, as in the present embodiment, by setting the surface density of the metal elements 12a introduced near the interface between the gate insulating film and the gate electrode to be equal to or lower than $5 \times 10^{14}$ atoms/cm$^2$, more preferably to be equal to or lower than $1.5 \times 10^{14}$ atoms/cm$^2$, the threshold voltages can be controlled while the difference between the absolute value of the threshold voltage of the n channel MISFET 40 and the absolute value of the threshold voltage of the p channel MISFET 41 is kept small.

Still further, if the surface density of the metal elements 12a introduced near the interface between the gate insulating film and the gate electrode is too low, it becomes difficult to control the amount of introduction of the metal elements 12a to the interface between the gate insulating film and the gate electrode, which makes it difficult to adjust the threshold voltage. For example, in the metal element deposition process 12 in step S2, if the surface density of the metal elements 12a is lower than $1 \times 10^{13}$ atoms/cm$^2$, since it is difficult to uniformly deposit the metal elements 12a on the silicon oxide film 11 with the designed surface density, the surface density of the metal elements 12a introduced for each semiconductor substrate is varied, and the threshold voltage is frequently varied for each semiconductor substrate. Alternatively, even in the same semiconductor substrate, the threshold voltage is frequently varied for each CMISFET. This reduces yields of the semiconductor device. However, as in the present embodiment, if the surface density of the metal elements 12a introduced near the interface between the gate electrode and the gate insulating film is equal to or higher than $1 \times 10^{13}$ atoms/cm$^2$, the amount of introduction of the metal elements 12a to the interface between the gate insulating film and the gate electrode can be easily controlled, which makes it possible to control the threshold voltage at a desired value without variations. For example, in the metal element deposition process 12 in step S2, the metal elements 12a can be deposited on the silicon oxide film 11 with the designed surface density. Also, variations in surface density of the introduced metal elements 12a can be suppressed or prevented for each semiconductor substrate, and variations in threshold voltage can be suppressed or prevented for each semiconductor substrate. Still further, if the surface density of the metal elements 12a introduced near the interface between the gate electrode and the gate insulating film is equal to or higher than $5 \times 10^{13}$ atoms/cm$^2$, the above-described effects can be further enhanced, and therefore such a surface density is more preferable. Therefore, the surface density of the metal elements 12a introduced near the interface between the gate electrode and the gate insulating film is preferably $1\times10^{13}$ to $5\times10^{14}$ atoms/cm$^2$, and more preferably $5\times10^{13}$ to $1.5\times10^{14}$ atoms/cm$^2$. Note that the same goes for the case of introducing the metal elements 12a through ion implantation, as described in fourth and fifth embodiments described further below.

As described above, in the present embodiment, by introducing the metal elements 12a with the surface density of $1\times10^{13}$ to $5\times10^{14}$ atoms/cm$^2$ near the interface between the gate insulating film and the gate electrode, the performance of the semiconductor device having the MISFETs can be improved.

Also, according to distribution of Si, O, Hf, and N obtained from TOF-SIMS analysis for the gate insulating films 14 and 15 and the gate electrodes 23 and 24 of the semiconductor device manufactured according to the present embodiment, the introduced Hf (metal elements 12a) is locally present in a range within 0.5 nm upward and downward from the interface between the gate insulating films 14 and 15 and the gate electrodes 23 and 24 (silicon film 21). In this state, the Hf atoms (metal elements 12a) even, thinner than one layer in terms of HfO$_2$ film are deposited on the silicon oxide film 11 or the silicon oxynitride film 13, and this state is equal to the state that Hf (metal elements 12a) is doped in the interface between the gate insulating films 14 and 15 (silicon oxynitride film 13) and the gate electrodes 23 and 24 (silicon film 21). The reason why the decrease in electron mobility can be suppressed to minimum is that the Hf atoms (metal elements 12a) are positioned away from the silicon substrate region (channel regions 4 and 6 in this case).

Figure 16:
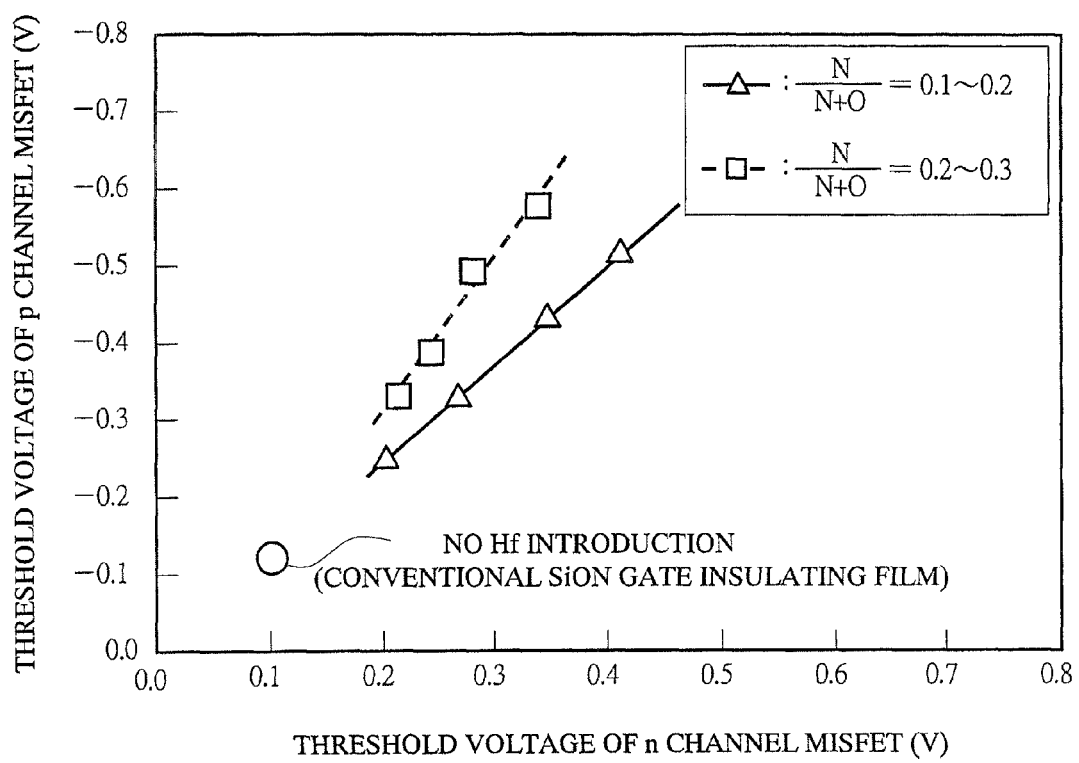
FIG. 16 is a graph showing an influence of the amount of introduction of nitrogen to the gate insulating films exerted on the threshold voltages of the n channel MISFET and the p channel MISFET.

FIG. 16 is a graph showing how the threshold voltages $V_{th}$ of the n channel MISFET 40 and the p channel MISFET 41 are affected by the amount of introduction of nitrogen to the gate insulating films 14 and 15. The graph of FIG. 16 shows a correlation between the threshold voltage $V_{th}$ of the n channel MISFET 40 and the threshold voltage $V_{th}$ of the p channel MISFET 41 in the case where the amount of Hf deposition $D_1$ is changed in a range of $3\times10^{13}$ to $2.7\times10^{14}$ atoms/cm$^2$ to form a CMISFET, and a comparison between the large amount of nitrogen introduction and the small amount of nitrogen introduction to the gate insulating films 14 and 15.

In this case, the amount of nitrogen introduced to the gate insulating films 14 and 15 is defined by N/(N+O) representing a ratio of the number of nitrogen (N) atoms with respect to the sum of the number of nitrogen (N) atoms and the number of oxygen (O) atoms, and is obtained through an X-ray photoelectron spectroscopy. FIG. 16 depicts the case of N/(N+O) =0.2 to 0.3 where the amount of nitrogen introduced to the gate insulating films 14 and 15 is large (indicated by squares in the graph of FIG. 16) and the case of N/(N+O)=0.1 to 0.2 where the amount of nitrogen introduced to the gate insulating films 14 and 15 is small (indicated by triangles in the graph of FIG. 16).

In order to optimize the effects obtained by introducing a minute amount of Hf to the interface between the gate insulating film and the gate electrode in both of the n channel MISFET 40 and the p channel MISFET 41, it is preferable that the absolute value of shifted amount of the threshold voltage $V_{th}$ of the n channel MISFET 40 is approximately equal to that of the p channel MISFET 41.

As is evident from the graph of FIG. 16, the n channel MISFET 40 and the p channel MISFET 41 has a symmetric relation in a shift of the flat band voltage (threshold voltage $V_{th}$) in the case where the amount of nitrogen introduced to the gate insulating films 14 and 15 is relatively small such as N/(N+O)=0.1 to 0.2. That is, the absolute value of the shifted amount of the threshold voltage $V_{th}$ of the n channel MISFET 40 is as much as that of the p channel MISFET 41.

On the contrary, when the amount of nitrogen introduced to the gate insulating films 14 and 15 is relatively large such as N/(N+O)=0.2 to 0.3, the shifted amount of the flat band voltage (threshold voltage $V_{th}$) is relatively large in the p channel MISFET 41, and the shifted amount thereof is relatively small in the n channel MISFET 40. That is, the absolute value of the shifted amount of the threshold voltage $V_{th}$ in the n channel MISFET 40 is different from that in the p channel MISFET 41. This is because, since the amount of nitrogen introduced to the gate insulating films 14 and 15 is too large, positive fixed charges occur, and the flat band voltages of both of the n channel MISFET 40 and the p channel MISFET 41 are shifted in a negative direction. Also, according to studies by the inventors, it has been confirmed that, if nitrogen with of N/(N+O)=0.1 to 0.2 is introduced to the gate insulating film 14, diffusion of the boron impurities of the gate electrode 23 into the semiconductor substrate 1 can be suppressed. Therefore, the amount of nitrogen introduced into the gate insulating films 14 and 15 is preferably restricted to the amount required for preventing diffusion of the boron impurities of the gate electrode 23 into the semiconductor substrate 1.

Next, a method of applying the present embodiment to a gate insulating film having a further reduced thickness will be described. According to the ITRS roadmap, LOP (low operation power) devices in 2006 have a gate length of 37 nm, a power supply voltage of 0.9 V, $I_{OFF}$=3 nA/μm, a leakage voltage of 2.7 A/cm$^2$, EOT=1.3 nm, and $V_{th}$=0.28 V. In this case, a technology similar to that described with reference to FIG. 1 to FIG. 12 can be used to manufacture such LOP devices. Further, by reducing the thickness of the silicon oxide film 11 formed on the semiconductor substrate 1 to about 1.3 nm and controlling the amount of Hf deposition on the silicon oxide film 11 to $1\times10^{13}$ to $5\times10^{14}$ atoms/cm$^2$, a FET characteristic superior to that of the conventional MISFET having a SiON gate insulating film (in the case where the metal elements 12a are not introduced to the interface between the gate electrode and the gate insulating film) can be achieved for both of the n channel MISFET and the p channel MISFET. More preferably, the EOT of the gate insulating film at this time is about 1.2 nm, and the impurity concentration introduced to the channel (each of the channel regions 4 and 6) is adjusted within a range of $3\times10^{17}$/cm$^3$ to $1\times10^{18}$/cm$^3$.

In the present embodiment, the case where Hf (hafnium) is used as the metal elements 12a introduced near the interface between the gate insulating films 14 and 15 and the gate electrodes 23 and 24 has been described. However, in place of Hf, metal elements such as Zr (zirconium), Pt (platinum), Mo (molybdenum), and W (tungsten) for forming both of a donor level and an acceptor level (both interface states) in a band gap of crystal silicon (Si) can be used as the metal elements 12a. According to the studies by the inventors, by introducing the metal elements (such as Hf, Zr, Pt, Mo, and W) for forming both of a donor level and an acceptor level in a band gap of crystal silicon (Si) near the interface between the gate insulating film and the gate electrode with an amount of deposition (surface density) similar to that of Hf described above, it is observed that the flat band voltage (threshold voltage) is shifted in a manner almost similar to that of Hf described above. This indicates that, with the introduction of the metal elements 12a, an interface state is formed at the interface between the gate electrode (Si gate electrode) containing the silicon film positioned on the gate insulating film and the gate insulating film, and a vacant interface state (p type Si gate electrode) and an occupied interface state (n type Si gate electrode) are formed according to the conductive type of the gate electrode (Si gate electrode), thereby causing the above-described phenomenon.

Furthermore, if both of a donor level and an acceptor level can be formed in the band gap of the crystal silicon (Si) by combining two types or more of metal elements, such two types or more of metal elements can be introduced as the metal elements 12a near the interface between the gate insulating films 14 and 15 and the gate electrodes 23 and 24. Also in this case, effects approximately similar to those in the case of the introduction of Hf as described above can be achieved. That is, the metal elements 12a contain both of first metal elements capable of forming an acceptor level in the band gap of the crystal silicon (Si) and second metal elements capable of forming a donor level in the band gap of the crystal silicon (Si), and these first and second metal elements can be introduced as the metal elements 12a near the interface between the gate insulating films 14 and 15 and the gate electrodes 23 and 24.

Examples of the first metal elements capable of forming an acceptor level in the band gap of the crystal silicon (Si) include Hf (hafnium), Zr (zirconium), Pt (platinum), Mo (molybdenum), W (tungsten), Ni (nickel), and Al (aluminum). Examples of the second metal elements capable of forming a donor level in the band gap of the crystal silicon (Si) include Hf (hafnium), Zr (zirconium), Pt (platinum), Mo (molybdenum), W (tungsten), Ti (titanium), and Ta (tantalum). Of these, Hf, Zr, Pt, Mo, and W can form both of a donor level and an acceptor level in the band gap of the crystal silicon (Si).

For example, if a combination of Ti (titanium) and Al (aluminum), a combination of Ta (tantalum) and Al (aluminum), a combination of Ti (titanium) and Ni (nickel) or the like is used as the metal elements 12a, a flat band voltage shift similar to that of Hf as described above can be obtained.

That is, in the present embodiment, it is only necessary in a CMISFET composed of the MISFETs 40 and 41 that a metal element (such as Hf, Zr, Pt, Mo, W, Ni, or Al) capable of forming an acceptor level in the band gap of the crystal silicon (Si) is introduced as the metal elements 12a near the interface between the gate electrode 23 and the gate insulating film 14 of the n channel MISFET 40, and a metal element (such as Hf, Zr, Pt, Mo, W, Ti, or Ta) capable of forming a donor level in the band gap of the crystal silicon (Si) is introduced as the metal elements 12a near the interface between the gate electrode 24 and the gate insulating film 15 of the p channel MISFET 41.

As described above, in the present embodiment, by using not only Hf but also other metal elements as described above as the metal elements 12a introduced near the interface between the gate insulating film and the gate electrode in a manner similar to that described above, effects similar to those described above can be achieved.

Furthermore, design values of the devices in 2006 predicted in the ITRS roadmap have been exemplarily mentioned in the present embodiment to indicate a specific amount of Hf deposition. Alternatively, the present embodiment can be similarly applied to other different design values. If the thickness of an initial silicon oxide ($SiO_2$) film capable of suppressing a leakage current is selected, the impurity concentration of the channel equal to or lower than $1.2 \times 10^{18}/cm^3$ capable of suppressing short channel effect is selected, and the threshold voltage is adjusted by introducing the metal elements 12a of $1 \times 10^{13}$ to $5 \times 10^{14}$ atoms/cm² near the interface between the Si gate electrode and the gate insulating film, a FET characteristic superior to that of the conventional MISFET using a silicon oxynitride film as a gate electrode can be achieved.

Still further, in the present embodiment, after the metal elements 12a are deposited on the silicon oxide film 11 in step S2, the silicon oxide film 11 is nitrided in step S3 to form the silicon oxynitride film 13. As described with reference to FIG. 16, if the amount of introduction of nitrogen to the gate insulating films 14 and 15 is too large, the absolute value of the shift amount of the threshold voltage $V_{th}$ of the n channel MISFET 40 is different from that of the p channel MISFET 41. Therefore, it is preferable to control the amount of introduction of nitrogen to the gate insulating films 14 and 15 so as not to be excessive as long as the amount is enough to prevent the diffusion of the boron impurities of the gate electrode into the semiconductor substrate 1. In the present embodiment, in the state where the metal elements 12a are deposited on the silicon oxide film 11, the nitriding process of the silicon oxide film 11 in step S3 is performed. Therefore, it is easy in step S3 to suppress excessive nitriding of the silicon oxide film 11, and the amount of introduction of nitrogen to the silicon oxynitride film 13 to be formed can be easily controlled. In another embodiment, the order of step S2 and step S3 can be changed. That is, after nitriding the silicon oxide film 11 to form the silicon oxynitride film 13, a minute amount of the metal elements 12a can be deposited on the silicon oxynitride film 13. Also in this case, effects similar to those in the present embodiment can be achieved, except the easiness of control of the amount of introduction of nitrogen to the silicon oxynitride film 13.

Still further, in the present embodiment, the silicon oxynitride film 13 is used as the gate insulating films 14 and 15. Therefore, since it is possible to prevent the diffusion of the boron impurities of the gate electrode 23 into the semiconductor substrate 1, the performance of the semiconductor device having a CMISFET can be improved. In another embodiment, the step S3 is omitted, and the gate insulating films 14 and 15 can be formed from the silicon oxide film 11. Even in the case where the silicon oxide film 11 is used to form the gate insulating films 14 and 15, the metal elements 12a are introduced near the interface between the gate insulating films 14 and 15 each composed of the silicon oxide film 11 and the gate electrodes 23 and 24 with a surface density similar to that in the case of forming the gate insulating films 14 and 15 from the silicon oxynitride film 13. By doing so, it is possible to achieve the effects similar to those in the case where the gate insulating films 14 and 15 are formed from the silicon oxynitride film 13. Therefore, the present embodiment and the following embodiments can be applied to the case where the gate insulating films of the CMISFET are composed of a silicon oxynitride film or a silicon oxide film.

Note that the equivalent silicon oxide ($SiO_2$) film thickness of the gate insulating film used in the present embodiment and the following embodiments is obtained by using a method indicated by S. Saito et al. in IEEE Electron Device Letters, Volume: 23 (2002), p. 348.

(Second Embodiment)

In the present embodiment, multi-level gate insulating films having various (two or more types of) film thicknesses are formed on the same semiconductor substrate 1, and metal elements 12a having a surface density of $1 \times 10^{13}$ to $5 \times 10^{14}$ atoms/cm² are introduced into the gate insulating film and the interface between the gate insulating film and the Si gate electrode. Also, the surface density of the metal elements 12a is equal in all of the gate insulating films.

FIG. 17 to FIG. 22 are cross-sectional views of main parts during a manufacturing process of a semiconductor device according to the present embodiment.

In the present embodiment, the case where two types of CMISFET 60a and 60b, one having an EOT of 1.8 nm of the gate insulating film after completion and the other having an EOT of 7.0 nm of the gate insulating film after completion, are formed will be described as an example.

Figure 17:
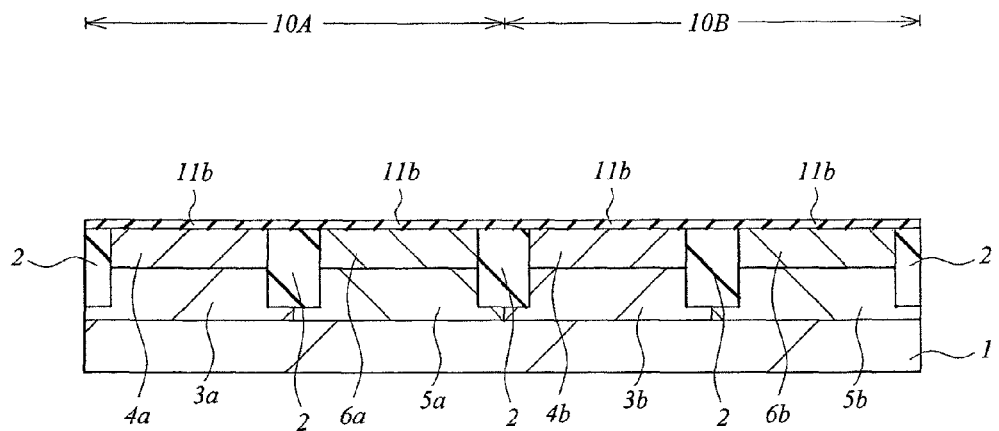
FIG. 17 is a cross-sectional view of main parts during a manufacturing process of a semiconductor device according to another embodiment of the present invention.
Figure 18:
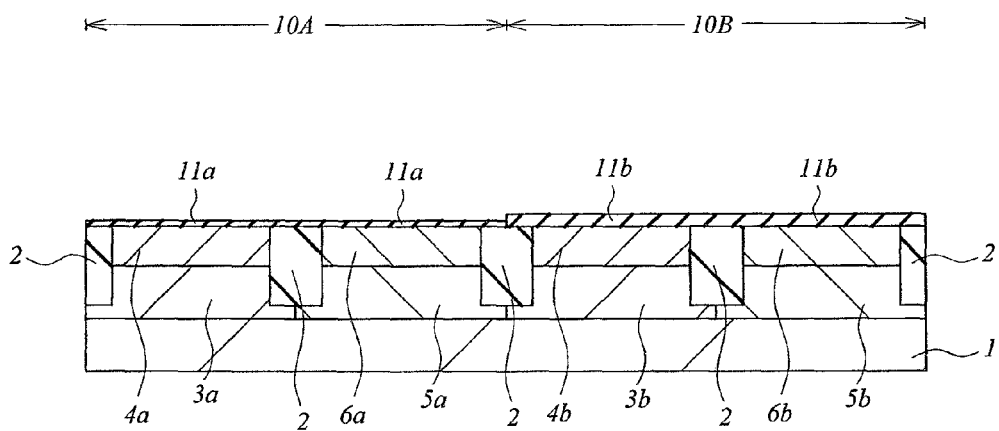
FIG. 18 is a cross-sectional view of the main parts, continued from FIG. 17, during the manufacturing process of a semiconductor device.

As shown in FIG. 17, a semiconductor substrate (semiconductor wafer or single-crystal silicon substrate) 1 where a semiconductor device according to the present embodiment is formed has a region 10A where the above-mentioned CMISFET 60a is formed and a region 10B where the above-mentioned CMISFET 60b is formed. That is, in the region 10A, the CMISFET 60a having a gate insulating film of EOT=1.8 nm is formed, and in the region 10B, the CMISFET 60b having a gate insulating film of EOT=7.0 nm is formed. Therefore, a withstand voltage of n channel and p channel MISFETs constituting the CMISFET formed in the region 10B is higher than a withstand voltage of n channel and p channel MISFETs constituting the CMISFET formed in the region 10A.

Then, in a manner similar to that in the first embodiment, element isolation regions 2 for defining active regions are formed on the main surface of the semiconductor substrate 1.

Next, by repeating photolithography and ion implantation, two types of p type wells 3a and 3b and two types of n type wells 5a and 5b are formed on the semiconductor substrate 1. Note that the p type well 3a and the n type well 5a are formed in the region 10A, and the p type well 3b and the n type well 5b are formed in the region 10B.

Next, for example, through ion implantation of p type impurities (for example, boron (B)) for adjusting the threshold voltage of the n channel MISFET to each of the p type wells 3a and 3b, two types of channel regions (p type semiconductor regions) 4a and 4b whose impurity concentration is adjusted are formed on (the surface portions of) the p type wells 3a and 3b, respectively. Also, for example, through ion implantation of n type impurities (for example, phosphorus (P)) for adjusting the threshold voltage of the p channel MISFET to each of the n type wells 5a and 5b, two types of channel regions (n type semiconductor regions) 6a and 6b whose impurity concentration is adjusted are formed on (the surface portions of) the n type wells 5a and 5b, respectively.

In the present embodiment, the amount of ion implantation at the time of forming the channel regions 4a and 4b and the channel regions 6a and 6b is adjusted so that the impurity concentration (substrate impurity concentration) of the channel regions 4a and 4b and the channel regions 6a and 6b is equal to or lower than $1.2 \times 10^{18}/cm^3$ after completion of the semiconductor device and also short channel effect can be suppressed.

Next, after removing a native oxide film on the surface of the semiconductor substrate 1 through cleaning using dilute hydrofluoric acid, a silicon oxide film (oxide film of silicon) 11b is formed on the main surface (the surface of the p type wells 3a and 3b and the n type wells 5a and 5b) of the semiconductor substrate 1. The silicon oxide film 11b can be formed by oxidizing (thermally oxidizing) the main surface of the semiconductor substrate 1, and the silicon oxide film 11b has a film thickness, for example, of about 6 nm.

Next, a photoresist film (not shown) is formed only on the region 10B through photolithography, and the silicon oxide film 11b is etched with using this photoresist film as an etching mask. By doing so, the silicon oxide film 11b on the p type well 3a and the n type well 5a in the region 10A is removed, and the silicon oxide film 11b is left on the p type well 3b and the n type well 5b in the region 10B.

Next, after removing a native oxide film on the surface of the semiconductor substrate 1 through, for example, cleaning using dilute hydrofluoric acid, a silicon oxide film is formed by oxidizing (thermally oxidizing) the main surface of the semiconductor substrate 1. The oxidization is performed under the conditions capable of forming a silicon oxide film of about 1.8 nm on the semiconductor substrate 1. Consequently, a silicon oxide film 11a having a film thickness of about 1.8 nm is formed on the p type well 3a and the n type well 5a in the region 10A. Also, the film thickness of the silicon oxide film 11b on the p type well 3b and the n type well 5b in the region 10B is increased to, for example, about 7.0 nm. In this manner, the structure shown in FIG. 18 can be achieved. That is, in the present embodiment, the film thickness of the silicon oxide film 11b is larger than the film thickness of the silicon oxide film 11a.

Figure 19:
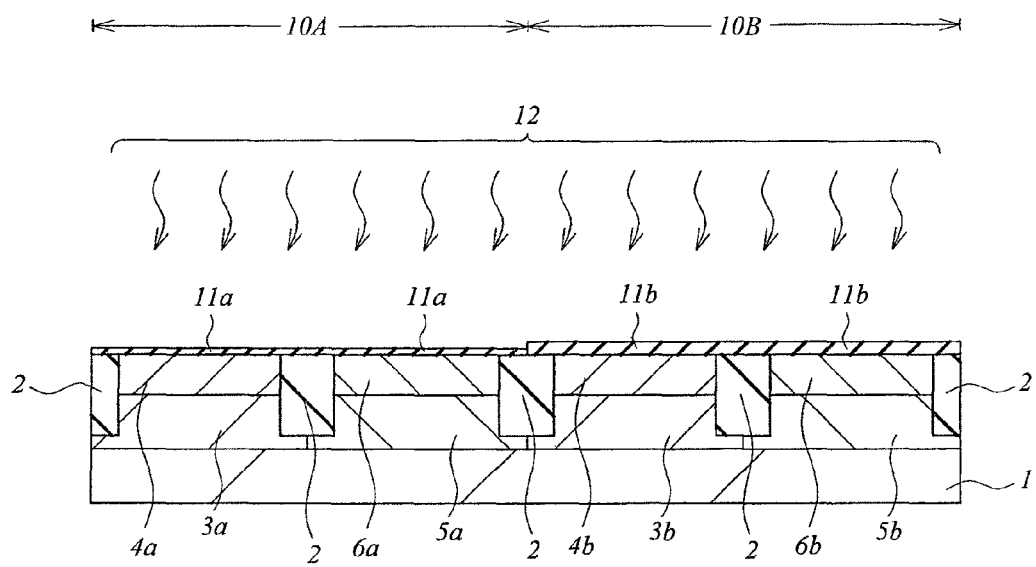
FIG. 19 is a cross-sectional view of the main parts, continued from FIG. 18, during the manufacturing process of a semiconductor device.

Next, as shown in FIG. 19, a metal element deposition process 12 is performed in the same manner as that of step S2 in the first embodiment to deposit a minute amount of metal elements (metal atoms) 12a on the silicon oxide films 11a and 11b. The surface density and others of the metal elements 12a deposited on the silicon oxide films 11a and 11b in the metal element deposition process 12 are similar to those in the first embodiment. That is, also in the present embodiment, the surface density of the metal elements 12a deposited on the silicon oxide films 11a and 11b is within a range of $1 \times 10^{13}$ to $5 \times 10^{14}$ atoms/cm$^2$.

Figure 20:
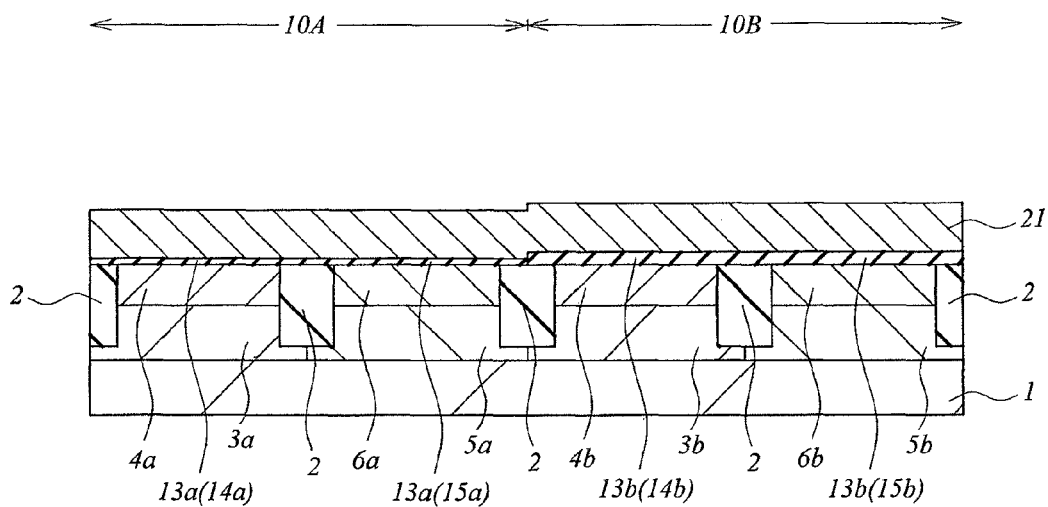
FIG. 20 is a cross-sectional view of the main parts, continued from FIG. 19, during the manufacturing process of a semiconductor device.

Next, similar to the first embodiment, through the plasma nitriding process, a heat treatment in an ammonia atmosphere, or the like, nitrogen is introduced to the silicon oxide films 11a and 11b. In this manner, as shown in FIG. 20, nitrogen is introduced into the silicon oxide film 11b and it becomes a silicon oxynitride film 13b, and nitrogen is introduced into the silicon oxide film 11a and it becomes a silicon oxynitride film 13a. Then, excessive nitrogen of the silicon oxynitride films 13a and 13b can be vaporized by performing a heat treatment at a relatively high temperature in oxygen dilution according to need.

Through the process described above, gate insulating films 14a, 14b, 15a, and 15b composed of the silicon oxynitride films 13a and 13b each having a minute amount of the metal elements 12a deposited on its upper surface (upper portion) are formed. Of these, the gate insulating film 14a is composed of the silicon oxynitride film 13a having a minute amount of the metal elements 12a deposited on its upper surface and is formed on the p type well 3a in the region 10A. Also, the gate insulating film 15a is composed of the silicon oxynitride film 13a having a minute amount of the metal elements 12a deposited on its upper surface and is formed on the n type well 5a in the region 10A. Further, the gate insulating film 14b is composed of the silicon oxynitride film 13b having a minute amount of the metal elements 12a deposited on its upper surface and is formed on the p type well 3b in the region 10B. Furthermore, the gate insulating film 15b is composed of the silicon oxynitride film 13b having a minute amount of the metal elements 12a deposited on its upper surface and is formed on the n type well 5b in the region 10B. As described above, since the film thickness of the silicon oxide film 11b is larger than the film thickness of the silicon oxide film 11a, the film thickness of the gate insulating films 14b and 15b is larger than the film thickness of the gate insulating films 14a and 15a. That is, the gate insulating films 14b and 15b and the gate insulating films 14a and 15a having different thicknesses are formed on the same semiconductor substrate 1.

Figure 21:
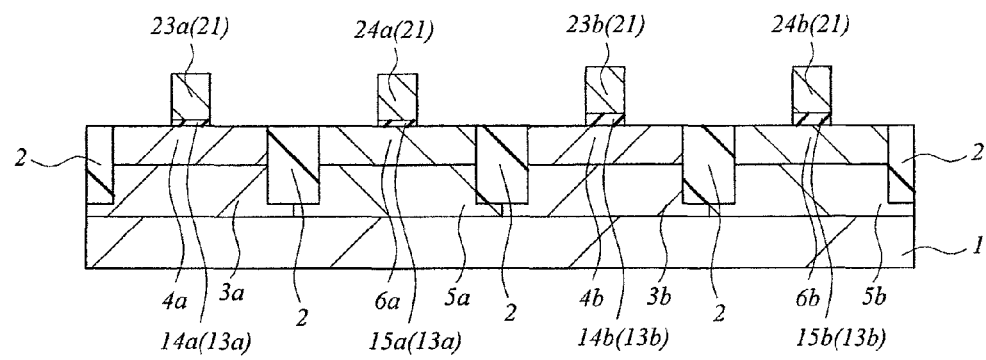
FIG. 21 is a cross-sectional view of the main parts, continued from FIG. 20, during the manufacturing process of a semiconductor device.
Figure 22:
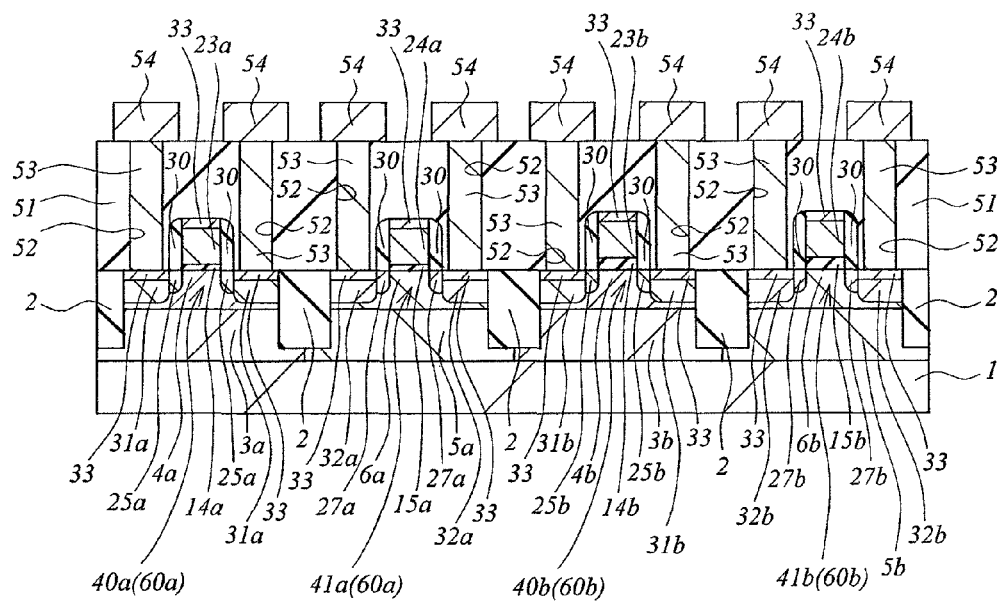
FIG. 22 is a cross-sectional view of the main parts, continued from FIG. 21, during the manufacturing process of a semiconductor device.

Next, similar to the first embodiment, a silicon film 21 is formed on the main surface (the gate insulating films 14a, 14b, 15a, and 15b) of the semiconductor substrate 1. Then, as shown in FIG. 21, the silicon film 21 is patterned to form gate electrodes 23a, 23b, 24a, and 24b composed of the patterned silicon film 21. The gate electrode 23a is formed on the gate insulating film 14a on the surface of the p type well 3a, the gate electrode 24a is formed on the gate insulating film 15a on the surface of the n type well 5a, the gate electrode 23b is formed on the gate insulating film 14b on the surface of the p type well 3b, and the gate electrode 24b is formed on the gate insulating film 15b on the surface of the n type well 5b.

The process thereafter is approximately similar to that in the first embodiment. That is, similar to the first embodiment, through the ion implantation of n type impurities into the regions on both sides of the gate electrodes 23a and 23b on the p type wells 3a and 3b, relatively shallow n⁻ type semiconductor regions (n type impurity diffusion layers) 25a and 25b are formed. Then, for example, through the ion implantation of p type impurities, p type semiconductor regions (not shown) for preventing punch-through are formed around the n⁻ type semiconductor regions 25a and 25b. Similarly, through the ion implantation of p type impurities into the regions on both sides of the gate electrodes 24a and 24b on the n type wells 5a and 5b, relatively shallow p⁻ type semiconductor regions (p type impurity diffusion layers) 27a and 27b are formed. Then, for example, through the ion implantation of n type impurities, n type semiconductor regions (not shown) for preventing punch-through are formed around the p⁻ type semiconductor regions 27a and 27b.

Next, similar to the first embodiment, the sidewalls 30 are formed on sidewalls of each of the gate electrodes 23a, 23b, 24a, and 24b.

Next, similar to the first embodiment, by the ion implantation of n type impurities into the p type well 3a in the region 10A and the p type well 3b in the region 10B of the semiconductor substrate 1 with using sidewalls 30 as ion implantation blocking masks, n⁺ type semiconductor regions 31a and 31b (source and drain) are formed in the regions on both sides of the gate electrodes 23a and 23b and the sidewalls 30 on the p type wells 3a and 3b. At the time of this ion implantation, n type impurities are also ion-implanted into the gate electrodes 23a and 23b. Thus, the gate electrodes 23a and 23b become n-conductive-type, low-resistance semiconductor films (silicon films) having n type impurities implanted therein. Similarly, by the ion implantation of p type impurities into the n type well 5a in the region 10A and the n type well 5b in the region 10B of the semiconductor substrate 1 with using the sidewalls as ion implantation blocking masks, p⁺ type semiconductor regions 32a and 32b (source and drain) are formed in the regions on both sides of the gate electrodes 24a and 24b and the sidewalls 30 on the n type wells 5a and 5b. At the time of this ion implantation, p type impurities are also ion-implanted into the gate electrodes 24a and 24b. Thus, the gate electrodes 24a and 24b become p-conductive-type, low-resistance semiconductor films (silicon films) having p type impurities implanted therein.

After the ion implantation, similar to the first embodiment, an annealing process for activating the introduced impurities is performed.

The n⁺ type semiconductor region 31a has an impurity concentration higher than that of the n⁻ type semiconductor region 25a, and the p⁺ type semiconductor region 32a has an impurity concentration higher than that of the p⁻ type semiconductor region 27a. Also, the n⁺ type semiconductor region 31b has an impurity concentration higher than that of the n⁻ type semiconductor region 25b, and the p⁺ type semiconductor region 32b has an impurity concentration higher than that of the p⁻ type semiconductor region 27b. Therefore, n type semiconductor regions (impurity diffusion layers) functioning as source and drain of an n channel MISFET are formed of the n⁺ type semiconductor regions 31a and the n⁻ type semiconductor regions 25a, and p type semiconductor regions (impurity diffusion layers) functioning as source and drain of a p channel MISFET are formed of the p⁺ type semiconductor regions 32a and the p⁻ type semiconductor regions 27a. Also, n type semiconductor regions (impurity diffusion layers) functioning as source and drain of a high-withstand-voltage n channel MISFET are formed of the n⁺ type semiconductor regions 31b and the n⁻ type semiconductor regions 25b, and p type semiconductor regions (impurity diffusion layers) functioning as source and drain of a high-withstand-voltage p channel MISFET are formed of the p⁺ type semiconductor regions 32b and the p type semiconductor regions 27b.

Next, similar to the first embodiment, metal silicide layers 33 are formed on each surface of the gate electrodes 23a, 23b, 24a, and 24b, the n⁺ type semiconductor regions 31a and 32b, and the p⁺ type semiconductor regions 32a and 32b.

In this manner, in the region 10A, an n channel MISFET 40a is formed on the p type well 3a and a p channel MISFET 41a is formed on the n type well 5a, thereby forming the CMISFET 60a. Also, in the region 10B, an n channel MISFET 40b is formed on the p type well 3b and a p channel MISFET 41b is formed on the n type well 5b, thereby forming the CMISFET 60b.

Next, similar to the first embodiment, an insulating film 51 is formed on the semiconductor substrate 1 so as to cover the gate electrodes 23a, 23b, 24a and 24b, contact holes 52 are formed in the insulating film 51, plugs 53 are formed inside the contact holes 52, and wirings 54 are formed on the insulating film 51 in which the plugs 53 are embedded. The wirings 54 are electrically connected via the plugs 53 to the n⁺ type semiconductor regions 31a and 31b, the p⁺ type semiconductor regions 32a and 32b, and the gate electrodes 23a, 23b, 24a, and 24b. Then, further upper layers, such as interlayer insulating films, wiring layers, and others are formed to obtain a multilayered wiring structure. However, the illustration and the description thereof are omitted here.

In this manner, a semiconductor device including two types of CMISFETs having different thicknesses of the gate insulating films is formed.

Also in the present embodiment, similar to the first embodiment, the gate insulating films 14a, 14b, 15a, and 15b composed of the silicon oxynitride films 13a and 13b each having a minute amount of the metal elements 12a deposited on its upper surface (upper portion) are formed, and on these gate insulating films 14a, 14b, 15a, and 15b, the gate electrodes 23a, 23b, 24a, and 24b (Si gate electrodes) composed of the silicon film 21 are formed.

Therefore, similar to the first embodiment, also in the semiconductor device according to the present embodiment, in the CMISFET formed of the n channel MISFET 40a and the p channel MISFET 41a, the gate electrode 23a of the n channel MISFET 40a includes the silicon film 21 positioned on the gate insulating film 14a, the gate insulating film 14a is composed of the silicon oxynitride film 13a, and the metal elements 12a (for example, Hf) are introduced near the interface between the gate electrode 23a and the gate insulating film 14a. Also, the gate electrode 24a of the p channel MISFET 41a includes the silicon film 21 positioned on the gate insulating film 15a, the gate insulating film 15a is composed of the silicon oxynitride film 13a, and the metal elements 12a (for example, Hf) are introduced near the interface between the gate electrode 24a and the gate insulating film 15a.

Similarly, in the CMISFET formed of the n channel MISFET 40b and the p channel MISFET 41b, the gate electrode 23b of the n channel MISFET 40b includes the silicon film 21 positioned on the gate insulating film 14b, the gate insulating film 14b is composed of the silicon oxynitride film 13b, and the metal elements 12a (for example, Hf) are introduced near the interface between the gate electrode 23b and the gate insulating film 14b. Also, the gate electrode 24b of the p channel MISFET 41b includes the silicon film 21 positioned on the gate insulating film 15b, the gate insulating film 15b is composed of the silicon oxynitride film 13b, and the metal elements 12a (for example, Hf) are introduced near the interface between the gate electrode 24b and the gate insulating film 15b.

Furthermore, the film thickness of the gate insulating films 14b and 15b is thicker than the film thickness of the gate insulating films 14a and 15a. Therefore, the n channel MISFET 40b and the p channel MISFET 41b have a higher withstand voltage than that of the n channel MISFET 40a and the p channel MISFET 41a.

Still further, in the present embodiment, the case where the EOT of the gate insulating films 14a and 15a is 1.8 nm, the EOT of the gate insulating films 14b and 15b is 7.0 nm, the power supply voltage for the n channel MISFET 40a and the p channel MISFET 41a is 1.2 V, and the power supply voltage for the n channel MISFET 40b and the p channel MISFET 41b is 3.3 V has been described as an example. The amount (the surface density) of the metal elements 12a introduced near the interface between the gate insulating film and the gate electrode is determined so as to achieve advantages by suppressing the impurity concentration of the channel in the MISFET having the smallest gate insulating film thickness of all (n channel MISFET 40a and p channel MISFET 41a in this case). More specifically, the advantages can be achieved in the channel MISFET 40a and the p channel MISFET 41a by setting the impurity concentration of the impurities introduced to the channel regions 4a and 6a to be equal to or lower than $1.2 \times 10^{18}/cm^3$ in volume density in both of the n channel and the p channel, and introducing the metal elements 12a (for example, Hf) having a surface density of $1 \times 10^{13}$ to $5 \times 10^{14}$ atoms/cm² into the interfaces between the gate insulating films 14a, 14b, 15a, and 15b and the gate electrodes 23a, 23b, 24a, and 24b. On the other hand, MISFETs having relatively thick gate insulating films (n channel MISFET 40b and p channel MISFET 41b in this case) are used at a high threshold voltage $V_{th}$. Therefore, a shift amount of the threshold voltage $V_{th}$ due to the introduction of the metal elements 12a (for example, Hf) to the interfaces between the gate insulating films 14b and 15b and the gate electrodes (Si gate electrodes) is extremely small compared with MISFETs having thin gate insulating films (n channel MISFET 40a and p channel MISFET 41a in this case). Therefore, an effect of decreasing the impurity concentration of the channel is also relatively small.

Still further, in the case where the EOT of the thinnest gate insulating films 14a and 15a is 1.2 nm and the power supply voltage for the n channel MISFET 40a and the p channel MISFET 41a is 0.9 V, as described in the first embodiment, the film thickness of the silicon oxide film 11a is set to be about 1.3 nm. Then, the concentration of the impurities introduced to the channel regions 4a and 6a is preferably adjusted in a range of $2 \times 10^{17}/cm^3$ to $1.2 \times 10^{18}/cm^3$, more preferably $3 \times 10^{17}/cm^3$ to $1 \times 10^{18}/cm^3$, and still more preferably $4 \times 10^{17}/cm^3$ to $7 \times 10^{17}/cm^3$. Furthermore, by setting the surface density of the Hf atoms introduced into the interfaces between the gate insulating films 14a and 15a and the gate electrodes 23a and 24a to be $1 \times 10^{13}$ to $5 \times 10^{14}$ atoms/cm², it is possible to achieve the CMISFETs having excellent FET characteristics.

Still further, for other different design values, if the thickness of an initial silicon oxide film capable of suppressing leakage current (silicon oxide film for forming an gate insulating film) is selected, the impurity concentration of the channel region equal to or lower than $1.2 \times 10^{18}/cm^3$ capable of suppressing short channel effect is selected, and the threshold voltage $V_{th}$ is adjusted by introducing the metal elements 12a (for example, Hf) having a surface density of $1 \times 10^{13}$ to $5 \times 10^{14}$ atoms/cm² into the interface between the gate insulating film and the Si gate electrode, a FET characteristic superior to that of the conventional MISFET using a silicon oxynitride film as a gate insulating film can be achieved.

Still further, in the present embodiment, as the metal elements 12a introduced near the interfaces between the gate insulating films 14a, 14b, 15a, and 15b and the gate electrodes 23a, 23b, 24a, and 24b, similar to those in the first embodiment, metal elements such as Hf, Zr, Pt, Mo, and W for forming both of a donor level and an acceptor level in a band gap of crystal silicon (Si) can be used.

Still further, similar to the first embodiment, also in the present embodiment, if both of a donor level and an acceptor level can be formed in the band gap of the crystal silicon (Si) by combining two types or more of metal elements, such two types or more of metal elements can be introduced as the metal elements 12a near the interfaces between the gate insulating films 14a, 14b, 15a, and 15b and the gate electrodes 23a, 23b, 24a, and 24b. Also in this case, effects approximately similar to those in the case of the introduction of Hf as described above can be achieved. That is, the metal elements 12a include both of first metal elements capable of forming a donor level in the band gap of the crystal silicon (Si) and second metal elements capable of forming an acceptor level in the band gap of the crystal silicon (Si), and these first and second metal elements can be introduced as the metal elements 12a near the interfaces between the gate insulating films 14a, 14b, 15a, and 15b and the gate electrodes 23a, 23b, 24a, and 24b. For example, if the combination of Ti (titanium) and Al (aluminum), a combination of Ta (tantalum) and Al (aluminum), or a combination of Ti (titanium) and Ni (nickel) is used as the metal elements 12a, a flat band voltage shift approximately similar to that of Hf as described above can be obtained.

As described above, in the present embodiment, by using not only Hf but also other metal elements as described above as the metal elements 12a introduced near the interface between the gate insulating film and the gate electrode in a manner similar to that described above, effects similar to those described above can be achieved.

Also, in the present embodiment, the semiconductor device having gate insulating films with two different types of thickness and the manufacturing method of such a semiconductor device have been described. A semiconductor device having gate insulating films with three or more different types of thickness can be manufactured through the process approximately similar to that of the present embodiment.

(Third Embodiment)

In the present embodiment, a manufacturing method of a semiconductor device will be described, in which two types of CMISFETs having approximately equal gate insulating film thickness and different threshold voltages are formed on the same semiconductor substrate 1, and the threshold voltages are adjusted based on the amount of metal introduced into the interfaces between gate insulating films and Si gate electrodes. Note that the case where a total of three types of CMISFETs 61, 62, and 63, that is, the CMISFETs 61 and 62 in which a thickness of the gate insulating film is 1.8 nm, a power supply voltage is 1.2 V, and their absolute values of the threshold voltages are adjusted to 0.25 V and 0.5 V respectively, and the CMISFET 63 in which a gate insulating film thickness is 7.0 nm and a power supply voltage is 3.3 V are simultaneously formed will be described here as an example.

FIG. 23 to FIG. 29 are cross-sectional views of main parts during a manufacturing process of a semiconductor device according to the present embodiment.

Figure 23:
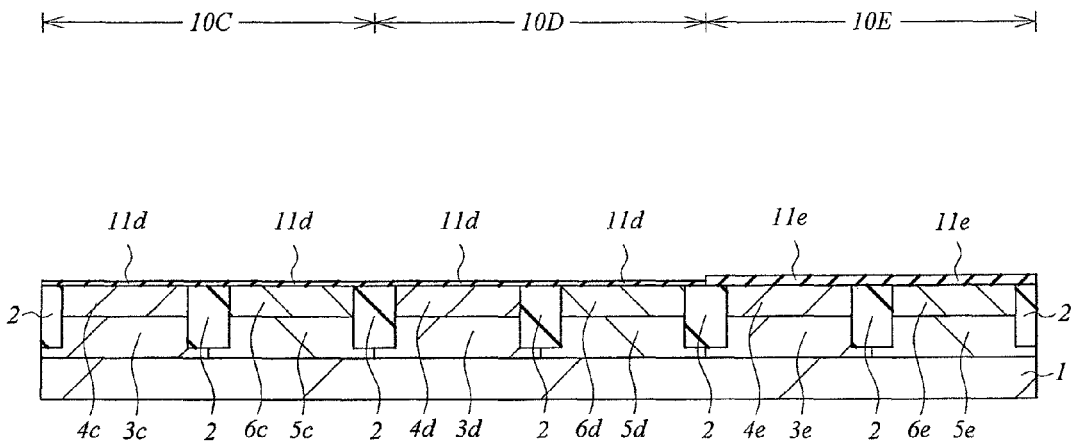
FIG. 23 is a cross-sectional view of main parts during a manufacturing process of a semiconductor device according to still another embodiment of the present invention.

As shown in FIG. 23, a semiconductor substrate (semiconductor wafer or single-crystal silicon substrate) 1 where the semiconductor device according to the present embodiment is formed has a region 10C where the above-mentioned CMISFET 61 is formed, a region 10D where the above-mentioned CMISFET 62 is formed, and a region 10E where the above-mentioned CMISFET 63 is formed.

Then, similar to the first embodiment, element isolation regions 2 for defining active regions are formed on the main surface of the semiconductor substrate 1.

Next, by repeating photolithography and ion implantation, three types of p type wells 3c, 3d, and 3e, and three types of n type wells 5c, 5d, and 5e are formed on the semiconductor substrate 1. Note that the p type well 3c and the n type well 5c are formed in the region 10C where the CMISFET 61 having a threshold voltage of 0.25 V and the gate insulating film thickness of 1.8 nm is formed. Also, the p type well 3d and the n type well 5d are formed in the region 10D where the CMISFET 62 having a threshold voltage of 0.5 V and the gate insulating film thickness of 1.8 nm is formed. Further, the p type well 3e and the n type well 5e are formed in the region 10E where the CMISFET 63 having the gate insulating film thickness of 7 nm is formed.

Next, for example, through the ion implantation of p type impurities (for example, boron (B)) for adjusting the threshold voltage of the n channel MISFETs to each of the p type wells 3c, 3d, and 3e, three types of channel regions (p type semiconductor regions) 4c, 4d, and 4e whose impurity concentration is adjusted are formed on (the surface portions of) the p type wells 3c, 3d, and 3e, respectively. Also, for example, through the ion implantation of n type impurities (for example, phosphorus (P)) for adjusting the threshold voltage of the p channel MISFET to each of the n type wells 5c, 5d, and 5e, three types of channel regions (n type semiconductor regions) 6c, 6d, and 6e whose impurity concentration is adjusted are formed on (the surface portions of) the n type wells 5c, 5d, and 5e, respectively. In the present embodiment, as described later, a minute amount of metal elements 12a are deposited on a silicon oxide film formed on the channel regions 4d, 4e, 6d, and 6e. Therefore, the impurity concentration of these channel regions 4d, 4e, 6d, and 6e is adjusted to be equal to or lower than $1.2 \times 10^{18}/cm^3$ so that a desired threshold voltage can be obtained after completion. It is also possible to perform the threshold voltage adjustment immediately before forming a gate insulating film again on the channel regions 4c and 6c as described below.

Next, after removing a native oxide film on the surface of the semiconductor substrate 1 through the cleaning using dilute hydrofluoric acid, a silicon oxide film 11e is formed on the main surface of the semiconductor substrate 1 by oxidizing (thermally oxidizing) the main surface of the semiconductor substrate 1. The silicon oxide film 11e can have a film thickness of about 5 nm.

Next, a photoresist film (not shown) is formed only on the region 10E through photolithography, and the silicon oxide film 11e is etched with using this photoresist film as an etching mask. By doing so, the silicon oxide film 11e on the p type well 3c and the n type well 5c in the region 10C and the p type well 3d and the n type well 5d in the region 10D is removed, and the silicon oxide film lie on the p type well 3e and the n type well 5e in the region 10E is left.

Next, after removing a native oxide film on the surface of the semiconductor substrate 1 through the cleaning using dilute hydrofluoric acid, a silicon oxide film is formed by oxidizing (thermally oxidizing) the main surface of the semiconductor substrate 1. The oxidization is performed under the conditions capable of forming a silicon oxide film of about 1.8 nm on the semiconductor substrate 1. Consequently, a silicon oxide film lid having a film thickness of about 1.8 nm is formed on the p type well 3c and the n type well 5c in the region 10C and the p type well 3d and the n type well 5d in the region 10D, and the thickness of the silicon oxide film 11e on the p type well 3e and the n type well 5e in the region 10E is increased to, for example, about 7.0 nm. That is, in the present embodiment, the thickness of the silicon oxide film 11e is larger than the thickness of the silicon oxide film 11d. In this manner, the structure of FIG. 23 is obtained.

Figure 24:
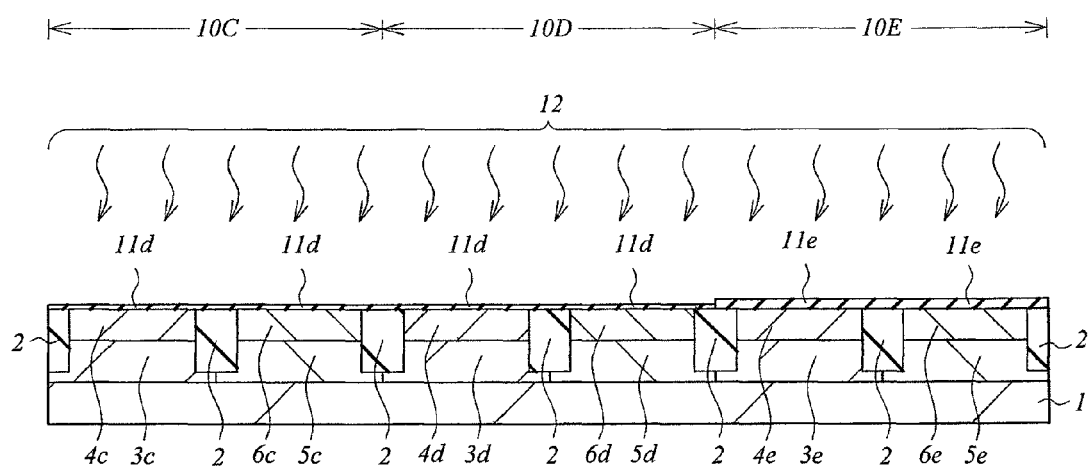
FIG. 24 is a cross-sectional view of the main parts, continued from FIG. 23, during the manufacturing process of a semiconductor device.

Next, as shown in FIG. 24, a metal element deposition process 12 is performed in the same manner as step S2 in the first embodiment to deposit a minute amount of metal elements (metal atoms) 12a on the silicon oxide films 11d and 11e. The surface density and others of the metal elements 12a deposited on the silicon oxide films 11d and 11e in the metal element deposition process 12 are similar to those in the first embodiment. That is, also in the present embodiment, the surface density of the metal elements 12a deposited on the silicon oxide films 11d and 11e is within a range of $1 \times 10^{13}$ to $5 \times 10^{14}$ atoms/$cm^2$.

Figure 25:
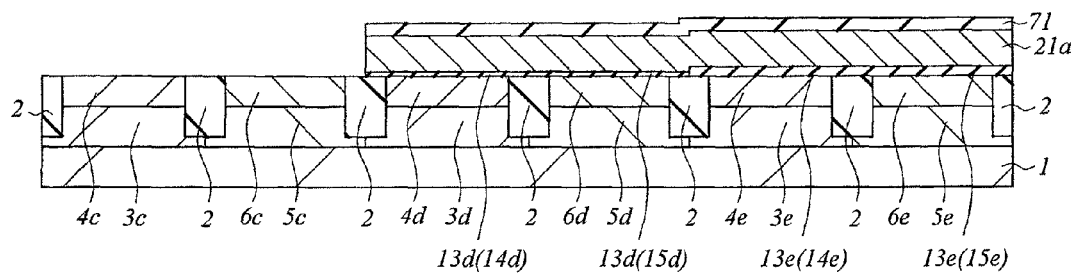
FIG. 25 is a cross-sectional view of the main parts, continued from FIG. 24, during the manufacturing process of a semiconductor device.

Next, similar to the first embodiment, through plasma nitriding process, heat treatment in an ammonia atmosphere, and the like, nitrogen is introduced to the silicon oxide films 11d and 11e. By doing so, as shown in FIG. 25, nitrogen is introduced into the silicon oxide film 11d and it becomes a silicon oxynitride film 13d, and nitrogen is introduced to the silicon oxide film lie and it becomes a silicon oxynitride film 13e. Then, excessive nitrogen of the silicon oxynitride films 13d and 13e can be vaporized by performing a heat treatment at a relatively high temperature in oxygen dilution according to need.

In this manner, gate insulating films 14d, 14e, 15d, and 15e composed of the silicon oxynitride films 13d and 13e each having a minute amount of the metal elements 12a deposited on its upper surface (upper portion) are formed. Of these, the gate insulating film 14d is composed of the silicon oxynitride film 13d having a minute amount of the metal elements 12a deposited on its upper surface and is formed on the p type well 3d in the region 10D. Also, the gate insulating film 15d is composed of the silicon oxynitride film 13d having a minute amount of the metal elements 12a deposited on its upper surface and is formed on the n type well 5d in the region 10D. Further, the gate insulating film 14e is composed of the silicon oxynitride film 13e having a minute amount of the metal elements 12a deposited on its upper surface and is formed on the p type well 3e in the region 10E. Furthermore, the gate insulating film 15e is composed of the silicon oxynitride film 13e having a minute amount of the metal elements 12a deposited on its upper surface and is formed on the n type well 5e in the region 10E. The silicon oxynitride film 13d in the region 100 is removed later. The EOT of the gate insulating films 14d and 15d and the EOT of the gate insulating films 14e and 15e having a minute amount of the metal elements 12a (for example, Hf) deposited thereon and having nitrogen introduced thereto are 1.9 nm and 7.1 nm, respectively, which are approximately equal to the thickness of the initial silicon oxide films 11d and 11e. As described above, since the thickness of the silicon oxide film 11e is larger than the thickness of the silicon oxide film 11d, the thickness of the gate insulating films 14e and 15e is larger than the thickness of the gate insulating films 14d and 15d.

Next, a silicon film 21a as a conductive film for forming gate electrodes is formed on the main surface of the semiconductor substrate 1, that is, on the gate insulating films 14d, 14e, 15d, and 15e, and an insulating film 71 is then formed on the silicon film 21a. The silicon film 21a is made of a material similar to that of the silicon film 21 described above (for example, polycrystalline silicon film) and can be formed in the approximately same manner as that of the silicon film 21 described above. The deposition thickness of the silicon film 21a can be, for example, about 100 nm. The insulating film 71 is composed of, for example, a silicon nitride film.

Next, after protecting regions other than the region 10C (that is, the p type well 3c and the n type well 5c) with a resist mask (photoresist layer, not shown), the insulating film 71, the silicon film 21a, and the silicon oxynitride film 13d in the region 10C (that is, the p type well 3c and the n type well 5c) are removed through reactive ion etching and cleaning process. In this manner, the semiconductor substrate 1 in the region 10C (the p type well 3c and the n type well 5c) is opened (exposed).

Figure 26:
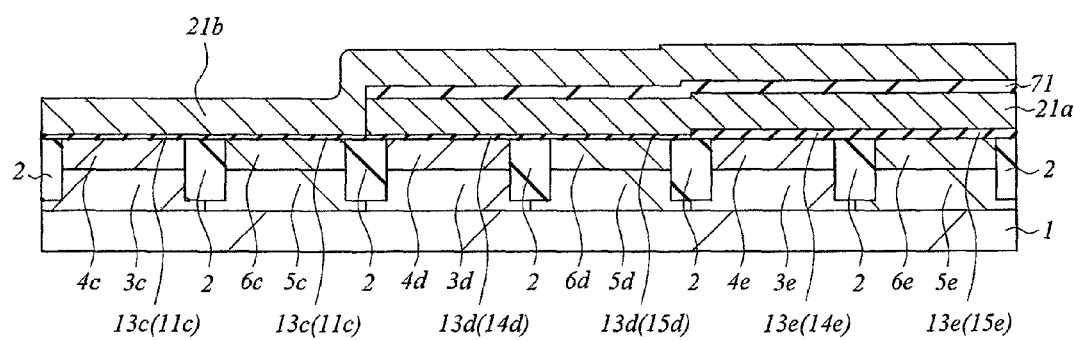
FIG. 26 is a cross-sectional view of the main parts, continued from FIG. 25, during the manufacturing process of a semiconductor device.

Next, after removing a native oxide film on the surface of the semiconductor substrate 1 in the region 10C through, for example, cleaning using dilute hydrofluoric acid, a silicon oxide film 11c having a thickness of about 1.8 nm is formed on the p type well 3c and the n type well 5c in the region 100 by oxidizing (thermally oxidizing) the main surface of the semiconductor substrate 1 as shown in FIG. 26. Note that, as described above, by performing the ion implantation for adjusting the threshold voltage to the p type well 3c and the n type well 5c in the region 10C before forming the silicon oxide film 11c, the channel regions 4c and 6c whose impurity concentration is adjusted can be formed. In this case, it is necessary to adjust the impurity concentration so that the absolute value of the threshold voltage of the MISFET in the region 10C after completion is 0.25 V.

Next, through a plasma nitriding process, a heat treatment in an ammonia atmosphere, and others, nitrogen is introduced to the silicon oxide film 11c. By doing so, nitrogen is introduced to the silicon oxide film 11c and it becomes a silicon oxynitride film 13c. Thereafter, excessive nitrogen of the silicon oxynitride film 13c can be vaporized by performing a heat treatment at a relatively high temperature in oxygen dilution according to need.

In this manner, a gate insulating film 14c composed of the silicon oxynitride film 13c is formed on the p type well 3c in the region 10C, and a gate insulating film 15c composed of the silicon oxynitride film 13c is formed on the n type well 5c in the region 10C. The EOT of the gate insulating films 14c and 15c is 1.8 nm.

Next, a silicon film 21b is formed on the semiconductor substrate 1 as a conductive film for forming gate electrodes. The silicon film 21b is made of a material similar to that of the silicon films 21 and 21a described above (for example, polycrystalline silicon film), and can be formed in the approximately same manner as that of the silicon films 21 and 21a described above. The deposition thickness of the silicon film 21b can be, for example, about 100 nm.

Figure 27:
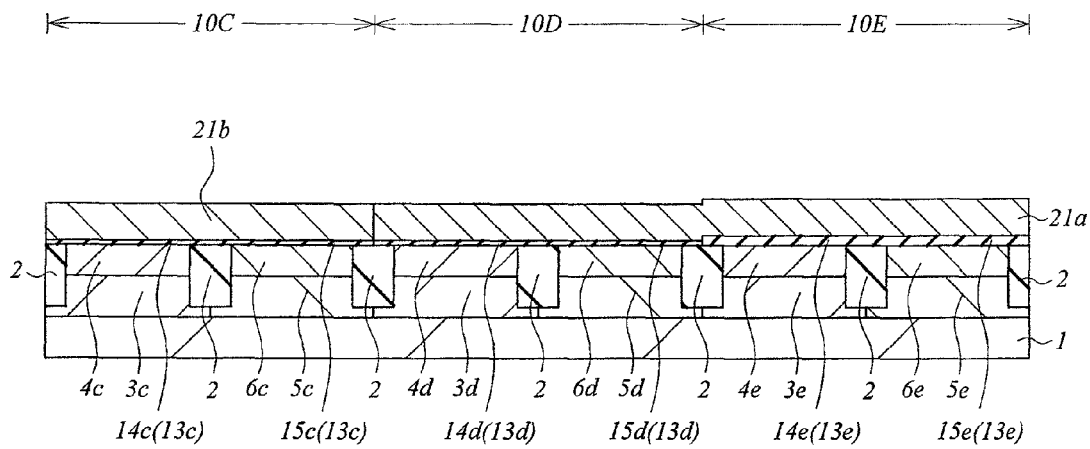
FIG. 27 is a cross-sectional view of the main parts, continued from FIG. 26, during the manufacturing process of a semiconductor device.

Next, as shown in FIG. 27, the silicon film 21b is subjected to dry etching with using a photoresist layer (not shown) formed on the silicon film 21b through photolithography as an etching mask. By doing so, the silicon film 21b in the region other than the region 10C is removed, thereby leaving the silicon film 21b in the region 10C. After removing the photoresist layer, the insulating film 71 is removed through reactive dry etching or a cleaning process.

Figure 28:
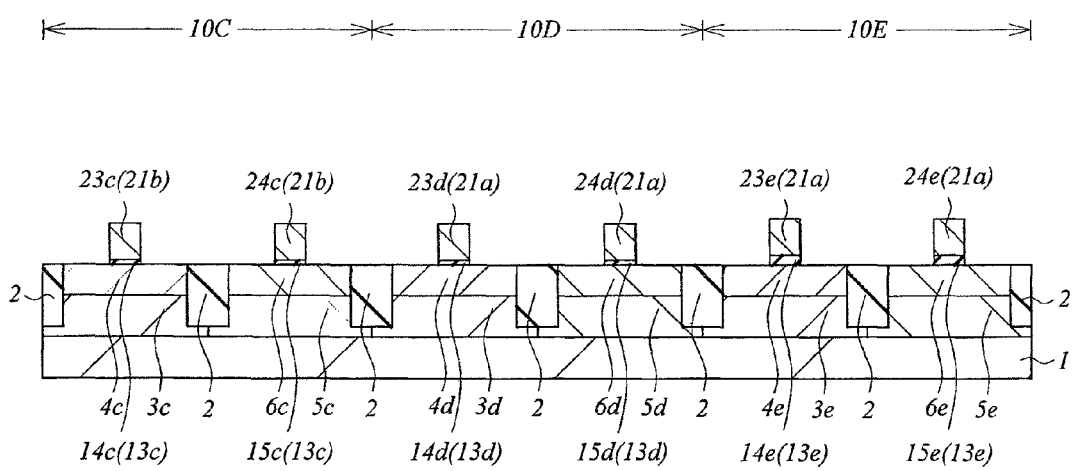
FIG. 28 is a cross-sectional view of the main parts, continued from FIG. 27, during the manufacturing process of a semiconductor device.

Next, as shown in FIG. 28, the silicon films 21a and 21b are patterned through photolithography, dry etching and others (for example, Reactive Ion Etching). Gate electrodes 23c, 23d, 23e, 24c, 24d, and 24e are formed from the patterned silicon films 21a and 21b. That is, in the region 10C, the gate electrode 23c is formed of the silicon film 21b on the gate insulating film 14c on the surface of the p type well 3c, and the gate electrode 24c is formed of the silicon film 21b on the gate insulating film 15c on the surface of the n type well 5c. Also, in the region 10D, the gate electrode 23d is formed of the silicon film 21a on the gate insulating film 14d on the surface of the p type well 3d, and the gate electrode 24d is formed of the silicon film 21a on the gate insulating film 15d on the surface of the n type well 5d. Further, in the region 10E, the gate electrode 23e is formed of the silicon film 21a on the gate insulating film 14e on the surface of the p type well 3e, and the gate electrode 24e is formed of the silicon film 21a on the gate insulating film 15e on the surface of the n type well 5e.

The process thereafter is approximately similar to that in the first and second embodiments. That is, similar to the first embodiment, through ion implantation of n type impurities into the regions on both sides of the gate electrodes 23c, 23d, and 23e on the p type wells 3c, 3d, and 3e, relatively shallow n type semiconductor regions (n type impurity diffusion layers) 25c, 25d, and 25e are formed. Then, for example, through ion implantation of p type impurities, p type semiconductor regions (not shown) for preventing punch-through are formed. Similarly, through ion implantation of p type impurities into the regions on both sides of the gate electrodes 24c, 24d, and 24e on the n type wells 5c, 5d, and 5e, relatively shallow p$^-$ type semiconductor regions (p type impurity diffusion layers) 27c, 27d, and 27e are formed. Then, for example, through ion implantation of n type impurities, n type semiconductor regions (not shown) for preventing punch-through are formed.

Next, similar to the first embodiment, the sidewalls are formed on the sidewalls of each of the gate electrodes 23c, 23d, 23e, 24c, 24d, and 24e.

Next, similar to the first embodiment, n type impurities are ion-implanted into the p type wells 3c, 3d, and 3e in the regions 10C, 10D, and 10E with using the sidewalls 30 as ion implantation blocking masks, thereby forming n$^+$ type semiconductor regions 31c, 31d, and 31e (source and drain) in the regions on both sides of each of the gate electrodes 23c, 23d, and 23e and the sidewalls 30 on the p type wells 3c, 3d, and 3e. At the time of this ion implantation, n type impurities are also ion-implanted into the gate electrodes 23c, 23d, and 23e. As a result, the gate electrodes 23c, 23d, and 23e become low-resistance n-conductive semiconductor films (silicon films) having n type impurities introduced thereto. Similarly, p type impurities are ion-implanted into the n type wells 5c, 5d, and 5e in the regions 10C, 10D, and 10E with using the sidewalls 30 as ion implantation blocking masks, thereby forming p$^+$ type semiconductor regions 32c, 32d, and 32e (source and drain) in the regions on both sides of each of the gate electrodes 24c, 24d, and 24e and the sidewalls 30 on the n type wells 5c, 5d, and 5e. At the time of this ion implantation, p type impurities are also ion-implanted into the gate electrodes 24c, 24d, and 24e. As a result, the gate electrodes 24c, 24d, and 24e become low-resistance p-conductive semiconductor films (silicon films) having p type impurities introduced thereto.

After the ion implantation, similar to the first embodiment, an annealing process for activating the introduced impurities is performed.

The n$^+$ type semiconductor regions 31c have an impurity concentration higher than that of the n$^-$ type semiconductor regions 25c, and the p$^+$ type semiconductor regions 32c have an impurity concentration higher than that of the p$^-$ type semiconductor regions 27c. Also, the n$^+$ type semiconductor regions 31d have an impurity concentration higher than that of the n$^-$ type semiconductor regions 25d, and the p$^+$ type semiconductor regions 32d have an impurity concentration higher than that of the p$^-$ type semiconductor regions 27d. Still further, the n$^+$ type semiconductor regions 31e have an impurity concentration higher than that of the n$^-$ type semiconductor regions 25e, and the p$^+$ type semiconductor regions 32e have an impurity concentration higher than that of the p$^-$ type semiconductor regions 27e. Therefore, in the region 100, n type semiconductor regions (impurity diffusion layers) serving as source and drain of the n channel MISFET are formed from the n$^+$ type semiconductor regions 31c and the n$^-$ type semiconductor regions 25c, and p type semiconductor regions (impurity diffusion layers) serving as source and drain of the p channel MISFET are formed from the p$^+$ type semiconductor regions 32c and the p$^-$ type semiconductor regions 27c. Also, in the region 10D, n type semiconductor regions (impurity diffusion layers) serving as source and drain of the n channel MISFET are formed from the n$^+$ type semiconductor regions 31d and the n$^-$ type semiconductor regions 25d, and p type semiconductor regions (impurity diffusion layers) serving as source and drain of the p channel MISFET are formed from the p$^+$ type semiconductor regions 32d and the p$^-$ type semiconductor regions 27d. Furthermore, in the region 10E, n type semiconductor regions (impurity diffusion layers) serving as source and drain of the n channel MISFET are formed from the n$^+$ type semiconductor regions 31e and the n$^-$ type semiconductor regions 25e, and p type semiconductor regions (impurity diffusion layer) serving as source and drain of the p channel MISFET are formed from the p$^+$ type semiconductor regions 32e and the p$^-$ type semiconductor regions 27e.

Next, similar to the first embodiment, metal silicide layers 33 are formed on each surface of the gate electrodes 23c, 23d, 23e, 24c, 24d, and 24e, the n$^+$ type semiconductor regions 31c, 31d, and 31e, and the p$^+$ type semiconductor regions 32c, 32d, and 32e.

In this manner, in the region 10C, an n channel MISFET 40c is formed on the p type well 3c and a p channel MISFET 41c is formed on the n type well 5c, thereby forming the CMISFET 61. Also, in the region 10D, an n channel MISFET 40d is formed on the p type well 3d and a p channel MISFET 41d is formed on the n type well 5d, thereby forming the CMISFET 62. Furthermore, in the region 10E, an n channel MISFET 40e is formed on the p type well 3e and a p channel MISFET 41e is formed on the n type well 5e, thereby forming the CMISFET 63.

Figure 29:
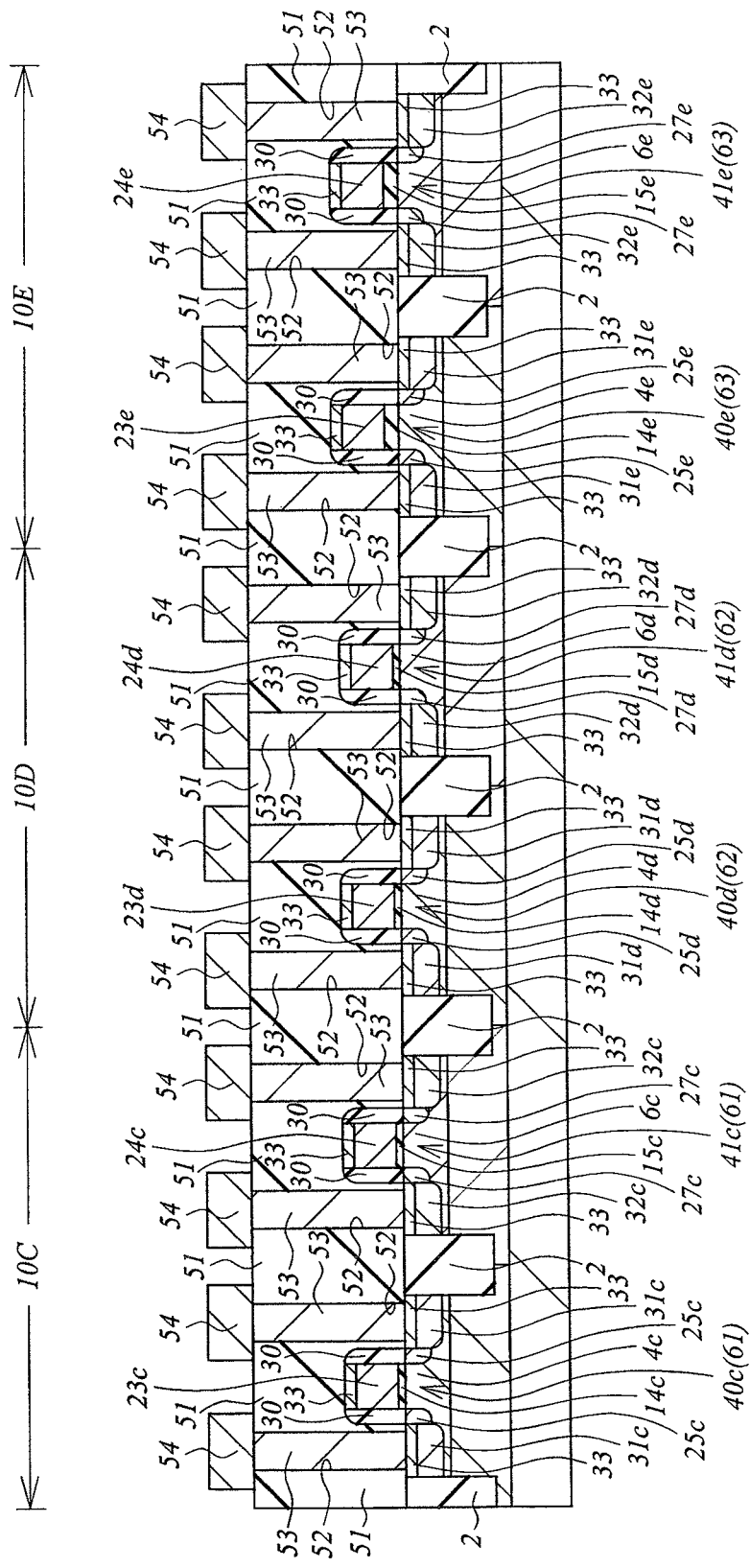
FIG. 29 is a cross-sectional view of the main parts, continued from FIG. 28, during the manufacturing process of a semiconductor device.

Next, similar to the first embodiment, an insulating film 51 is formed on the semiconductor substrate 1 so as to cover the gate electrodes 23c, 23d, 23e, 24c, 24d, and 24e, contact holes 52 are formed in the insulating film 51, plugs 53 are formed in the contact holes 52, and wirings 54 are formed on the insulating film 51 in which the plugs 53 are embedded. The wirings 54 are electrically connected via the plugs 53 to, for example, the n$^+$ type semiconductor regions 31c, 31d, and 31e, the p$^+$ type semiconductor regions 32c, 32d, and 32e, and the gate electrodes 23c, 23d, 23e, 24c, 24d, and 24e. In this manner, the structure of FIG. 29 is obtained. Then, upper layers such as interlayer insulating films, wiring layers, and others are further formed to obtain a multilayered wiring structure. However, the illustration and the description thereof are omitted here.

Similar to the first embodiment, also in the semiconductor device according to the present embodiment, in the n channel MISFET 40d constituting the CMISFET 62 formed in the region 10D, the gate electrode 23d includes the silicon film 21a positioned on the gate insulating film 14d, the gate insulating film 14d is composed of the silicon oxynitride film 13d, and the metal elements 12a (for example, Hf) are introduced near the interface between the gate electrode 23d and the gate insulating film 14d. Also, in the p channel MISFET 41d constituting the CMISFET 62, the gate electrode 24d includes the silicon film 21a positioned on the gate insulating film 15d, the gate insulating film 15d is composed of the silicon oxynitride film 13d, and the metal elements 12a (for example, Hf) are introduced near the interface between the gate electrode 24d and the gate insulating film 15d.

Furthermore, in the n channel MISFET 40e constituting the CMISFET 63 formed in the region 10E, the gate electrode 23e includes the silicon film 21a positioned on the gate insulating film 14e, the gate insulating film 14e is composed of the silicon oxynitride film 13e, and the metal elements 12a (for example, Hf) are introduced near the interface between the gate electrode 23e and the gate insulating film 14e. Still further, in the p channel MISFET 41e constituting the CMISFET 63, the gate electrode 24e includes the silicon film 21a positioned on the gate insulating film 15e, the gate insulating film 15e is composed of the silicon oxynitride film 13e, and the metal elements 12a (for example, Hf) are introduced near the interface between the gate electrode 24e and the gate insulating film 15e.

On the other hand, in the n channel MISFET 40c constituting the CMISFET 61 formed in the region 10C, the gate electrode 23c includes the silicon film 21b positioned on the gate insulating film 14c, the gate insulating film 14c is composed of the silicon oxynitride film 13c, but the metal elements 12a (for example, Hf) are not introduced near the interface between the gate electrode 23c and the gate insulating film 14c. Further, in the p channel MISFET 41c constituting the CMISFET 61, the gate electrode 24c includes the silicon film 21b positioned on the gate insulating film 15c, the gate insulating film 15c is composed of the silicon oxynitride film 13c, but the metal elements 12a (for example, Hf) are not introduced near the interface between the gate electrode 24c and the gate insulating film 15c.

Therefore, although the thickness of the gate insulating films of the CMISFET 61 in the region 100 is approximately equal to the film thickness of the gate insulating films of the CMISFET 62 in the region 10D, the metal elements 12a are introduced only to the interface between the gate electrode and the gate insulating film of the CMISFET 62 in the region 10D. Therefore, the absolute value of the threshold voltage of the MISFETs 40d and 41d of the CMISFET 62 in the region 10D can be made larger than the absolute value of the threshold voltage of the MISFETs 40c and 41c of the CMISFET 61 in the region 100.

In this manner, three types of CMISFETs, that is, two types of CMISFETs 61 and 62 having an approximately equal gate insulating film thickness and different threshold voltages and the CMISFET 63 having a different gate insulating film thickness can be formed on the same semiconductor substrate 1.

In particular, a FET characteristic of the CMISFET 62 having a thickness of the gate insulating films 14d and 15d of 1.8 nm and a high threshold voltage can be improved compared with the case of using the conventional SiON gate insulating film. This is because, since the threshold voltage can be adjusted (the absolute value of the threshold voltage can be increased) by introducing the metal elements 12a having a surface density of $1\times10^{13}$ to $5\times10^{14}$ atoms/cm² near the interface between the gate insulating films 13d and 14d and the gate electrodes 23d and 24d (Si gate electrodes), the impurity concentration of the channel regions 4d and 6d can be correspondingly decreased.

Also, in the present embodiment, the method in which two types of threshold voltage are adjusted by using the gate insulating film with EOT=1.8 nm in the CMISFETs 61 and has been described. Also for other different design values, if the thickness of an initial silicon oxide film capable of suppressing a leakage current (a silicon oxide film for forming an gate insulating film) is selected, the impurity concentration of the channel region equal to or lower than $1.2\times10^{18}/cm^3$ capable of suppressing a short channel effect is selected, and the threshold voltage is adjusted by introducing the metal elements 12a having a surface density of $1\times10^{13}$ to $5\times10^{14}$ atoms/cm² to the interface between the gate insulating film and the Si gate electrode, a FET characteristic superior to that of the conventional MISFET using a silicon oxynitride film as a gate insulating film can be achieved.

Still further, in the present embodiment, as the metal elements 12a introduced near the interface between the gate insulating film and the gate electrode, similar to those in the first embodiment, metal elements such as Hf, Zr, Pt, Mo, and W for forming both of a donor level and an acceptor level in a band gap of crystal silicon (Si) can be used.

Still further, similar to the first embodiment, also in the present embodiment, if both of a donor level and an acceptor level can be formed in the band gap of the crystal silicon (Si) by combining two types or more of metal elements, such two types or more of metal elements can be introduced as the metal elements 12a near the interface between the gate insulating film and the gate electrode. Also in this case, effects approximately similar to those in the case of the introduction of Hf as described above can be achieved. In other words, the metal elements 12a include both of first metal elements capable of forming a donor level in the band gap of the crystal silicon (Si) and second metal elements capable of forming an acceptor level in the band gap of the crystal silicon (Si), and these first and second metal elements can be introduced as the metal elements 12a near the interface between the gate insulating film and the gate electrode. For example, if the combination of Ti (titanium) and Al (aluminum), a combination of Ta (tantalum) and Al (aluminum), or a combination of Ti (titanium) and Ni (nickel) is used as the metal elements 12a, a flat band voltage shift approximately similar to that of Hf as described above can be obtained.

As described above, in the present embodiment, by using not only Hf but also other metal elements as described above as the metal elements 12a introduced near the interface between the gate insulating film and the gate electrode in a manner similar to that described above, effects similar to those described above can be achieved.

Also, in the semiconductor device according to the present embodiment, the metal elements 12a are introduced near the interface between the gate electrode and the gate insulating film in only the CMISFET 62 of the two types of CMISFETs 61 and 62 having an approximately equal gate insulating film thickness. In the other CMISFET 61, no metal element 12a is introduced near the interface between the gate electrode and the gate insulating film. Therefore, since the threshold voltage of the CMISFET 62 can be controlled, in the two types of CMISFETs 61 and 62 having an approximately equal gate insulating film thickness, the absolute value of the threshold voltage of the MISFETs 40d and 41d of the CMISFET 62 can be made larger than the absolute value of the threshold voltage of the MISFETs 40c and 41c of the CMISFET 61.

In another embodiment, the metal elements 12a are introduced near the interface between the gate electrodes and the gate insulating films in both of the two types of CMISFETs 61 and 62 having an approximately equal gate insulating film thickness, but the surface density of the metal elements 12a in the CMISFET 61 is set lower than the surface density of the metal elements 12a in the other CMISFET 62. More specifically, the metal elements 12a are introduced near the interface between the gate electrodes 23c and 24c and the gate insulating films 14c and 15c in the CMISFET 61 with a surface density lower than the surface density of the metal elements 12a near the interface between the gate electrodes 23d and 24d and the gate insulating films 14d and 15d in the CMISFET 62. Such a state can be achieved by, for example, forming the silicon oxide film 11c in the region 10C, then depositing the metal elements 12a on the silicon oxide film 11c, nitriding the silicon oxide film 11c to form the silicon oxynitride film 13c, and then forming the silicon film 21 on the silicon oxynitride film 13c. At this time, the surface density of the metal elements 12a deposited on the silicon oxide film 11c is set lower than the surface density of the metal elements 12a deposited on the silicon oxide films 1id and 11e. Consequently, the metal elements 12a can be introduced near the interface between the gate electrodes 23c and 24c and the gate insulating films 14c and 15c in the CMISFET 61 with a surface density lower than that in the CMISFET 62.

Also, in the present embodiment, the process of forming three types of CMISFETs, that is, two types of CMISFETs 61 and 62 having an approximately equal gate insulating film thickness and one CMISFET 63 having a different gate insulating film thickness on the same semiconductor substrate has been described. Alternatively, for example, three or more types of CMISFETs having an approximately equal gate insulating film thickness and different threshold voltages or CMISFETs having three or more gate insulating film thicknesses can be formed through the same process.

(Fourth Embodiment)

In the first to third embodiments, the metal elements 12a (for example, Hf) are introduced to the interface between the gate insulating film and the Si gate electrode by depositing the metal elements 12a as metal oxides on the silicon oxide film for forming the gate insulating film. In the present embodiment, after forming a Si gate electrode on a silicon oxide film or a silicon oxynitride film, the metal elements 12a are introduced through ion implantation, thereby introducing the metal elements 12a (for example, Hf) to the interface between the gate insulating film and the Si gate electrode.

Figure 30:
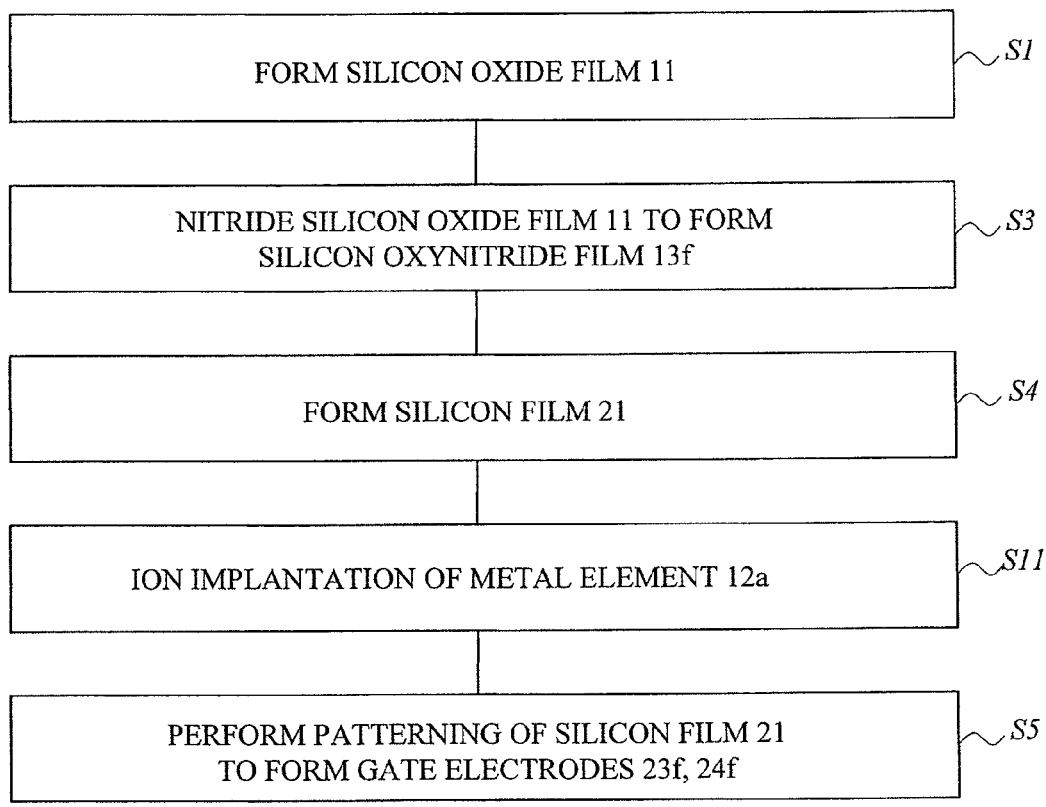
FIG. 30 is a process flowchart showing a manufacturing process of a semiconductor device according to still another embodiment of the present invention.
Figure 31:
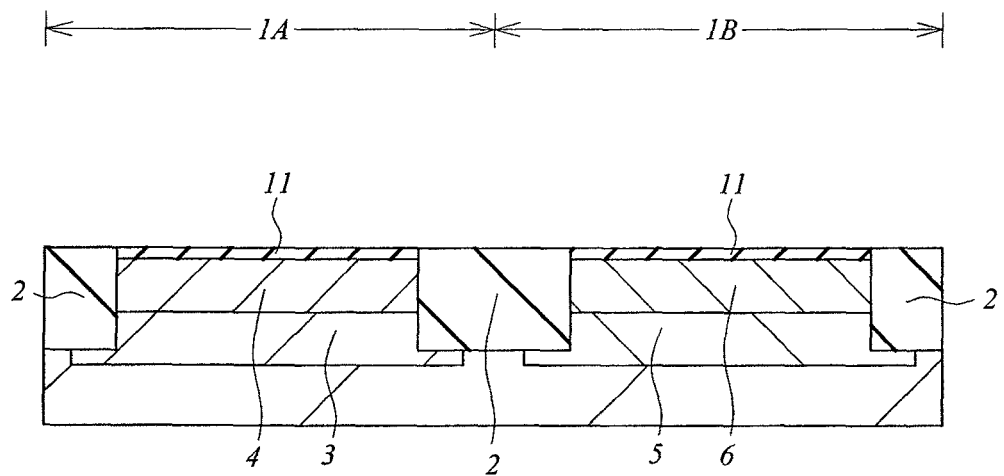
FIG. 31 is a cross-sectional view of main parts during the manufacturing process of a semiconductor device according to still another embodiment of the present invention.

FIG. 30 is a process flowchart showing a manufacturing process of a semiconductor device according to the present embodiment. FIG. 31 to FIG. 35 are cross-sectional views of main parts during the manufacturing process of a semiconductor device according to the present embodiment. Note that FIG. 31 corresponds to FIG. 1 in the first embodiment, and a process from a step of forming an insulating film (silicon oxide film 11) to a step of forming gate electrodes 23f and 24f in the semiconductor device manufacturing process is shown in FIG. 30. Also, since the process up to FIG. 2 in the first embodiment is similarly applied to the present embodiment, these processes are not described herein and processes subsequent thereto will be described below.

After the structure of FIG. 2 is obtained in the same manner as that in the first embodiment, similar to the first embodiment, a silicon oxide film 11 is formed on the main surface of the semiconductor substrate 1 (on the surface of the p type well 3 and the n type well 5) (step S1). The silicon oxide film 11 can be formed by oxidizing (thermally oxidizing) the main surface of the semiconductor substrate 1 and has a film thickness of about 1.8 nm. In the present embodiment, unlike the first embodiment, the metal elements 12a are not deposited on the silicon oxide film 11. That is, step S2 in the first embodiment is not performed.

Figure 32:
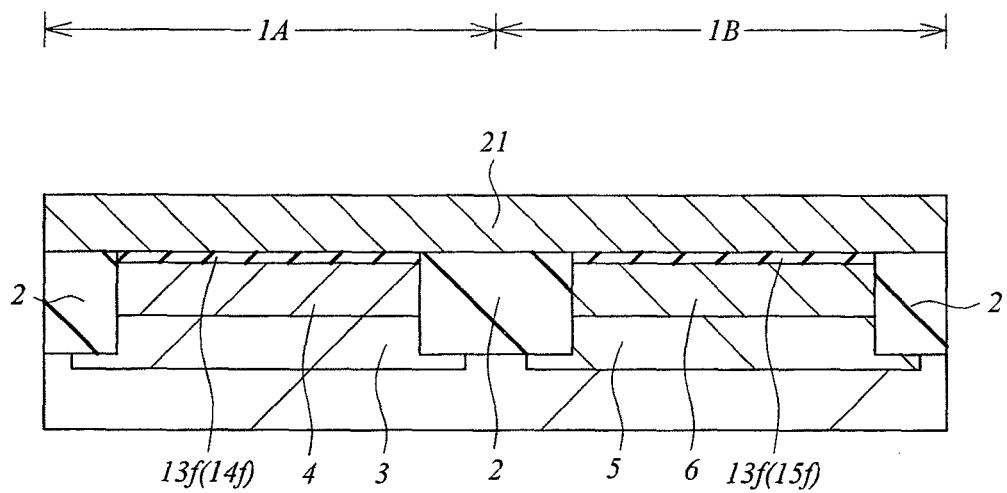
FIG. 32 is a cross-sectional view of the main parts, continued from FIG. 31, during the manufacturing process of a semiconductor device.

Next, through a plasma nitriding process, a heat treatment in an ammonia atmosphere, or the like, nitrogen is introduced to the silicon oxide film 11. By doing so, as shown in FIG. 32, nitrogen is introduced to the silicon oxide film 11 (the silicon oxide film 11 is nitrided) and it becomes a silicon oxynitride film 13f (step S3). After the introduction of nitrogen into the silicon oxide film 11, the nitrogen concentration of the silicon oxynitride film 13f can be changed (excessive nitrogen can be vaporized) by performing a heat treatment at a relatively high temperature in oxygen dilution according to need.

In this manner, gate insulating films 14f and 15f are formed from the silicon oxynitride film 13f. The gate insulating film 14f is a gate insulating film for an n channel MISFET and is formed on the p type well 3 in the n channel MISFET formation region 1A. The gate insulating film 15f is a gate insulating film for a p channel MISFET and is formed on the n type well 5 in the p channel MISFET formation region 1B.

Next, on the main surface of the semiconductor substrate 1, that is, on the gate insulating films 14f and 15f, a silicon film 21 is formed as a conductive film for forming gate electrodes (step S4). The silicon film 21 is, for example, a polycrystalline silicon film and can be formed through CVD. For example, the silicon film 21 having a thickness of about 100 nm can be deposited at a temperature of approximately 630° C. with using monosilane as a material gas.

Figure 33:
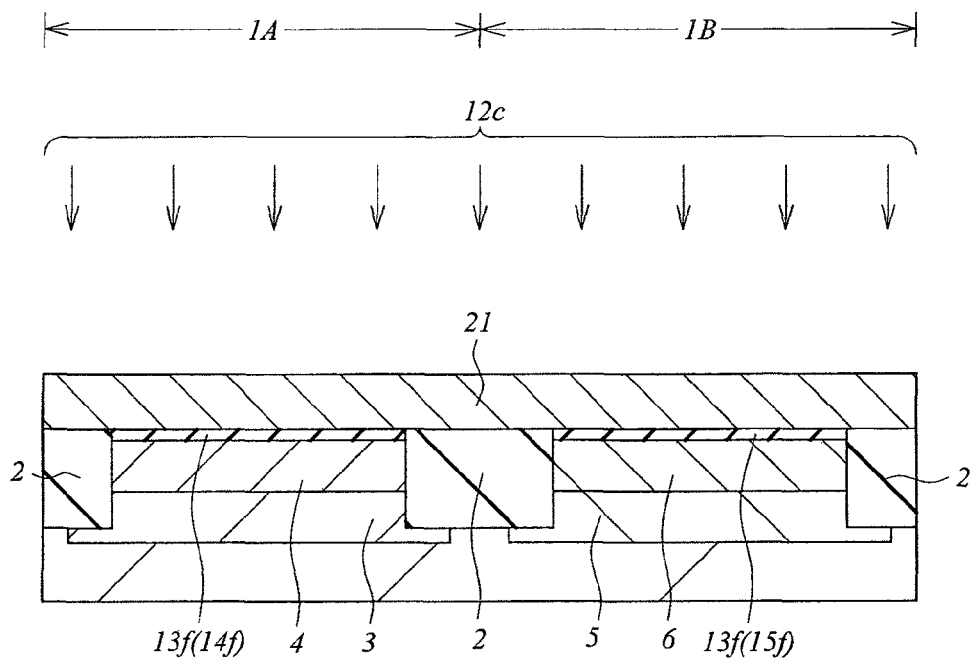
FIG. 33 is a cross-sectional view of the main parts, continued from FIG. 32, during the manufacturing process of a semiconductor device.

Next, as shown in FIG. 33, ion implantation 12c of the metal elements 12a is performed on the main surface of the semiconductor substrate 1 (step S11). For example, implantation of hafnium (Hf) ions is performed. Implantation of hafnium (Hf) ions is performed in a direction perpendicular to the main surface of the semiconductor substrate 1 under the conditions of, for example, the ion implantation energy (acceleration energy) of 50 to 100 keV and the ion implantation amount of $3\times10^{14}/cm^2$. At this time, the ion implantation energy is controlled so that distribution of the implanted hafnium (Hf) ions (that is, the metal elements 12a) has its peak (maximum concentration) near the interface between the silicon film 21 and the gate insulating films 14f and 15f. By doing so, a state where a minute amount of Hf as the metal elements 12a are restrictively (locally) introduced near the interface between the silicon film 21 and the gate insulating films 14f and 15f can be formed.

Figure 34:
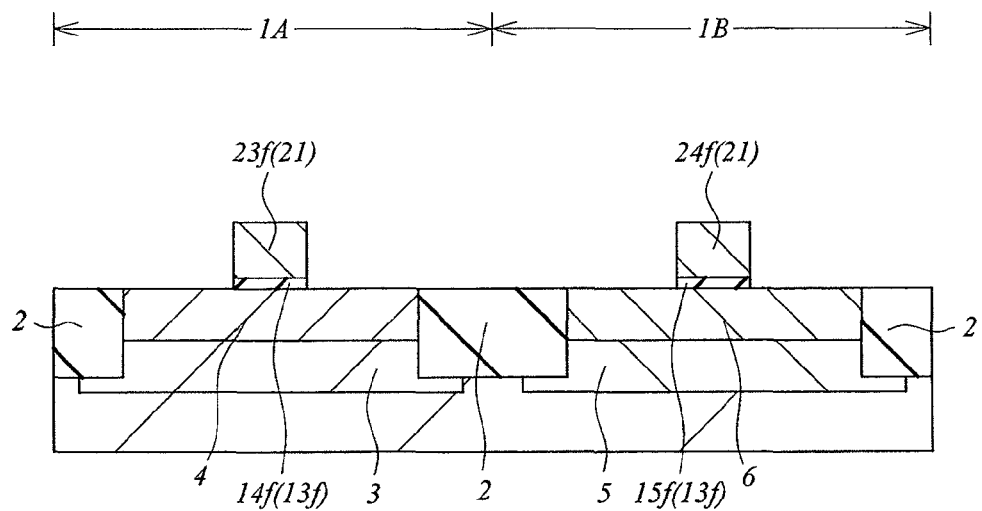
FIG. 34 is a cross-sectional view of the main parts, continued from FIG. 33, during the manufacturing process of a semiconductor device.

Next, as shown in FIG. 34, by using photolithography, dry etching (for example, Reactive Ion Etching) and others, the silicon film 21 is patterned (step S5). The gate electrodes 23f and 24f are formed from the patterned silicon film 21. That is, the gate electrode 23f for the n channel MISFET is formed from the silicon film 21 on the gate insulating film 14f on the surface of the p type well 3, and the gate electrode 24f for the p channel MISFET is formed from the silicon film 21 on the gate insulating film 15f on the surface of the n type well 5.

As described above, since the metal elements 12a (Hf in this case) are introduced near the interface between the silicon film 21 and the gate insulating films 14f and 15f through the ion implantation 12c in step S11, the metal elements 12a (Hf in this case) are introduced near the interface between the gate electrode 23f (silicon film 21) and the gate insulating film 14f and near the interface between the gate electrode 24f (silicon film 21) and the gate insulating film 15f.

The process thereafter is approximately similar to that in the first embodiment.

More specifically, similar to the first embodiment, n type semiconductor regions 25 are formed in the regions on both sides of the gate electrode 23f of the p type well 3, and p type semiconductor regions 26 for preventing punch-through are formed around the n⁻ type semiconductor regions 25. Also, similar to the first embodiment, p⁻ type semiconductor regions 27 are formed in the regions on both sides of the gate electrode 24f of the n type well 5, and n type semiconductor regions 28 for preventing punch-through are formed around the p⁻ type semiconductor regions 27.

Next, similar to the first embodiment, sidewalls 30 are formed on the sidewalls of the gate electrodes 23f and 24f.

Next, similar to the first embodiment, n⁺ type semiconductor regions 31 (source and drain) are formed in the regions on both sides of the gate electrode 23f and the sidewalls 30 of the p type well 3 through ion implantation. At the time of this ion implantation, n type impurities are also ion-implanted into the gate electrode 23f, and as a result, the gate electrode 23f becomes a low-resistance n-conductive semiconductor film (silicon film) introduced with n type impurities. Also, similar to the first embodiment, p⁺ type semiconductor regions 32 (source and drain) are formed in the regions on both sides of the gate electrode 24f and the sidewalls 30 of the n type well 5 through ion implantation. At the time of this ion implantation, p type impurities are also ion-implanted into the gate electrode 24f, and as a result, the gate electrode 24f becomes a low-resistance p-conductive semiconductor film (silicon film) introduced with p type impurities. After the ion implantation, an annealing process for activating the introduced impurities is performed.

Next, similar to the first embodiment, metal silicide layers 33 are formed on the surfaces of each of the gate electrodes 23f and 24f, the n⁺ type semiconductor regions 31, and the p⁺ type semiconductor regions 32.

In this manner, an n channel MISFET 40f is formed on the p type well 3 in the n channel MISFET formation region 1A, and a p channel MISFET 41f is formed on the n type well in the p channel MISFET formation region 1B, thereby forming a CMISFET.

Figure 35:
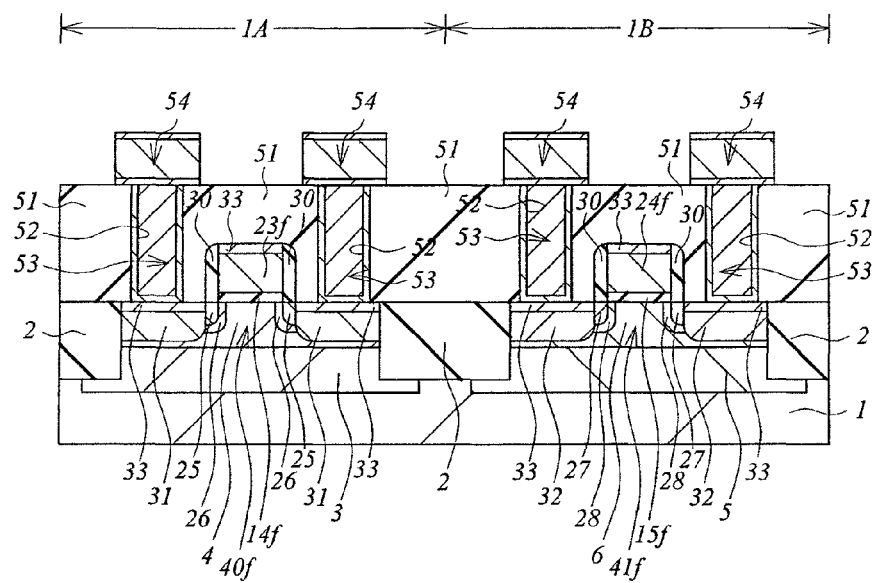
FIG. 35 is a cross-sectional view of the main parts, continued from FIG. 34, during the manufacturing process of a semiconductor device.

Next, similar to the first embodiment, an insulating film 51 is formed on the semiconductor substrate 1 so as to cover the gate electrodes 23f and 24f, contact holes 52 are formed in the insulating film 51, plugs 53 are formed in the contact holes 52, and wirings 54 are formed on the insulating film 51 in which the plugs 53 are embedded. The wirings 54 are electrically connected via the plugs 53 to the n⁺ type semiconductor regions 31, the p⁺ type semiconductor regions 32, and the gate electrodes 23f and 24f. In this manner, the structure of FIG. 35 is obtained. Then, upper layers such as interlayer insulating films, wiring layers, and others are further formed to achieve a multilayered wiring structure. However, the illustration and the description thereof are omitted here.

In this manner, a semiconductor device provided with a CMISFET having the n channel MISFET 40f and the p channel MISFET 41f is manufactured. More specifically, the semiconductor device provided with the CMISFET in which the impurity concentration of the channel regions 4 and 6 is adjusted to be equal to or lower than $1.2\times10^{18}/cm^3$ and the metal elements 12a (for example, Hf) having a surface density of $1\times10^{13}$ to $5\times10^{14}$ atoms/cm² are introduced near the interface between the gate insulating films 14f and 15f and the gate electrodes 23f and 24f (Si gate electrodes) can be obtained.

Similar to the first embodiment, also in the semiconductor device according to the present embodiment, in the n channel MISFET 40f forming the CMISFET, the gate electrode 23f includes the silicon film 21 positioned on the gate insulating film 14f, the gate insulating film 14f is composed of the silicon oxynitride film 13f, and the metal elements 12a (for example, Hf) are introduced near the interface between the gate electrode 23f and the gate insulating film 14f. Also, in the p channel MISFET 41f forming the CMISFET, the gate electrode 24f includes the silicon film 21 positioned on the gate insulating film 15f, the gate insulating film 15f is composed of the silicon oxynitride film 13f, and the metal elements 12a (for example, Hf) are introduced near the interface between the gate electrode 24f and the gate insulating film 15f.

The inventors of the present invention have confirmed that, also in the MISFETs 40f and 41f formed through the process in the present embodiment, shifts of flat band voltage similar to those in the MISFETs 40 and 41 formed through the process in the first embodiment are observed and the amount of shift can be controlled by adjusting the amount of ion implantation of the metal elements 12a (Hf in this case). Therefore, also in the present embodiment, effects approximately similar to those in the first embodiment can be achieved. That is, by introducing the metal elements 12a (for example, Hf) with a surface density of $1 \times 10^{13}$ to $5 \times 10^{14}$ atoms/cm$^2$ near the interface between the gate insulating films 14f and 15f and the gate electrodes 23f and 24f and suppressing the impurity concentration of the channel regions 4 and 6 to be equal to or lower than $1.2 \times 10^{18}$/cm$^3$, the performance of the CMISFET can be improved.

Note that, in the ion implantation process of Hf (that is, the metal elements 12a) in step S11, the Hf ion implantation conditions are selected so that Hf density distribution has a maximum value near the interface between the silicon film 21 and the gate insulating films 14f and 15f. However, studies by the inventors have confirmed that similar effects can be achieved even by the ion implantation of Hf (the metal elements 12a) under the conditions where the maximum value of the Hf ion density distribution is positioned about 10 nm away from the interface toward the inside of the silicon film 21 (that is, inside of the Si gate electrode). This is because Hf (the metal elements 12a) are diffused at the time of activation annealing of impurities and Hf (metal elements 12a) is segregated at the interface between the Si gate electrodes (gate electrodes 23f and 24f) and the gate insulating films 14f and 15f.

Also, in the present embodiment, the case where Hf is used as the metal elements 12a (metal ions) ion-implanted (introduced) near the interface between the gate insulating films 14f and 15f and the silicon films 21 (gate electrodes 23f and 24f) has been described. However, similar to the first embodiment, in place of Hf, metal elements such as Zr, Pt, Mo, and W for forming both of a donor level and an acceptor level in a band gap of crystal silicon (Si) can be used.

Furthermore, similar to the first embodiment, also in the present embodiment, if both of a donor level and an acceptor level can be formed in the band gap of the crystal silicon (Si) by combining two types or more of metal elements, such two types or more of metal elements can be ion-implanted near the interface between the gate insulating films 14f and 15f and the silicon films 21 (gate electrodes 23f and 24f). That is, the metal elements 12a include both of first metal elements capable of forming a donor level in the band gap of the crystal silicon (Si) and second metal elements capable of forming an acceptor level in the band gap of the crystal silicon (Si), and these first and second metal elements can be ion-implanted near the interface between the gate insulating films 14f and 15f and the silicon films 21 (gate electrodes 23f and 24f). Also in this case, effects approximately similar to those in the case of ion implantation of Hf can be achieved. For example, if the combination of Ti (titanium) and Al (aluminum), a combination of Ta (tantalum) and Al (aluminum), or a combination of Ti (titanium) and Ni (nickel) is used as the metal elements 12a, a flat band voltage shift approximately similar to that of Hf as described above can be obtained.

As described above, in the present embodiment, by using not only Hf but also other metal elements as described above as the metal elements 12a introduced near the interface between the gate insulating film and the gate electrode in a manner similar to that described above, effects similar to those described above can be achieved.

Still further, in the present embodiment, after forming the silicon film 21 on the gate insulating films 14f and 15f in step S4 and before patterning the silicon film 21 in step S5, the process of ion implantation of the metal elements 12a is performed in step S11. Therefore, introduction of unwanted ions of the metal elements 12a to the semiconductor substrate 1 can be prevented. In another embodiment, the order of step S4 and step S11 can be changed. For example, after patterning the silicon film 21 to form the gate electrodes 23f and 24f, ion implantation of the metal element 12a (for example, Hf) can be performed at the time of implanting impurity ions into the gate electrode 23f or the gate electrode 24f. In this case, the metal elements 12a are introduced not only to the gate electrodes 23f and 24f but also to high-concentration diffusion layers (the n$^+$ type semiconductor regions 31 and the p$^+$ type semiconductor regions 32) and the sidewalls 30 of the semiconductor substrate 1.

Still further, in the present embodiment, when the metal elements 12a are ion-implanted near the interface between the silicon films 21 and the gate insulating films 14f and 15f in step S11, the same amount of ion implantation (surface density) of the metal elements 12a is provided to the n channel MISFET formation region 1A and the p channel MISFET formation region 1B. Therefore, ions of the metal elements 12a are introduced near the interface between the gate electrode 23f and the gate insulating film 14f in the n channel MISFET 40f and near the interface between the gate electrode 24f and the gate insulating film 15f in the p channel MISFET 41f with the same surface density.

In another embodiment, when the metal elements 12a are ion-implanted near the interface between the silicon films 21 and the gate insulating films 14f and 15f in step S11, a process of forming a mask layer (ion implantation blocking mask layer, for example, a photoresist layer) on the silicon film 21 and a process of ion implantation of the metal elements 12a are repeated plural times (for example, twice), thereby ion-implanting the metal elements 12a into the n channel MISFET formation region 1A and the p channel MISFET formation region 1B with respectively different ion implantation amounts (surface densities). By doing so, the metal elements 12a can be introduced near the interface between the gate electrode 23f and the gate insulating film 14f in the n channel MISFET 40f and near the interface between the gate electrode 24f and the gate insulating film 15f in the p channel MISFET 41f with different surface densities. In this case, if the amount of introduction of the metal elements 12a (for example, Hf) near the interface between the gate electrode 23f and the gate insulating film 14f in the n channel MISFET 40f is larger than the amount of introduction of the metal elements 12a (for example, Hf) near the interface between the gate electrode 24f and the gate insulating film 15f in the p channel MISFET 41f, the impurity concentration of the channel region 4 of the n channel MISFET 40f can be further reduced (smaller) compared with the impurity concentration of the channel region 6 of the p channel MISFET 41f. Consequently, the ON current of the n channel MISFET 40f can be further increased.

In still another embodiment, when metal (metal ions) is ion-implanted near the interface between the silicon films 21 and the gate insulating films 14f and 15f in step S11, a process of forming a mask layer (ion implantation blocking mask layer, for example, a photoresist layer) on the silicon film 21 and a process of implanting Hf ions are repeated plural times (for example, twice), thereby ion-implanting different metal elements 12a into the n channel MISFET formation region 1A and the p channel MISFET formation region 1B, respectively. By doing so, the metal elements 12a introduced near the interface between the gate electrode 23f and the gate insulating film 14f in the n channel MISFET 40f can be different from the metal elements 12a introduced near the interface between the gate electrode 24f and the gate insulating film 15f in the p channel MISFET 41f. In this case, the metal elements 12a introduced near the interface between the gate electrode 23f and the gate insulating film 14f in the n channel MISFET 40f are metals capable of forming an acceptor level in a band gap of crystal silicon (Si), and for example, Hf, Zr, Pt, Mo, W, Ni, or Al can be used. On the other hand, the metal elements 12a introduced near the interface between the gate electrode 24f and the gate insulating film 15f in the p channel MISFET 41f are metals capable of forming a donor level in the band gap of the crystal silicon (Si), and for example, Hf, Zr, Pt, Mo, W, Ti, or Ta can be used. Also in such a case, by introducing the metal elements through ion implantation near the interface between the Si gate electrode and the gate insulating film with a surface density of $1 \times 10^{13}$ to $5 \times 10^{14}$ atoms/cm$^2$, and more preferably, by suppressing the impurity concentration of the channel regions to be equal to or lower than $1.2 \times 10^{18}$/cm$^3$, effects similar to those in the case of Hf can be achieved.

(Fifth Embodiment)

In the present embodiment, the case where the method of introducing metal (for example, Hf) through ion implantation described in the fourth embodiment is applied to a CMISFET with multi-level gate insulating films having a plurality (two or more types) of film thicknesses on the same semiconductor substrate 1 will be described.

FIG. 36 to FIG. 39 are cross-sectional views of main parts during a manufacturing process of a semiconductor device according to the present embodiment.

In the present embodiment, the case where CMISFETs 81, 82, and 83 in which EOTs of the gate insulating films after completion are 1.8 nm, 3.5 nm, and 7.0 nm, respectively and power supply voltages are 1.2 V, 1.8 V, and 3.3 V, respectively are provided, and a minute amount of Hf are introduced only to the interface between the gate insulating film and the Si gate electrode of the CMISFET 81 having the smallest gate insulating film thickness of EOT=1.8 nm will be described as an example.

Figure 36:
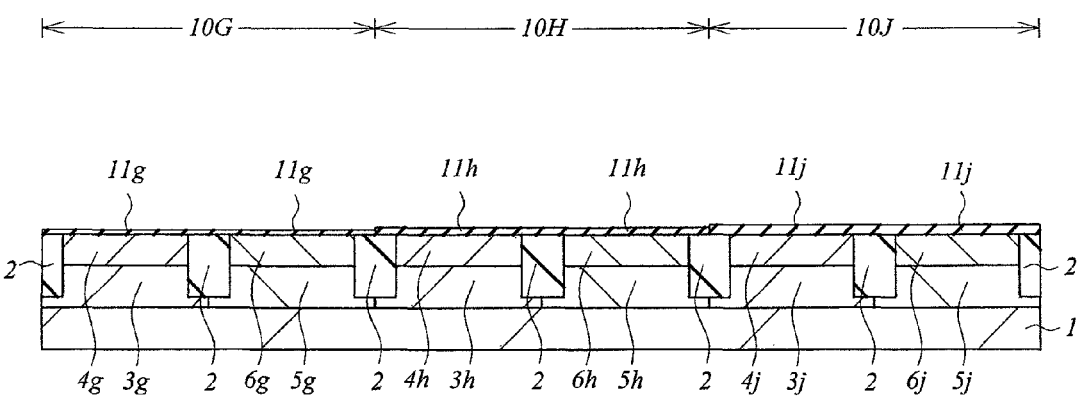
FIG. 36 is a cross-sectional view of main parts during a manufacturing process of a semiconductor device according to still another embodiment of the present invention.

As shown in FIG. 36, the semiconductor substrate (semiconductor wafer or single-crystal silicon substrate) 1 on which the semiconductor device according to the present invention is formed includes a region 10G where the above-mentioned CMISFET 81 is formed, a region 10H where the above-mentioned CMISFET 82 is formed, and a region 10J where the above-mentioned CMISFET 83 is formed. That is, in the region 10G, the CMISFET 81 having a gate insulating film of EOT=1.8 nm is formed. Also, in the region 10H, the CMISFET 82 having a gate insulating film of EOT=3.5 nm is formed. Further, in the region 10J, the CMISFET 83 having a gate insulating film of EOT=7.0 nm is formed.

Then, similar to the first embodiment, element isolation regions 2 for defining active regions are formed on the main surface of the semiconductor substrate 1.

Next, by repeating photolithography and ion implantation, three types of p type wells 3g, 3h, and 3j and three types of n type wells 5g, 5h, and 5j are formed on the semiconductor substrate 1. Note that the p type well 3g and the n type well 5g are formed in the region 10G, the p type well 3h and the n type well 5h are formed in the region 10H, and the p type well 3j and the n type well 5j are formed in the region 10J.

Next, through ion implantation of p type impurities (for example, boron (B)) for adjusting the threshold voltages of the n channel MISFETs to each of the p type wells 3g, 3h, and 3j, three types of channel regions (p type semiconductor regions) 4g, 4h, and 4j whose impurity concentration is adjusted are formed in (the surface portions of) the p type wells 3g, 3h, and 3j, respectively. Also, for example, through ion implantation of n type impurities (for example, phosphorus (P)) for adjusting the threshold voltages of the p channel MISFETs to each of the n type wells 5g, 5h, and 5j, three types of channel regions (n type semiconductor regions) 6g, 6h, and 6j whose impurity concentration is adjusted are formed in (the surface portions of) the n type wells 5g, 5h, and 5j, respectively. In the present embodiment, as described further below, the amount of introduction of impurity ions is adjusted so that the impurity concentration of the channel regions 4g and 6g in the region 10G where the CMISFET 81 is formed through Hf introduction is equal to or lower than $1.2 \times 10^{18}$/cm$^3$ after completion of the semiconductor device.

Next, after removing a native oxide film on the surface of the semiconductor substrate 1 through cleaning using dilute hydrofluoric acid, a silicon oxide film 11j is formed on the main surface of the semiconductor substrate 1 by oxidizing (thermally oxidizing) the main surface of the semiconductor substrate 1. The silicon oxide film 11j has a film thickness of, for example, about 4.0 nm.

Next, a photoresist film (not shown) is formed only on the region 10J through photolithography, and the silicon oxide film 11j is etched with using this photoresist film as an etching mask. By doing so, the silicon oxide film 11j on the p type well 3g and the n type well 5g in the region 10G and the p type well 3h and the n type well 5h in the region 10H is removed, and the silicon oxide film 11j on the p type well 3j and the n type well 5j in the region 10J is left.

Next, after removing a native oxide film on the surface of the semiconductor substrate 1 through cleaning using dilute hydrofluoric acid, a silicon oxide film is formed by oxidizing (thermally oxidizing) the main surface of the semiconductor substrate 1. The oxidization is performed under the conditions capable of forming a silicon oxide film with a thickness of about 2.5 nm on the semiconductor substrate 1. Consequently, a silicon oxide film 11h having a thickness of about 2.5 nm is formed on the p type well 3g and the n type well 5g in the region 10G and the p type well 3h and the n type well 5h in the region 10H. Also, the thickness of the silicon oxide film 11j on the p type well 3j and the n type well 5j in the region 10J is increased to, for example, about 6.5 nm.

Next, a photoresist film (not shown) is formed only on the regions 10H and 10J through photolithography, and the silicon oxide film 11h is etched with using this photoresist film as an etching mask. By doing so, the silicon oxide film 11h on the p type well 3g and the n type well 5g in the region 10G is removed, and the silicon oxide film 11h on the p type well 3h and the n type well 5h in the region 10H and the silicon oxide film 11j on the p type well 3j and the n type well 5j in the region 10J are left.

Next, after removing a native oxide film on the surface of the semiconductor substrate 1 through cleaning using dilute hydrofluoric acid, a silicon oxide film is formed by oxidizing (thermally oxidizing) the main surface of the semiconductor substrate 1. The oxidization is performed under the conditions capable of forming a silicon oxide film with a thickness of about 1.8 nm on the semiconductor substrate 1. Consequently, a silicon oxide film 11g having a thickness of about 1.8 nm is formed on the p type well 3g and the n type well 5g in the region 10G. Also, the thickness of the silicon oxide film 11h on the p type well 3h and the n type well 5h in the region 10H is increased to, for example, about 3.3 nm. Furthermore, the thickness of the silicon oxide film 11j on the p type well 3j and the n type well 5j in the region 10J is increased to, for example, about 7.0 nm. In this manner, the structure of FIG. 36 is obtained.

Figure 37:
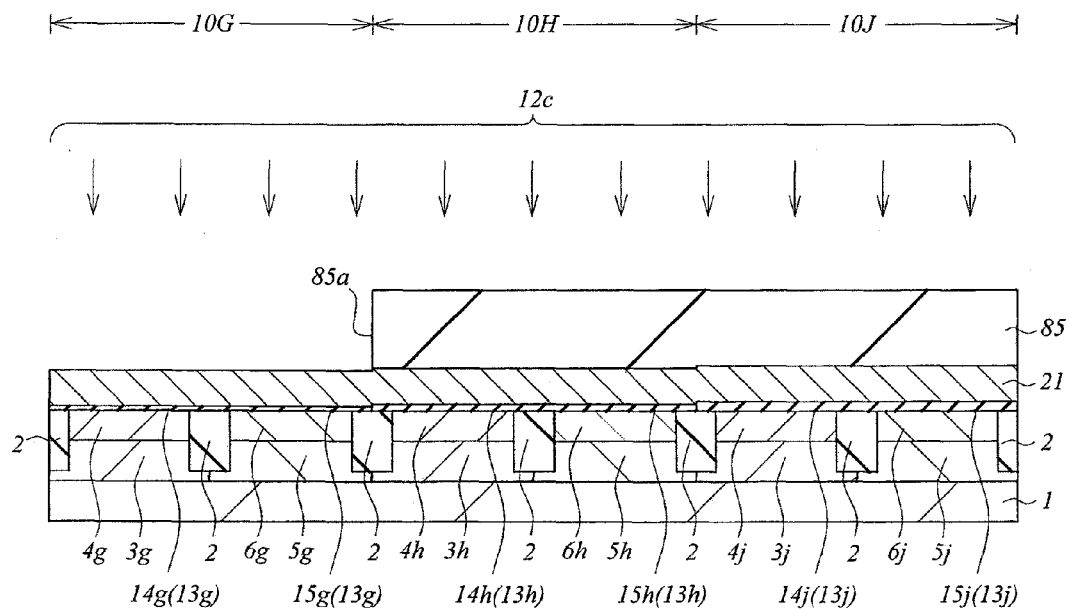
FIG. 37 is a cross-sectional view of the main parts, continued from FIG. 36, during the manufacturing process of a semiconductor device.

Next, through a plasma nitriding process, a heat treatment in an ammonia atmosphere, or the like, nitrogen is introduced into the silicon oxide films 11g, 11h, and 11j. By doing so, as shown in FIG. 37, nitrogen is introduced to the silicon oxide film 11g and it becomes a silicon oxynitride film 13g, nitrogen is introduced to the silicon oxide film 11h and it becomes a silicon oxynitride film 13h, and nitrogen is introduced to the silicon oxide film 11j and it becomes a silicon oxynitride film 13j. After the introduction of nitrogen into the silicon oxide films 11g, 11h, and 11j, the nitrogen concentration of the silicon oxynitride films 13g, 13h, and 13j can be changed (excessive nitrogen can be vaporized) by performing a heat treatment at a relatively high temperature in oxygen dilution according to need.

In this manner, gate insulating films 14g and 15g composed of the silicon oxynitride film 13g are formed on the p type well 3g and the n type well 5g in the region 10G, gate insulating films 14h and 15h composed of the silicon oxynitride film 13h are formed on the p type well 3h and the n type well 5h in the region 10H, and gate insulating films 14j and 15j composed of the silicon oxynitride film 13j are formed on the p type well 3j and the n type well 5j in the region 10J.

Next, similar to the fourth embodiment, a silicon film 21 is formed as a conductive film for forming gate electrodes on the main surface of the semiconductor substrate 1, that is, on the gate insulating films 14g, 14h, 14j, 15g, 15h, and 15j. The silicon film 21 is, for example, a polycrystalline silicon film, can be formed through CVD, and has a thickness of, for example, about 100 nm.

Next, a photoresist layer 85 having an opening 85a in the region 10G is formed on the silicon film 21 through photolithography. Then, ion implantation 12c of the metal elements 12a, for example, hafnium (Hf) is performed on the main surface of the semiconductor substrate 1 with using this photoresist layer 85 as an ion implantation blocking mask. For example, hafnium (Hf) ions are ion-implanted in a direction perpendicular to the main surface of the semiconductor substrate 1 under the conditions of the ion implantation energy (acceleration energy) of 50 to 100 keV and the amount of ion implantation of $3\times10^{14}/cm^2$. At this time, the ion implantation energy is controlled so that distribution of the implanted hafnium (Hf) ions has its peak (maximum concentration) near the interface between the silicon film 21 and the gate insulating films 14g and 15g in the region 10G. By doing so, a state where a minute amount of Hf as the metal elements 12a are restrictively (locally) introduced near the interface between the silicon film 21 and the gate insulating films 14g and 15g in the region 10G can be formed. Note that, in the ion implantation process of the metal elements 12a (Hf in this case), Hf ions are implanted through the opening 85a of the photoresist layer 85 in the region 10G, but the metal elements 12a are not implanted into the regions 10H and 10J because Hf ions are blocked by the photoresist layer 85. Then, the photoresist layer 85 is removed.

Figure 38:
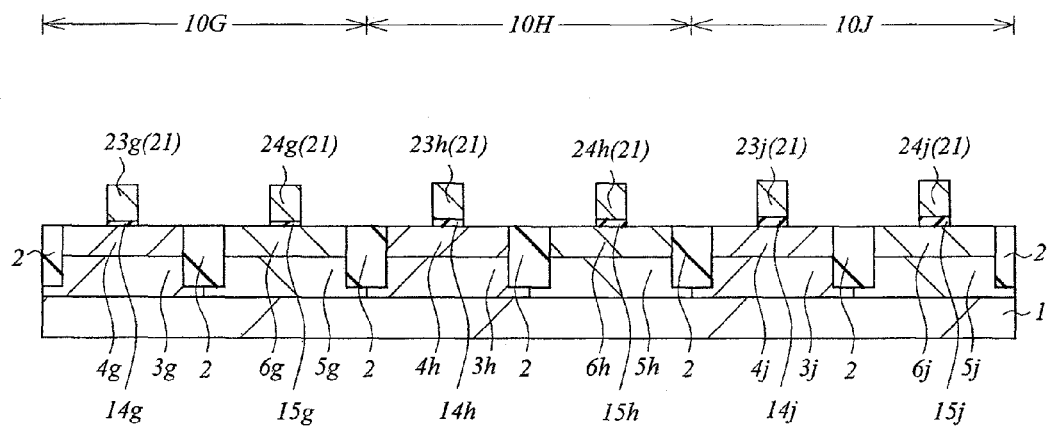
FIG. 38 is a cross-sectional view of the main parts, continued from FIG. 37, during the manufacturing process of a semiconductor device.

Next, as shown in FIG. 38, the silicon film 21 is patterned through photolithography, dry etching or others (for example, Reactive Ion Etching). Gate electrodes 23g, 23h, 23j, 24g, 24h, and 24j are formed from the patterned silicon film 21. That is, in the region 10G, the gate electrode 23g for the n channel MISFET is formed from the silicon film 21 on the gate insulating film 14g on the surface of the p type well 3g, and the gate electrode 24g for the p channel MISFET is formed from the silicon film 21 on the gate insulating film 15g on the surface of the n type well 5g. In the region 10H, the gate electrode 23h for the n channel MISFET is formed from the silicon film 21 on the gate insulating film 14h on the surface of the p type well 3h, and the gate electrode 24h for the p channel MISFET is formed from the silicon film 21 on the gate insulating film 15h on the surface of the n type well 5h. In the region 10J, the gate electrode 23j for the n channel MISFET is formed from the silicon film 21 on the gate insulating film 14j on the surface of the p type well 3j, and the gate electrode 24j for the p channel MISFET is formed from the silicon film 21 on the gate insulating film 15j on the surface of the n type well 5j.

As described above, in the region 10G, the metal elements 12a (for example, Hf) are introduced near the interface between the silicon film 21 and the gate insulating films 14g and 15g through the ion implantation 12c. Therefore, the metal elements 12a are introduced near the interface between the gate electrode 23g (silicon film 21) and the gate insulating film 14g and near the interface between the gate electrode 24g (silicon film 21) and the gate insulating film 15g.

The process thereafter is approximately similar to that in any of the first to fourth embodiments.

Figure 39:
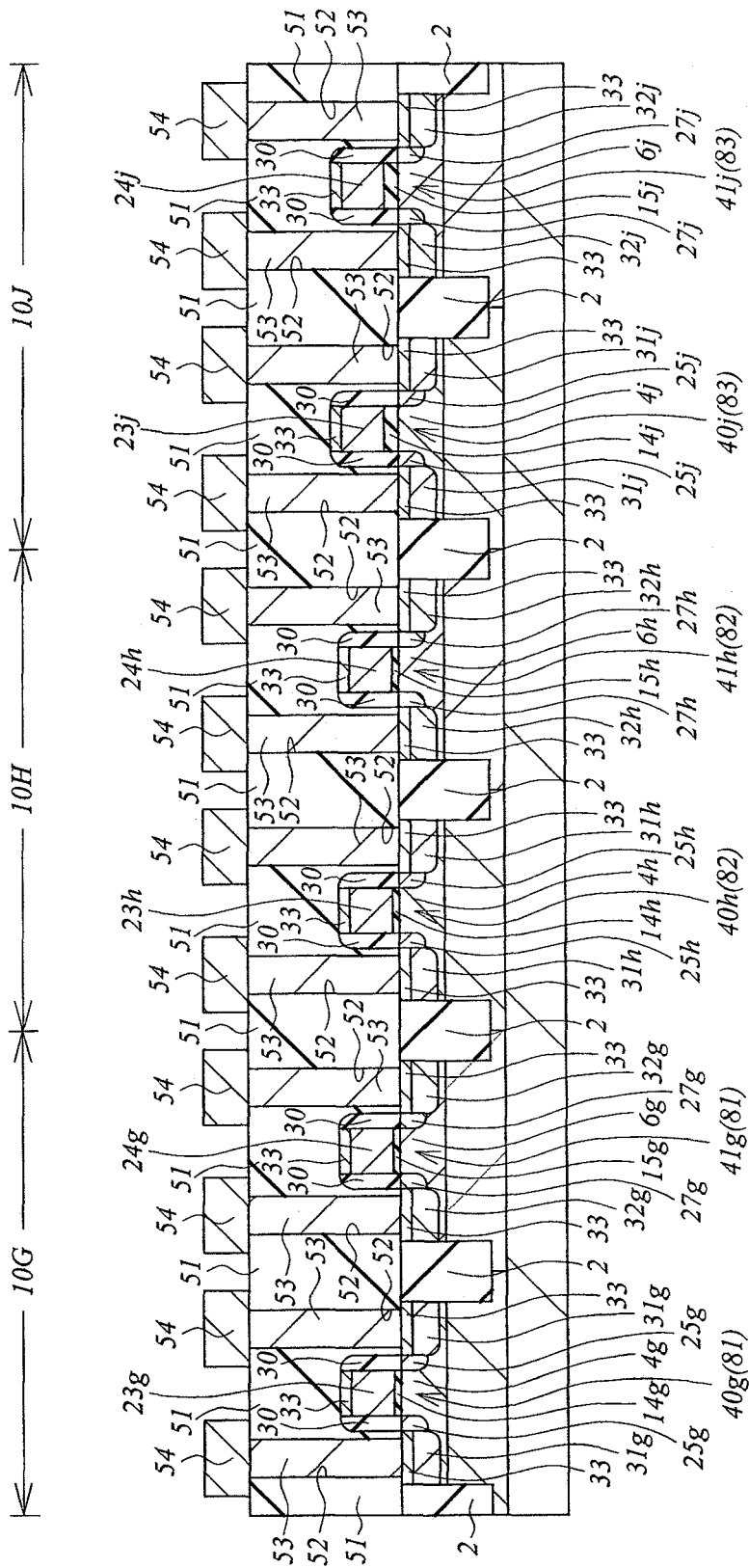
FIG. 39 is a cross-sectional view of the main parts, continued from FIG. 38, during the manufacturing process of a semiconductor device.

That is, as shown in FIG. 39, similar to the first embodiment, through ion implantation of n type impurities into the regions on both sides of the gate electrodes 23g, 23h, and 23j on the p type wells 3g, 3h, and 3j, relatively shallow n⁻ type semiconductor regions (n type impurity diffusion layers) 25g, 25h, and 25j are formed. Then, through ion implantation of p type impurities, p type semiconductor regions (not shown) for preventing punch-through are formed. Similarly, through ion implantation of p type impurities into the regions on both sides of the gate electrodes 24g, 24h, and 24j on the p type wells 5g, 5h, and 5j, relatively shallow p⁻ type semiconductor regions (p type impurity diffusion layers) 27g, 27h, and 27j are formed. Then, through ion implantation of n type impurities, n type semiconductor regions (not shown) for preventing punch-through are formed.

Next, similar to the first embodiment, sidewalls 30 are formed on the sidewalls of the gate electrodes 23g, 23h, 23j, 24g, 24h, and 24j.

Next, similar to the first embodiment, through the ion implantation of n type impurities into the p type wells 3g, 3h, and 3j in the regions 10G, 10H, and 10J with using the sidewalls 30 as ion implantation blocking masks, n⁺ type semiconductor regions 31g, 31h, and 31j (source and drain) are formed in the regions on both sides of each of the gate electrodes 23g, 23h, and 23j and the sidewalls 30 on the p type wells 3g, 3h, and 3j. At the time of this ion implantation, n type impurities are also ion-implanted into the gate electrodes 23g, 23h, and 23j, and as a result, the gate electrodes 23g, 23h, and 23j become low-resistance n-conductive semiconductor films (silicon films) introduced with n type impurities. Similarly, through ion implantation of p type impurities into the n type wells 5g, 5h, and 5j in the regions 10G, 10H, and 10J with using the sidewalls 30 as ion implantation blocking masks, p⁺ type semiconductor regions 32g, 32h, and 32j (source and drain) are formed in the regions on both sides of each of the gate electrodes 24g, 24h, and 24j and the sidewalls 30 on the n type wells 5g, 5h, and 5j. At the time of this ion implantation, p type impurities are also ion-implanted into the gate electrodes 24g, 24h, and 24j, and as a result, the gate electrodes 24g, 24h, and 24j become low-resistance p-conductive semiconductor films (silicon films) introduced with p type impurities.

After the ion implantation, similar to the first embodiment, an annealing process for activating the introduced impurities is performed.

The n$^+$ type semiconductor regions 31g, 31h, and 31j have an impurity concentration higher than that of the n$^-$ type semiconductor regions 25g, 25h, and 25j, and the p$^+$ type semiconductor regions 32g, 32h, and 32j have an impurity concentration higher than that of the p$^-$ type semiconductor regions 27g, 27h, and 27j.

In this manner, in the region 10G, n type semiconductor regions (impurity diffusion layers) serving as the source and drain of the n channel MISFET are formed from the n$^+$ type semiconductor regions 31g and the n$^-$ type semiconductor regions 25g, and p type semiconductor regions (impurity diffusion layers) serving as the source and drain of the p channel MISFET are formed from the p$^+$ type semiconductor regions 32g and the p$^-$ type semiconductor regions 27g. Also, in the region 10H, n type semiconductor regions (impurity diffusion layers) serving as the source and drain of the n channel MISFET are formed from the n$^+$ type semiconductor regions 31h and the n$^-$ type semiconductor regions 25h, and p type semiconductor regions (impurity diffusion layers) serving as the source and drain of the p channel MISFET are formed from the p$^+$ type semiconductor regions 32h and the p$^-$ type semiconductor regions 27h. Furthermore, in the region 10J, n type semiconductor regions (impurity diffusion layers) serving as the source and drain of the n channel MISFET are formed from the n$^+$ type semiconductor regions 31j and the n$^-$ type semiconductor regions 25j, and p type semiconductor regions (impurity diffusion layers) serving as the source and drain of the p channel MISFET are formed from the p$^+$ type semiconductor regions 32j and the p$^-$ type semiconductor regions 27j.

Next, similar to the first embodiment, metal silicide layers 33 are formed on each surface of the gate electrodes 23g, 23h, 23j, 24g, 24h, and 24j, the n$^+$ type semiconductor regions 31g, 31h, and 31j, and the p$^+$ semiconductor regions 32g, 32h, and 32j.

In this manner, in the region 10G, an n channel MISFET 40g is formed on the p type well 3g and a p channel MISFET 41g is formed on the n type well 5g, thereby forming the CMISFET 81. Also, in the region 10H, an n channel MISFET 40h is formed on the p type well 3h and a p channel MISFET 41h is formed on the n type well 5h, thereby forming the CMISFET 82. Furthermore, in the region 10J, an n channel MISFET 40j is formed on the p type well 3j and a p channel MISFET 41j is formed on the n type well 5j, thereby forming the CMISFET 83.

Next, similar to the first embodiment, an insulating film 51 is formed on the semiconductor substrate 1 so as to cover the gate electrodes 23g, 23h, 23j, 24g, 24h, and 24j, contact holes 52 are formed in the insulating film 51, plugs 53 are formed in the contact holes 52, and wirings 54 are formed on the insulating film 51 in which the plugs 53 are embedded. The wirings 54 are electrically connected via the plugs 53 to the n$^+$ type semiconductor regions 31g, 31h, and 31j, the p$^+$ type semiconductor regions 32g, 32h, and 32j, and the gate electrodes 23g, 23h, 23j, 24g, 24h, and 24j. In this manner, the structure of FIG. 39 is obtained. Then, upper layers such as interlayer insulating films, wiring layers, and others are further formed to achieve a multilayered wiring structure. However, the illustration and the description thereof are omitted here.

In this manner, a three-level CMISFET (having three types of gate insulating film thickness) can be formed, in which a minute amount of Hf are introduced near the interface between the gate insulating films (gate insulating films 14g and 15g) and the Si gate electrodes (gate electrodes 23g and 24g) only in the CMISFET 81 having the smallest gate insulating film thickness (EOT=1.8 nm).

Also, in the present embodiment, the case where Hf is used as the metal elements 12a ion-implanted near the interface between the gate insulating films and the silicon films (Si gate electrodes) has been described. However, similar to the fourth embodiment, in place of Hf, metal elements such as Zr, Pt, Mo, and W for forming both of a donor level and an acceptor level in a band gap of crystal silicon (Si) can be used.

As described above, in the present embodiment, by using not only Hf but also other metal elements as described above as the metal elements 12a introduced near the interface between the gate insulating films and the gate electrodes in a manner similar to that described above, effects similar to those described above can be achieved.

Furthermore, in the present embodiment, ion implantation of the metal elements 12a (for example, Hf) is performed after forming the silicon film 21 on the gate insulating film and before patterning the silicon film 21. Therefore, introduction of unwanted metal elements 12a to the semiconductor substrate 1 can be prevented. In another embodiment, after patterning the silicon film 21 to form the gate electrodes, ion implantation of the metal elements 12a (for example, Hf) can be performed at the time of implanting impurity ions into the gate electrodes in a specific region. In this case, the metal elements 12a are introduced not only to the gate electrode but also to high-concentration diffusion layers and the sidewalls 30 of the semiconductor substrate 1.

Still further, in the present embodiment, the metal elements 12a are introduced near the interface between the gate electrode and the gate insulating film in the n channel MISFET and near the interface between the gate electrode and the gate insulating film in the p channel MISFET with the same surface density. However, in another embodiment, the metal elements 12a can be ion-implanted (introduced) to the n channel MISFET formation region and the p channel MISFET formation region with different amounts of ion implantation (surface densities). In this case, if the amount of introduction of the metal elements 12a in the n channel MISFET is larger than the amount of introduction of the metal elements 12a in the p channel MISFET, the impurity concentration of the channel region of the n channel MISFET can be further reduced (smaller) compared with the impurity concentration of the channel region of the p channel MISFET. Consequently, the ON current of the n channel MISFET can be further increased.

Also, similar to the fourth embodiment, the metal elements 12a ion-implanted into the n channel MISFET formation region can be different from the metal elements 12a ion-implanted into the p channel MISFET formation region. Therefore, the metal elements 12a introduced near the interface between the gate electrode and the gate insulating film in the n channel MISFET can be different from the metal elements 12a introduced near the interface between the gate electrode and the gate insulating film in the p channel MISFET. In this case, in the n channel MISFET formation region, a metal element capable of forming an acceptor level in a band gap of crystal silicon (Si) such as Hf, Zr, Pt, Mo, W, Ni, or Al is ion-implanted as the metal elements 12. On the other hand, in the p channel MISFET, a metal element capable of forming a donor level in the band gap of the crystal silicon (Si) such as Hf, Zr, Pt, Mo, W, Ti, or Ta is ion-implanted as the metal elements 12a. Also in such a case, by introducing the metal elements through ion implantation near the interface between the Si gate electrode and the gate insulating film with a surface density of $1\times10^{13}$ to $5\times10^{14}$ atoms/cm$^2$, and more preferably, by suppressing the impurity concentration of the channel regions to be equal to or lower than $1.2\times10^{18}$/cm$^3$, effects similar to those in the case of Hf can be achieved.

Furthermore, in the semiconductor device according to the present embodiment, the CMISFETs 81, 82, and 83 are formed on the same semiconductor substrate 1, and the ion implantation 12c is performed with using the photoresist layer 85 having the opening 85a in the region 10G as an ion implantation blocking mask. Therefore, the metal elements 12a are ion-implanted only into the region 10G in which the CMISFET 81 is formed, and no metal element 12a is ion-implanted into the regions 10H and 10J in which the CMISFETs 82 and 83 are formed. Consequently, the metal elements 12a are introduced only near the interface between the gate electrodes 23g and 24g and the gate insulating films 14g and 15g in the CMISFET 81. Therefore, the threshold voltage of the CMISFET 81 can be controlled at a desired value.

In another embodiment, the metal elements 12a can be introduced near the interface between the gate electrodes and the gate insulating films in either one or both of the CMISFETs 82 and 83 with a surface density lower than that of the metal elements 12a introduced near the interface between the gate electrodes 23g and 24g and the gate insulating films 14g and 15g in the CMISFET 81. For its achievement, before or after the ion implantation 12c using the photoresist layer 85 having the opening 85a in the region 10G as an ion implantation blocking mask, ion implantation of the metal elements 12a is performed with an amount of ion implantation smaller than that of the ion implantation 12c, with using another photoresist layer having the opening 85a in either one or both of the region 10H and the region 10J as an ion implantation blocking mask.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is suitable when applied to a semiconductor device including a phase-change memory.

What is claimed is:

1. A manufacturing method of a semiconductor device having a first MISFET of an n channel type and a second MISFET of a p channel type, comprising the steps of:
    (a) preparing a semiconductor substrate;
    (b) forming a first insulating film on said semiconductor substrate for forming a gate insulating film of each of said first and second MISFETs;
    (c) depositing metal elements on said first insulating film;
    (d) after said step (c), forming a silicon film on said first insulating film for forming a gate electrode of each of said first and second MISFETs; and
    (e) forming the gate electrode of each of said first and second MISFETs by patterning said silicon film,
    wherein, in said step (c), said metal elements are deposited on said first insulating film so that a surface density of said metal elements is within a range of $1\times10^{13}$ to $5\times10^{14}$ atoms/cm$^2$, and
    wherein said first insulating film is composed of a silicon oxide film, and
    said method further comprises, after said step (c) and before said step (d), a step (c1) of introducing nitrogen to said first insulating film to change said first insulating film into a silicon oxynitride film.

2. The manufacturing method of a semiconductor device according to claim 1,
    wherein an impurity concentration of a channel region of each of said first and second MISFETs is equal to or lower than $1.2\times10^{18}$/cm$^3$.

3. The manufacturing method of a semiconductor device according to claim 1,
    wherein, in said step (c), a compound of said metal elements, silicon, and oxygen is deposited on said first insulating film through CVD.

4. The manufacturing method of a semiconductor device according to claim 1,
    wherein said metal elements are capable of forming both of a donor level and an acceptor level in a band gap of crystal silicon.

5. The manufacturing method of a semiconductor device according to claim 1,
    wherein said metal elements include first metal elements capable of forming an acceptor level in a band gap of crystal silicon and second metal elements capable of forming a donor level in the band gap of the crystal silicon.

* * * * *